US012652927B2

(12) United States Patent　　(10) Patent No.:　US 12,652,927 B2
Wu et al.　　　　　　　　　　　(45) Date of Patent:　　Jun. 9, 2026

(54) DISPLAY SUBSTRATE AND DISPLAY APPARATUS

(71) Applicants:Hefei BOE Joint Technology Co., Ltd., Hefei (CN); BOE Technology Group Co., Ltd., Beijing (CN)

(72) Inventors: Liu Wu, Beijing (CN); Yongqian Li, Beijing (CN); Can Yuan, Beijing (CN); Zhidong Yuan, Beijing (CN)

(73) Assignees: Hefei BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 527 days.

(21) Appl. No.: 18/269,960

(22) PCT Filed: Dec. 27, 2021

(86) PCT No.: PCT/CN2021/141729

§ 371 (c)(1),
(2) Date: Jun. 28, 2023

(87) PCT Pub. No.: WO2023/122895

PCT Pub. Date: Jul. 6, 2023

(65) Prior Publication Data

US 2024/0397786 A1　　Nov. 28, 2024

(51) Int. Cl.
*H10K 59/80*　　　(2023.01)
*H10K 59/131*　　(2023.01)
*H10K 59/35*　　　(2023.01)
(52) U.S. Cl.
CPC ..... *H10K 59/80517* (2023.02); *H10K 59/131* (2023.02); *H10K 59/353* (2023.02); *H10K 59/351* (2023.02)

(58) Field of Classification Search
CPC ........... H10K 59/80517; H10K 59/131; H10K 59/353; H10K 59/351; H10K 2102/10;
(Continued)

(56) References Cited

U.S. PATENT DOCUMENTS

2007/0205423 A1　9/2007　Yamazaki et al.
2017/0194390 A1　7/2017　Kim
(Continued)

OTHER PUBLICATIONS

Search Report dated Jun. 26, 2024 for European Patent Application No. 21969281.1.

*Primary Examiner* — Kevin Quarterman
(74) *Attorney, Agent, or Firm* — Ling Wu; Stephen Yang; Ling and Yang Intellectual Property

(57)　　　　　　　ABSTRACT

Disclosed are a display substrate and a display apparatus, the display substrate includes a transparent region and a pixel region, the pixel region includes a plurality of light emitting devices, the plurality of light emitting devices include a first light emitting device, an orthographic projection of a first anode layer of the first light emitting device on a plane of the display substrate is partially overlapped with an orthographic projection of the transparent region on the plane of the display substrate, and an orthographic projection of a second anode layer of the first light emitting device on the plane of the display substrate is within a range of an orthographic projection of the pixel region on the plane of the display substrate.

20 Claims, 24 Drawing Sheets

(58) Field of Classification Search
CPC ..... H10K 59/80516; H10K 2102/3031; H10K
59/352; H10K 59/80515; H10K 59/121
See application file for complete search history.

(56) References Cited

U.S. PATENT DOCUMENTS

| | | | |
|---|---|---|---|
| 2021/0066644 A1 | 3/2021 | Lee | |
| 2021/0191552 A1 | 6/2021 | Bok et al. | |
| 2021/0210713 A1* | 7/2021 | Li | H10K 59/123 |
| 2021/0335989 A1* | 10/2021 | Diao | G09G 3/3225 |
| 2021/0367023 A1* | 11/2021 | Qing | H10K 59/873 |
| 2021/0399073 A1* | 12/2021 | Li | G09G 3/3233 |

* cited by examiner

V13

V14

V14

V14

P4

P1   P2   P3   P4

201
202

200                    100

First pixel unit

701R

701G

701B

701W

P4

P1   P2   P3   P4

201
202

200                    100

First pixel unit

DISPLAY SUBSTRATE AND DISPLAY APPARATUS

CROSS-REFERENCE TO RELATED APPLICATION

The present application is a U.S. National Phase Entry of International Application No. PCT/CN2021/141729 having an international filing date of Dec. 27, 2021. The entire contents of the above-identified application are hereby incorporated by reference.

TECHNICAL FIELD

Embodiments of the present disclosure relate to, but are not limited to, the field of display technologies, and particularly to a display substrate and a display apparatus.

BACKGROUND

An Organic Light Emitting Diode (OLED) is an active light emitting display device, and has advantages of self-illumination, a wide viewing angle, a high contrast ratio, low power consumption, an extremely high response speed, etc. With continuous development of display technologies, a bendable flexible display apparatus with an OLED as a light emitting device and a Thin Film Transistor (TFT) for performing signal controlling has become a mainstream product in the current display field.

With the continuous development of display technologies, an OLED technology is more and more applied in transparent display. The transparent display is an important personalized display field of the display technologies, which refers to display of an image in a transparent state, and a viewer may not only see the image in a display apparatus, but also see a scene behind the display apparatus. At present, a transparent display apparatus usually divides each pixel unit into a pixel region and a transparent region. The pixel region is provided with a pixel drive circuit and a light emitting device to achieve image display, and the transparent region achieves light transmission.

SUMMARY

The following is a summary of subject matters described herein in detail. The summary is not intended to limit the protection scope of claims.

In a first aspect, an embodiment of the present disclosure provides a display substrate including a transparent region and a pixel region, the pixel region includes a plurality of light emitting devices, the plurality of light emitting devices include a first light emitting device, an orthographic projection of a first anode layer of the first light emitting device on a plane of the display substrate is partially overlapped with an orthographic projection of the transparent region on the plane of the display substrate, and an orthographic projection of a second anode layer of the first light emitting device on the plane of the display substrate is within a range of an orthographic projection of the pixel region on the plane of the display substrate.

In a second aspect, an embodiment of the present disclosure further provides a display apparatus, including the display substrate as described in the abovementioned embodiment.

Other characteristics and advantages of the present disclosure will be set forth in following specification, and moreover, partially become apparent from the specification or are understood by implementing the present disclosure. Other advantages of the present disclosure may be achieved and obtained through solutions described in the specification and drawings.

Other aspects may be understood upon reading and understanding the drawings and detailed description.

BRIEF DESCRIPTION OF DRAWINGS

The drawings are used for providing understanding of technical solutions of the present disclosure, constitute a part of the specification, and together with the embodiments of the present disclosure, are used for explaining the technical solutions of the present disclosure but do not constitute limitations on the technical solutions of the present disclosure. A shape and a size of each component in the drawings do not reflect an actual scale, and are only intended to schematically illustrate contents of the present disclosure.

DETAILED DESCRIPTION

Figure 1:
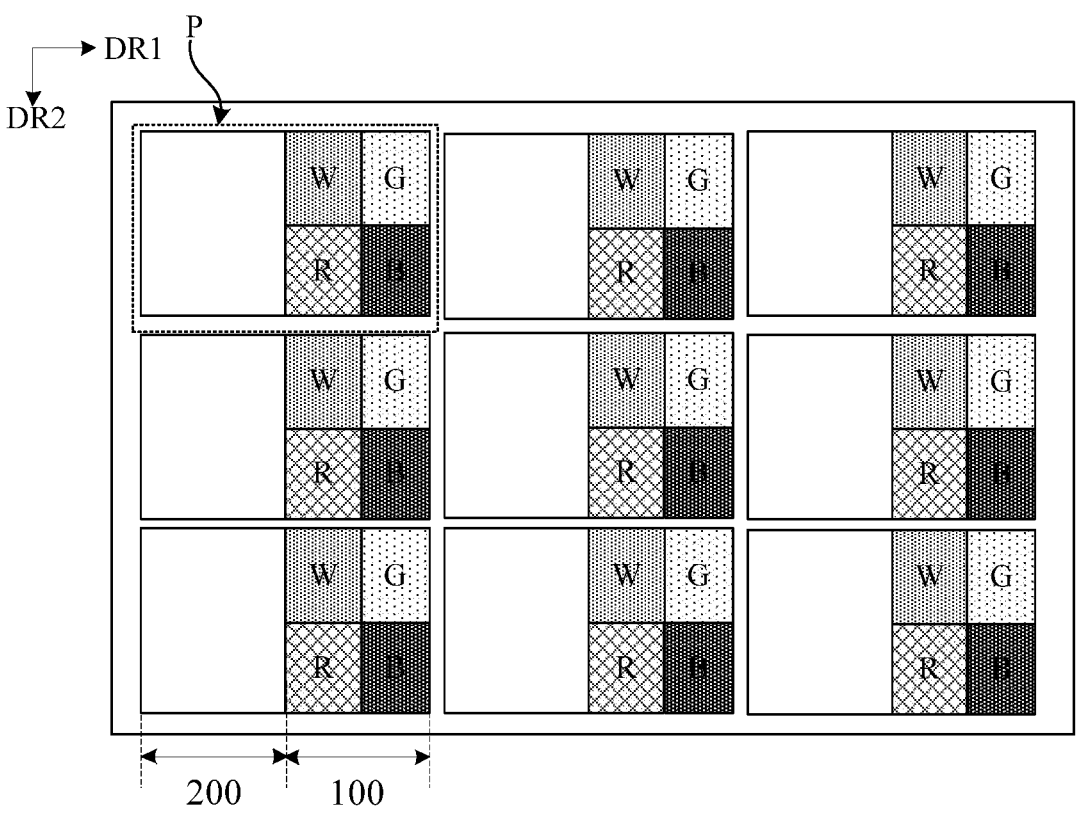
FIG. 1 is a schematic diagram of a structure of a transparent OLED display substrate.

Multiple embodiments are described herein, but the description is exemplary rather than restrictive, and there may be more embodiments and implementation solutions within a scope contained in the embodiments described herein. Although many possible feature combinations are shown in the drawings and discussed in exemplary implementation modes, many other combinations of disclosed features are also possible. Unless expressly limited, any feature or element of any embodiment may be used in combination with, or may replace, any other feature or element in any other embodiment.

When a representative embodiment is described, a method or process may have already been presented in a specific sequence of acts in the specification. However, to an extent that the method or process does not depend on the specific sequence of the acts herein, the method or process should not be limited to the acts in the specific sequence. Those of ordinary skills in the art will understand that other sequences of acts may also be possible. Therefore, the specific sequence of the acts illustrated in the specification should not be interpreted as a limitation on claims. In addition, the claims directed to the method or process should not be limited to performing their acts according to the written sequence. Those skilled in the art may easily understand that these sequences may be changed, and are still maintained in the spirit and scope of the embodiments of the present disclosure.

In the accompanying drawings, a size of a constituent element, and a thickness of a layer or a region are sometimes exaggerated for clarity. Therefore, one mode of the present disclosure is not necessarily limited to the size, and a shape and a size of a component in the accompanying drawings do not reflect a true scale. In addition, the drawings schematically illustrate ideal examples, and one mode of the present disclosure is not limited to shapes, numerical values, or the like shown in the drawings.

Ordinal numerals such as "first", "second", and "third" in the specification are set to avoid confusion of constituent elements, but not to set a limit in quantity.

In exemplary embodiments of the present disclosure, for the sake of convenience, wordings such as "central", "upper", "lower", "front", "rear", "vertical", "horizontal", "top", "bottom", "inner", "outer", and the like indicating orientations or positional relations are used for illustrating positional relationships of constituent elements with reference to the drawings, are only for convenience of describing the specification and simplifying description, rather than for indicating or implying that a referred apparatus or element must have a specific orientation, or must be constructed and operated in the particular orientation, and therefore, those wordings cannot be construed as limitations on the present disclosure. The positional relationships between the constituent elements are changed as appropriate based on directions for describing the constituent elements. Therefore, appropriate replacements may be made according to situations without being limited to the wordings described in the specification.

In the exemplary embodiments of the present disclosure, terms "installation", "mutual connection", and "connection" shall be broadly understood unless otherwise explicitly specified and defined. For example, it may be a fixed connection, or a detachable connection, or an integrated connection. It may be a mechanical connection or an electrical connection. It may be a direct mutual connection, or an indirect connection through middleware, or internal communication between two elements. Those of ordinary skills in the art may understand meanings of the above-mentioned terms in the present disclosure according to situations.

In the exemplary embodiments of the present disclosure, an "electrical connection" includes a case where constituent elements are connected together through an element with a certain electrical effect. The "element with a certain electrical effect" is not particularly limited as long as electrical signals may be sent and received between the connected constituent elements. For example, the "element with a certain electrical effect" may be an electrode or wiring, or a switching element such as a transistor, or another functional element such as a resistor, an inductor, and a capacitor.

In the exemplary embodiments of the present disclosure, a transistor refers to an element that at least includes three terminals, i.e., a gate electrode (also called a gate or a control electrode), a drain electrode (also called a drain electrode terminal, a drain region, or a drain), and a source electrode (also called A source electrode terminal, a source region, or a source). The transistor has a channel region between the drain electrode and the source electrode, and a current can flow through the drain electrode, the channel region, and the source electrode. It is to be noted that, in the specification, the channel region refers to a region through which the current mainly flows.

In the exemplary embodiments of the present disclosure, in order to distinguish two electrodes of a transistor other than a gate electrode, one of the two electrodes is directly described as a first electrode, while the other is described as a second electrode. Among them, the first electrode may be a drain electrode and the second electrode may be a source electrode, or, the first electrode may be a source electrode and the second electrode may be a drain electrode. In a case that transistors with opposite polarities are used, in a case that a direction of a current is changed during operation of a circuit, or the like, functions of the "source electrode" and the "drain electrode" are sometimes interchangeable. Therefore, the "source electrode" and the "drain electrode" are interchangeable in the specification.

Transistors in the exemplary embodiments of the present disclosure may all be Thin Film Transistors (TFTs), or Field Effect Transistors (FETs), or other devices with same characteristics. For example, a thin film transistor used in an embodiment of the present disclosure may include, but is not limited to, an oxide TFT or a Low Temperature Poly Silicon TFT (LTPS TFT). For example, a thin film transistor with a bottom gate structure or a thin film transistor with a top gate structure may be selected as a thin film transistor, as long as a switching function may be achieved. Herein, no limitation is made thereto in embodiments of the present disclosure.

In the exemplary embodiments of the present disclosure, a "film" and a "layer" may be interchanged. For example, a "conductive layer" may be replaced with a "conductive film" sometimes. Similarly, an "insulation film" may be replaced with an "insulation layer" sometimes.

A triangle, a rectangle, a trapezoid, a pentagon, or a hexagon, etc. in the exemplary embodiments of the present disclosure is not strictly defined, and it may be an approximate triangle, an approximate rectangle, an approximate trapezoid, an approximate pentagon, or an approximate hexagon, etc. There may be some small deformation caused by tolerance, and there may be a chamfer, an arc edge, and deformation, etc.

In the exemplary embodiments of the present disclosure, "about" refers to that a boundary is not defined strictly, and numeral values within process and measurement error ranges are allowed.

An "integral structure" in the exemplary embodiments of the present disclosure may refer to a structure in which two (or more) structures are formed through a same deposition process and are patterned through a same patterning process to be connected with each other, and their materials may be the same or different.

In an exemplary embodiment, a first direction DR1 may refer to a horizontal direction or an extension direction of a scan signal line, etc., a second direction DR2 may refer to a vertical direction or an extension direction of a data signal line, etc., and a third direction DR3 may refer to a thickness direction of a display substrate, or a direction perpendicular to a plane of a display substrate, etc. Herein, the first direction DR1 intersects with the second direction DR2, and the first direction DR1 intersects with the third direction DR3. For example, the first direction DR1 and the second direction DR2 may be perpendicular to each other, and the first direction DR1 and the third direction DR3 may be perpendicular to each other.

With the continuous development of display technologies, the OLED technology is more and more applied in transparent display. The transparent display is an important personalized display field in the display technologies, and refers to performing image display in a transparent state. A viewer may not only see an image in a display apparatus, but also see a scene behind the display apparatus, which may bring different visual experiences to the viewer and make the viewer feel stronger visual impact.

FIG. 1 is a schematic diagram of a structure of a transparent OLED display substrate. As shown in FIG. 1, in some technologies, a display region (AA region) of the transparent OLED display substrate may include a plurality of pixel units P arranged in an array, each pixel unit P may include one pixel region 100 and one transparent region 200, and each pixel unit P may include a plurality of sub-pixels located in the pixel region 100. Herein, a pixel region 100, which may be referred to as a pixel Aperture Ratio (AR) region, is provided with a pixel drive circuit and a light emitting device (e.g., an OLED), and is configured to achieve image display by controlling the OLED to emit light. The transparent region 200, which may be referred to as a TR region, is configured to achieve light transmission, thereby achieving image display in a transparent state, so that a viewer may see a scene behind the transparent OLED display substrate through the transparent region 200, that is, transparent display. However, this kind of pixel design will lead to low pixel aperture ratio and affect a display effect adversely. Herein, in FIG. 1, it is illustrated by taking a case that each pixel unit P includes a Red (R) sub-pixel, a Green (G) sub-pixel, a Blue (B) sub-pixel, and a White (W) sub-pixel as an example.

An embodiment of the present disclosure provides a display substrate, the display substrate may include a transparent region and a pixel region, the pixel region includes a plurality of light emitting devices, the plurality of light emitting devices include a first light emitting device, an orthographic projection of a first anode layer of the first light emitting device on a plane of the display substrate is partially overlapped with an orthographic projection of the transparent region on the plane of the display substrate, and an orthographic projection of a second anode layer of the first light emitting device on the plane of the display substrate is within a range of an orthographic projection of the pixel region on the plane of the display substrate. Thus, in the display substrate according to the exemplary embodiment of the present disclosure, the first anode layer of the first light emitting device extends to the transparent region, the pixel region may be increased on a premise of not reducing an area of the transparent region, so that a pixel aperture ratio may be improved to a certain extent, and thus, a display effect may be enhanced. Moreover, since the first anode layer is usually formed of a transparent conductive material, it is possible to improve the display effect without affecting a transparent effect adversely.

Herein, the pixel region may refer to a region where a light emitting device and a pixel drive circuit for driving the light emitting device are disposed, while the transparent region may refer to a region where a pixel drive circuit is not disposed and has a higher transmittance for light transmission of natural light, herein, the transmittance of the transparent region is greater than that of the pixel region. For example, a transmittance of a plurality of film layers in the transparent region may be greater than 80%.

In an exemplary embodiment, an orthographic projection of an Emitting Layer (EL) of the first light emitting device on the plane of the display substrate is partially overlapped with the orthographic projection of the transparent region on the plane of the display substrate, and is partially overlapped with the orthographic projection of the pixel region on the plane of the display substrate.

In an exemplary embodiment, a transmittance of the first anode layer is greater than a transmittance of the second anode layer.

In an exemplary embodiment, the first anode layer is made of a transparent conductive material. For example, the transparent conductive material may include indium tin oxide or indium zinc oxide, etc. Herein, no limitation is made thereto in embodiments of the present disclosure.

In an exemplary embodiment, the second anode layer is formed using a metal material, or formed using a metal material and a transparent conductive material. Herein, no limitation is made thereto in embodiments of the present disclosure.

In an exemplary embodiment, the plurality of light emitting devices may further include a second light emitting device, an orthographic projection of a first anode layer of the second light emitting device on the plane of the display substrate, an orthographic projection of a second anode layer of the second light emitting device on the plane of the display substrate, and an orthographic projection of an Emitting Layer (EL) of the second light emitting device on the plane of the display substrate are all within a range of the orthographic projection of the pixel region on the plane of the display substrate. For example, the first light emitting device may be a White (W) light emitting device, and the second light emitting device may include, but is not limited to, another color light emitting device such as a Red (R) light emitting device, a Green (G) light emitting device, or a Blue (B) light emitting device. In this way, it may be achieved that other color light emitting devices with a relatively low transmittance may all be disposed in the pixel region.

In an exemplary embodiment, the plurality of light emitting devices may include one first light emitting device and three second light emitting devices, the first light emitting device includes a white light emitting device, the three second light emitting devices may include a red light emitting device, a green light emitting device, and a blue light emitting device, an area of a second anode layer of the blue light emitting device is larger than an area of a second anode layer of the red light emitting device and an area of a second anode layer of the green light emitting device, an area of a second anode layer of the white light emitting device is smaller than the area of the second anode layer of the red light emitting device and the area of the second anode layer of the green light emitting device. Thus, an area occupied by the white light emitting device in the pixel region may be reduced to achieve at least increasing an area occupied by the blue light emitting device in the pixel region. Since a first anode layer in the white light emitting device extends to the transparent region, the pixel region may be enlarged on a premise of not reducing an area of the transparent region, so that a pixel aperture ratio may be improved to a certain extent, thereby a display effect may be enhanced.

In an exemplary embodiment, the transparent region includes a first transparent sub-region and a second transparent sub-region disposed sequentially along a first direction, the pixel region includes a first region and a second region disposed sequentially along a second direction, the first region includes a first sub-region and a second sub-region disposed sequentially along the first direction, and the second region includes a third sub-region and a fourth sub-region disposed sequentially along the first direction; an orthographic projection of a first anode layer of the one first light emitting device on the plane of the display substrate is at least partially overlapped with an orthographic projection of one sub-region in the first sub-region to the fourth sub-region on the plane of the display substrate, and is at least partially overlapped with an orthographic projection of one of the first transparent sub-region and the second transparent sub-region on the plane of the display substrate; orthographic projections of first anode layers of the three second light emitting devices on the plane of the display substrate are at least partially overlapped with orthographic projections of the other three sub-regions in the first sub-region to the fourth sub-region on the plane of the display substrate respectively, and are different from each other; the second direction and the first direction intersect.

In an exemplary embodiment, a length of an orthographic projection of the second anode layer of the blue light emitting device on the plane of the display substrate is greater than a length of an orthographic projection of the second anode layer of the red light emitting device on the plane of the display substrate, a length of an orthographic projection of the second anode layer of the green light emitting device on the plane of the display substrate, and a length of an orthographic projection of the second anode layer of the white light emitting device on the plane of the display substrate, and a length refers to a dimensional feature along the first direction. In this way, it may be achieved that an area occupied by the blue light emitting device in the pixel region is increased.

In an exemplary embodiment, the transparent region includes a first transparent sub-region and a second transparent sub-region disposed sequentially along a first direction, the pixel region includes a first region and a second region disposed sequentially along a second direction, the first region includes a fifth sub-region and a sixth sub-region disposed sequentially along the second direction, and the second region includes a seventh sub-region and an eighth sub-region disposed sequentially along the second direction; an orthographic projection of a first anode layer of the one first light emitting device on the plane of the display substrate is at least partially overlapped with an orthographic projection of one sub-region in the fifth sub-region to the eighth sub-region on the plane of the display substrate, and is at least partially overlapped with an orthographic projection of one of the first transparent sub-region and the second transparent sub-region on the plane of the display substrate; orthographic projections of first anode layers of the three second light emitting devices on the plane of the display substrate are at least partially overlapped with orthographic projections of the other three sub-regions in the first sub-region to the fifth sub-region on the plane of the display substrate respectively, and are different from each other; the second direction and the first direction intersect.

In an exemplary embodiment, a width of an orthographic projection of the second anode layer of the blue light emitting device on the plane of the display substrate is greater than a width of an orthographic projection of the second anode layer of the red light emitting device on the plane of the display substrate, a width of an orthographic projection of the second anode layer of the green light emitting device on the plane of the display substrate, and a width of an orthographic projection of the second anode layer of the white light emitting device on the plane of the display substrate, and a width refers to a dimensional feature along the second direction. In this way, it may be achieved that an area occupied by the blue light emitting device in the pixel region is increased.

In an exemplary embodiment, the pixel region may further include a plurality of pixel drive circuits configured to drive light emitting devices, orthographic projections of the plurality of pixel drive circuits on the plane of the display substrate are within a range of the orthographic projection of the pixel region on the plane of the display substrate. In this way, it may be achieved that a pixel drive circuit with a relatively low transmittance is disposed in the pixel region.

In an exemplary embodiment, the pixel drive circuit may include a first transistor, a second transistor, and a third transistor, the first transistor and the third transistor are located on two sides of the second transistor in a second direction, and each of extension directions of channel regions of the first transistor, the second transistor, and the third transistor is the second direction. In this way, by optimizing arrangement of transistors, an area occupied by the pixel drive circuit in the pixel region may be reduced, layout space may be saved, which is beneficial to reduction of a pixel size and achievement of a higher Pixel Per Inch (PPI), thereby a better display effect is achieved. Herein, an "extension direction of a channel region of a transistor" used in the embodiment of the present disclosure may refer to an extension direction of a connection line between a first region and a second region of an active layer of the transistor, i.e., an extension direction of a connection line between a first electrode of the transistor and a second electrode of the transistor.

In an exemplary embodiment, the pixel drive circuit may further include a storage capacitor located between the second transistor and the third transistor, and an extension direction of the storage capacitor is the second direction. Thus, by optimizing arrangement of transistors and the storage capacitor, an area occupied by the pixel drive circuit in the pixel region may be reduced, the layout space may be further saved, which is beneficial to reduction of a pixel size and achievement of a higher PPI, thereby a better display effect is achieved.

In an exemplary embodiment, the plurality of pixel drive circuits may be arranged side by side along the first direction. Herein, "side by side" used in the embodiment of the present disclosure refers to being arranged on a straight line.

In an exemplary embodiment, the pixel drive circuit includes a first transistor, a second transistor, a third transistor, and a storage capacitor; in a direction perpendicular to the plane of the display substrate, the display substrate may include a first conductive layer, a semiconductor layer, a second conductive layer, and a third conductive layer disposed sequentially on a base substrate; the first conductive layer includes a first electrode plate, the semiconductor layer includes an active layer of the first transistor, an active layer of the second transistor, an active layer of the third transistor, and a second electrode plate, the second conductive layer includes a gate electrode of the first transistor, a gate electrode of the second transistor, and a gate electrode of the third transistor, the third conductive layer may include a first electrode of the first transistor, a second electrode of the first transistor, a first electrode of the second transistor, a second electrode of the second transistor, a first electrode of the third transistor, a second electrode of the third transistor, and a third electrode plate, the first electrode plate and the second electrode plate form a first storage capacitor, the second electrode plate and the third electrode plate form a second storage capacitor, the first storage capacitor and the second storage capacitor are connected in parallel to form the storage capacitor.

In an exemplary embodiment, the first conductive layer further includes a compensation connection line, and the third conductive layer further includes a compensation signal line, the first electrode of the third transistor is connected with the compensation signal line through the compensation connection line.

In an exemplary embodiment, the second conductive layer includes a power supply connection line, and the third conductive layer further includes a first power supply line, the first electrode of the second transistor is connected with the first power supply line through the power supply connection line; the first power supply line is connected with the power supply connection line through a via, and a double-layer trace is formed between the gate electrode of the first transistor and the gate electrode of the third transistor.

In an exemplary embodiment, the second conductive layer further includes a first scan signal line and a second scan signal line, the gate electrode of the first transistor is connected with the first scan signal line, and the gate electrode of the third transistor is connected with the second scan signal line.

In an exemplary embodiment, the third conductive layer further includes a data signal line, and the first electrode of the first transistor is connected with the data signal line.

In an exemplary embodiment, the pixel drive circuit may include, but is not limited to, a circuit structure such as 3T1C, 4T1C, 5T1C, 5T2C, 6T1C, 7T1C, or 8T1C. Herein, "3T" in "3T1C" refers to three transistors, and "1C" refers to one storage capacitor or a whole after multiple capacitors are connected in parallel; the same applies to 4T1C, 5T1C, 5T2C, 6T1C, 7T1C, or 8T1C and so on. Herein, no limitation is made thereto in embodiments of the present disclosure.

Figure 2:
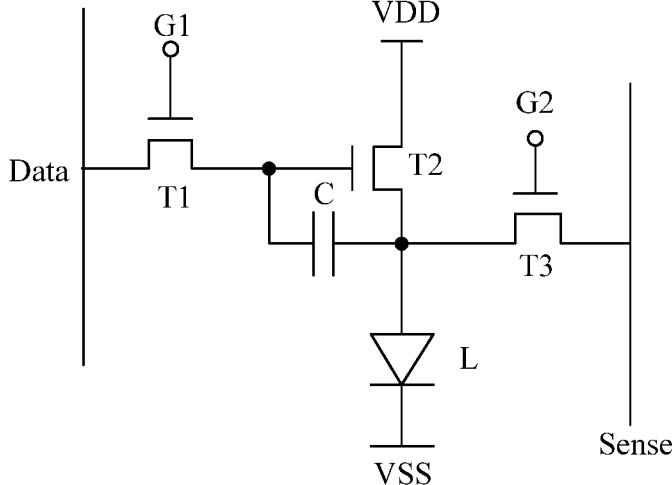
FIG. 2 is a schematic diagram of an equivalent circuit of a pixel drive circuit.

In an exemplary embodiment, taking a case that a 3T1C structure is adopted for a pixel drive circuit as an example, FIG. 2 is a schematic diagram of an equivalent circuit of the pixel drive circuit. As shown in FIG. 2, the pixel drive circuit may include three transistors (a first transistor T1, a second transistor T2, and a third transistor T3) and one storage capacitor C; the display substrate further includes six signal lines (a data signal line Data, a first scan signal line G1, a second scan signal line G2, a compensation signal line Sense, a first power supply line VDD, and a second power supply line VSS). Herein, the first transistor T1 is a switching transistor, the second transistor T2 is a drive transistor, and the third transistor T3 is a compensation transistor. A gate electrode of the first transistor T1 is coupled to the first scan signal line G1, a first electrode of the first transistor T1 is coupled to the data signal line Data, a second electrode of the first transistor T1 is coupled to a gate electrode of the second transistor T2. The first transistor T1 is configured to receive a data signal transmitted by the data signal line Data under control of the first scan signal line G1, so that the gate electrode of the second transistor T2 receives the data signal. The gate electrode of the second transistor T2 is coupled to the second electrode of the first transistor T1, the first electrode of the second transistor T2 is coupled to the first power supply line VDD, the second electrode of the second transistor T2 is coupled to a first electrode of a light emitting device L, and the second transistor T2 is configured to generate a corresponding current at the second electrode under control of the data signal received by the gate electrode of the second transistor. A gate electrode of the third transistor T3 is coupled to the second scan signal line G2, a first electrode of the third transistor T3 is coupled to the compensation signal line Sense, a second electrode of the third transistor T3 is coupled to the second electrode of the second transistor T2. The third transistor T3 is configured to extract a threshold voltage Vth and a mobility of the second transistor T2 in response to a compensation time sequence to compensate the threshold voltage Vth. The first electrode of the light emitting device L is coupled to the second electrode of the second transistor T2, a second electrode of the light emitting device L is coupled to the second power supply line VSS, and the light emitting device L is configured to emit light with corresponding brightness in response to the current of the second electrode of the second transistor T2. A first electrode of the storage capacitor C is coupled to the gate electrode of the second transistor T2, a second electrode of the storage capacitor C is coupled to the second electrode of the second transistor T2, and the storage capacitor C is configured to store a potential of the gate electrode of the second transistor T2.

In an exemplary embodiment, a signal of the first power supply line VDD is a high-level signal continuously provided, and a signal of the second power supply line VSS is a low-level signal.

In an exemplary embodiment, the first transistor T1 to the third transistor T3 may be P-type transistors, or may be N-type transistors. Use of a same type of transistors in a pixel drive circuit may simplify a process flow, reduce process difficulties of a display substrate, and improve a yield of products. In an exemplary embodiment, the first transistor T1 to the third transistor T3 may include a P-type transistor and an N-type transistor.

In an exemplary implementation mode, the first scan signal line S1 and the second scan signal line S2 may extend along the first direction DR1, and the second power supply line VSS, the first power supply line VDD, and the data signal line Data may extend along the second direction DR2.

In an exemplary embodiment, the light emitting device L may be an electronic device with light emitting performance. For example, the light emitting device may include an Organic Light Emitting Diode (OLED) or a Quantum dot Light Emitting Diode (QLED), etc. Herein, no limitation is made thereto in embodiments of the present disclosure.

In an exemplary embodiment, taking a case that an OLED is adopted for the light emitting device L as an example, the light emitting device L may include a first electrode (for example, as an anode), an organic emitting layer, and a second electrode (for example, as a cathode) that are stacked.

In an exemplary embodiment, at least one of the plurality of pixel units P may include four sub-pixels, wherein one sub-pixel of the four sub-pixels may be a White (W) sub-pixel, and the other three sub-pixels of the four sub-pixels other than the one sub-pixel, may be any one of a Red (R) sub-pixel, a Green (G) sub-pixel, and a Blue (B) sub-pixel, respectively, and are different from each other. For example, the four sub-pixels may include a first sub-pixel P1 that emits light of a first color, a second sub-pixel P2 that emits light of a second color, a third sub-pixel P3 that emits light of a third color, and a fourth sub-pixel P4 that emits light of a fourth color. The first sub-pixel P1 may be a Red (R) sub-pixel, the second sub-pixel P2 may be a Green (G) sub-pixel, the third sub-pixel P3 may be a Blue (B) sub-pixel, and the fourth sub-pixel P4 may be a White (W) sub-pixel. Herein, no limitation is made thereto in embodiments of the present disclosure.

In an exemplary embodiment, taking a case that a pixel unit includes four sub-pixels as an example, the four sub-pixels may be arranged in a manner of a rectangle, vertically side by side, horizontally side by side, etc. Herein, no limitation is made thereto in embodiments of the present disclosure.

In an exemplary embodiment, one light emitting device and a corresponding pixel drive circuit may be divided into a sub-pixel. For example, a White (W) sub-pixel may include a white light emitting device and a pixel drive circuit connected with the white light emitting device, a Red (R) sub-pixel may include a red light emitting device and a pixel drive circuit connected with the white light emitting device, a Green (G) sub-pixel may include a green light emitting device and a pixel drive circuit connected with the white light emitting device, and a Blue (B) sub-pixel may include a blue light emitting device and a pixel drive circuit connected with the white light emitting device.

A structure and a preparation process of the display substrate will be described below with reference to the drawings by taking a case that the first sub-pixel P1 is a Red (R) sub-pixel, the second sub-pixel P2 is a Green (G) sub-pixel, the third sub-pixel P3 is a Blue (B) sub-pixel, and the fourth sub-pixel P4 is a White (W) sub-pixel as an example. Herein, it is illustrated by taking a case that a white light emitting device is used as a first light emitting device, a red light emitting device, a blue light emitting device, and a green light emitting device are used as second light emitting devices as an example.

Figure 3:
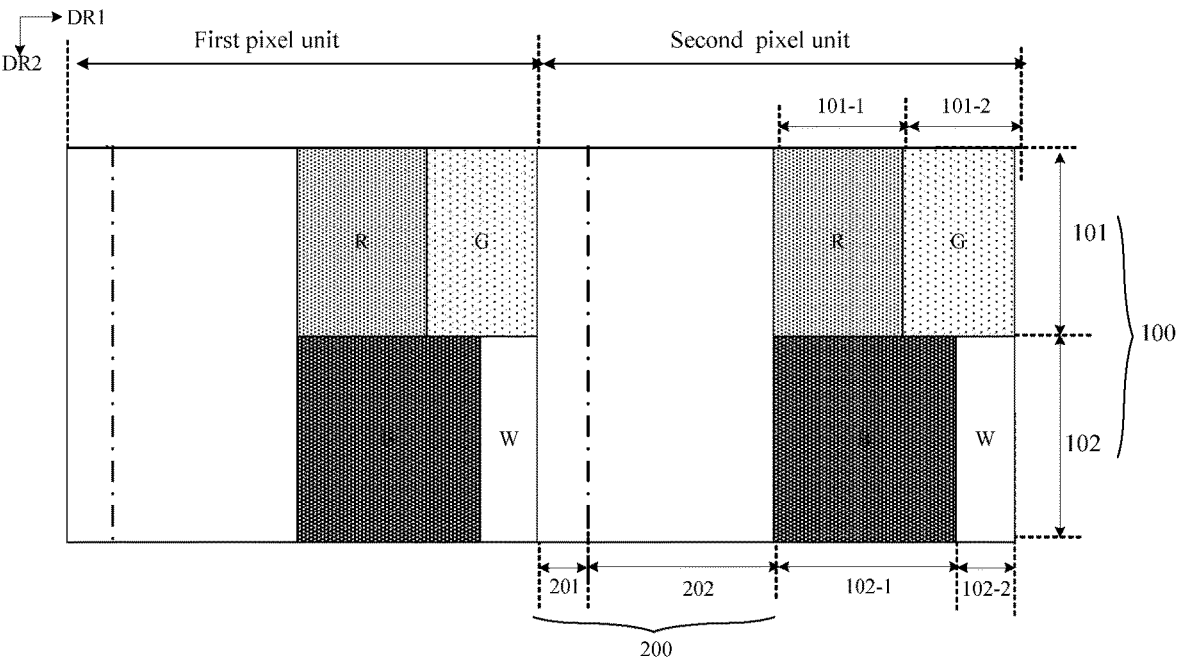
FIG. 3 is a schematic diagram of a first structure of a display substrate in an exemplary embodiment of the present disclosure.
Figure 4:
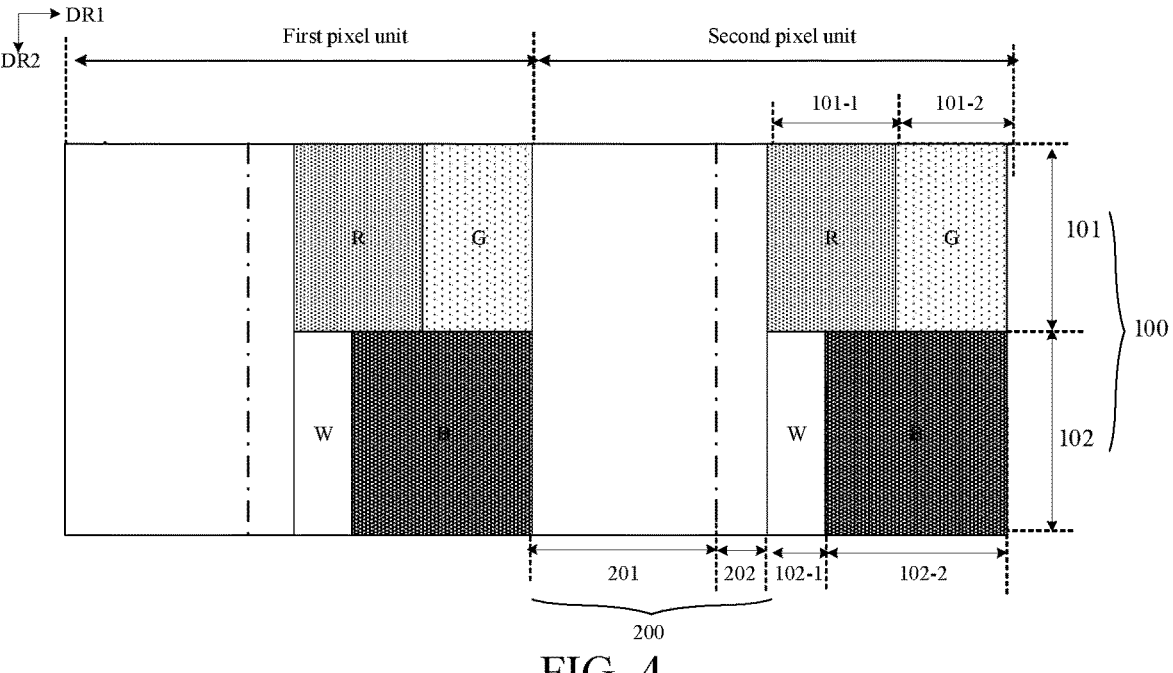
FIG. 4 is a schematic diagram of a second structure of a display substrate in an exemplary embodiment of the present disclosure.
Figure 5:
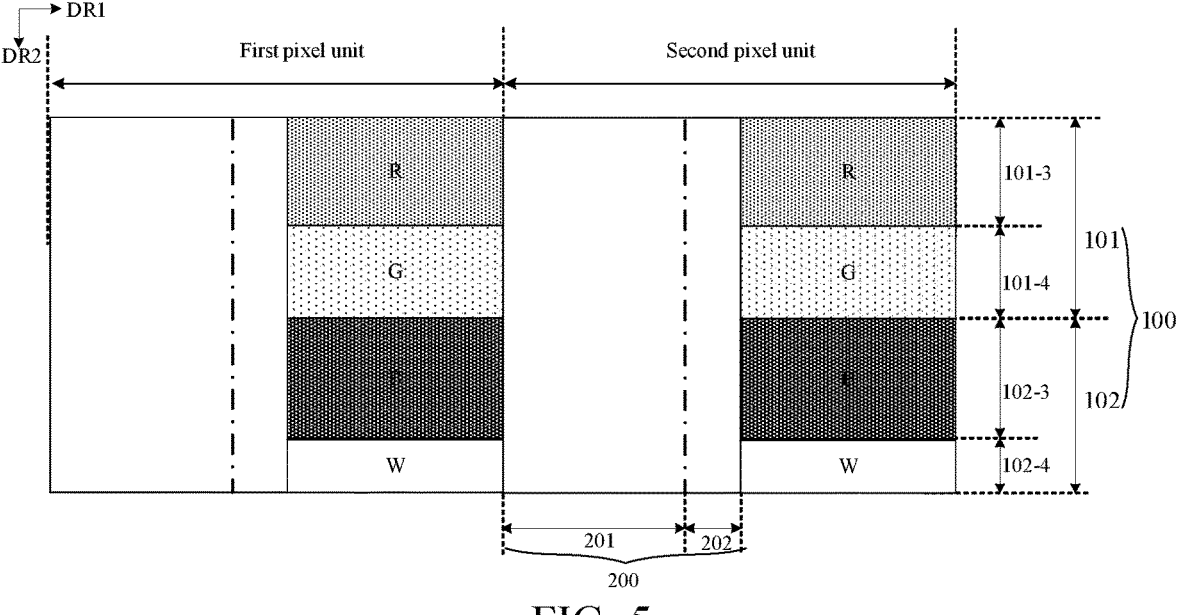
FIG. 5 is a schematic diagram of a third structure of a display substrate in an exemplary embodiment of the present disclosure.
Figure 6:
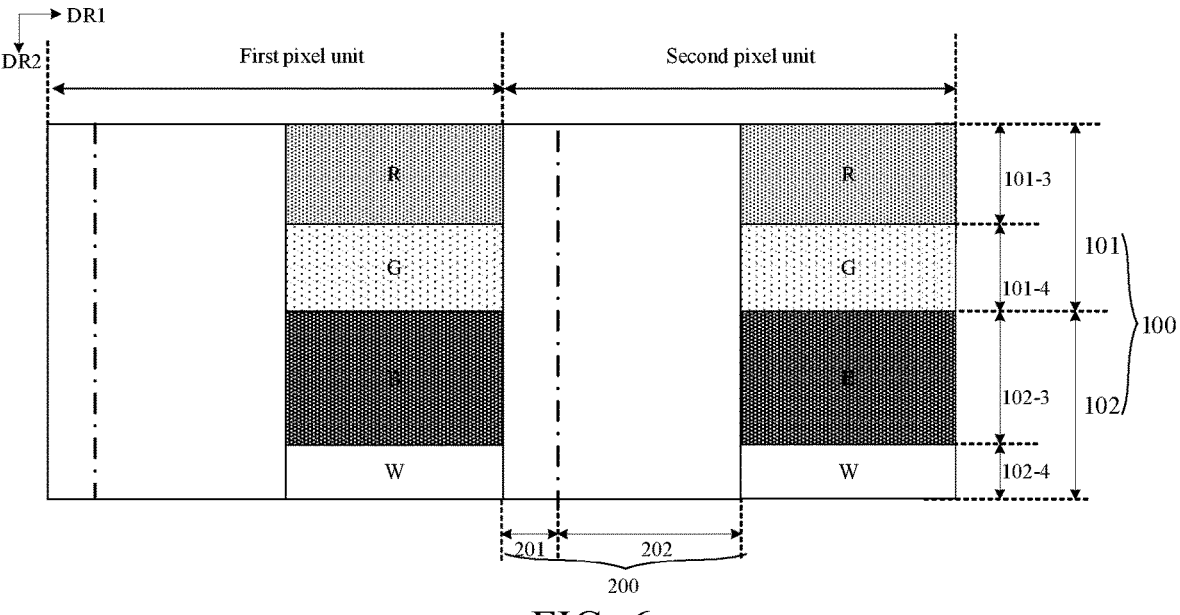
FIG. 6 is a schematic diagram of a fourth structure of a display substrate in an exemplary embodiment of the present disclosure.

FIG. 3 is a schematic diagram of a first structure of a display substrate in an exemplary embodiment of the present disclosure. FIG. 4 is a schematic diagram of a second structure of a display substrate in an exemplary embodiment of the present disclosure. FIG. 5 is a schematic diagram of a third structure of a display substrate in an exemplary embodiment of the present disclosure. FIG. 6 is a schematic diagram of a fourth structure of a display substrate in an exemplary embodiment of the present disclosure. Herein, in FIGS. 3 to 6, it is illustrated by taking two pixel units on the display substrate as an example. In FIGS. 3 and 4, it is illustrated by taking a case that four sub-pixels may be arranged in a manner of a rectangle as an example. In FIGS. 5 and 6, it is illustrated by taking a case that four sub-pixels may be arranged vertically side by side as an example.

In an exemplary embodiment, as shown in FIGS. 3 to 6, the display substrate may include a plurality of pixel regions 100 and a plurality of transparent regions 200 arranged alternately. The display substrate may further include a plurality of pixel units arranged in an array, and each pixel unit may include a transparent region 200 and a pixel region 100 disposed sequentially along the first direction DR1. For each pixel unit, second light emitting devices of a first sub-pixel P1, a second sub-pixel P2, and a third sub-pixel P3 are formed in the pixel region 100 in the present pixel unit. As shown in FIGS. 4 and 5, a first light emitting device of a fourth sub-pixel P4 is formed in the pixel region 100 and the transparent region 200 in the present pixel unit, or, as shown in FIGS. 3 and 6, a first light emitting device of a fourth sub-pixel P4 is formed in the pixel region 100 in the present pixel unit and a transparent region 200 in an adjacent pixel unit.

In an exemplary embodiment, for each pixel unit, pixel drive circuits of a first sub-pixel P1 to a fourth sub-pixel P4 are all formed in a pixel region 100 in the present pixel unit.

In an exemplary embodiment, for each pixel unit, as shown in FIGS. 4 and 5, a first electrode layer in a first light emitting device of a fourth sub-pixel P4 includes a main body portion located in the pixel region 100 in the present pixel unit and an extension portion located in a transparent region 200 in the present pixel unit, or, as shown in FIGS. 3 and 6, a first electrode layer in a first light emitting device of a fourth sub-pixel P4 includes a main body portion located in a pixel region 100 in the present pixel unit and an extension portion located in a transparent region 200 in an adjacent pixel unit. In this way, the first light emitting device may be externally expanded to the transparent region.

In an exemplary embodiment, as shown in FIG. 3, in each pixel unit, a transparent region 200 may include a first transparent sub-region 201 and a second transparent sub-region 202 disposed sequentially along the first direction DR1, a pixel region 100 may include a first region 101 and a second region 102 disposed sequentially along the second direction DR2, the first region 101 may include a first sub-region 101-1 and a second sub-region 101-2 disposed sequentially along the first direction DR1, and the second region 102 may include a third sub-region 102-1 and a fourth sub-region 102-2 disposed sequentially along the first direction DR1. For example, for each pixel unit, a second light emitting device of each first sub-pixel P1 is formed in the first sub-region 101-1 in the present pixel unit, a second light emitting device of each second sub-pixel P2 is formed in the second sub-region 101-2 in the present pixel unit, a second light emitting device of the third sub-pixel P3 is formed in the third sub-region 102-1 in the present pixel unit, and a first light emitting device of the fourth sub-pixel P4 is formed in the fourth sub-region 102-2 in the present pixel unit and a first transparent sub-region 201 in an adjacent pixel unit.

In an exemplary embodiment, as shown in FIG. 3, a first anode layer of each fourth sub-pixel P4 may include a main body portion located in a pixel region 100 and an extension portion located in a transparent region 200, and the main body portion and the extension portion may be located in two adjacent pixel units. For example, since a fourth sub-region 102-2 in a first pixel unit is located at a lower right side of a pixel region 100 and adjacent to a first transparent sub-region 201 in a transparent region 200 of a second pixel unit, a main body portion of the fourth sub-pixel P4 in the first pixel unit may be disposed in the fourth sub-region 102-2 in the first pixel unit, and an extension part of the fourth sub-pixel P4 in the first pixel unit may be disposed in the first transparent sub-region 201 in the second pixel unit. In this way, it may be achieved that the fourth sub-pixel P4 (i.e., a white sub-pixel) in the first pixel unit is externally expanded to the transparent region in the second pixel unit, and an aperture ratio may be improved.

Of course, in addition to a manner of the exemplary embodiment shown in FIG. 3, the first light emitting device of the fourth sub-pixel P4 may also be formed in another sub-region (e.g., the second sub-region 101-2) in the pixel region in the present pixel unit, and in the first transparent sub-region 201 in the adjacent pixel unit. Herein, no limitation is made thereto in embodiments of the present disclosure.

In an exemplary embodiment, as shown in FIG. 4, in each pixel unit, a transparent region 200 may include a first transparent sub-region 201 and a second transparent sub-region 202 disposed sequentially along the first direction DR1, a pixel region 100 may include a first region 101 and a second region 102 disposed sequentially along the second direction DR2, the first region 101 may include a first sub-region 101-1 and a second sub-region 101-2 disposed sequentially along the first direction DR1, and the second region 102 may include a third sub-region 102-1 and a fourth sub-region 102-2 disposed sequentially along the first direction DR1. For example, for each pixel unit, a second light emitting device of each first sub-pixel P1 is formed in a first sub-region 101-1 in the present pixel unit, a second light emitting device of each second sub-pixel P2 is formed in a second sub-region 101-2 in the present pixel unit, a second light emitting device of the third sub-pixel P3 is formed in a fourth sub-region 102-2 in the present pixel unit, and the first light emitting device of the fourth sub-pixel P4 is formed in a third sub-region 102-1 and a second transparent sub-region 202 in the present pixel unit.

In an exemplary embodiment, as shown in FIG. 4, a first anode layer of a first light emitting device of each fourth sub-pixel P4 may include a main body portion located in the pixel region 100 and an extension portion located in the transparent region 200, and the main body portion and the extension portion may be located in a same pixel unit. For example, since a third sub-region 102-1 in a first pixel unit is located at a lower left side of a pixel region 100 and adjacent to a second transparent sub-region 202 in a transparent region 200 in a first pixel unit, a main body portion of a fourth sub-pixel P4 in the first pixel unit may be disposed in a third sub-region 102-1 in the first pixel unit, and an extension portion of the fourth sub-pixel P4 in the first pixel unit may be disposed in a second transparent sub-region 202 in the first pixel unit. In this way, it may be achieved that the fourth sub-pixel P4 (i.e., a white sub-pixel) in the first pixel unit is externally expanded to the transparent region in the first pixel unit, and an aperture ratio may be improved.

Of course, in addition to a manner of the exemplary embodiment shown in FIG. 4, the first light emitting device of the fourth sub-pixel may also be formed in another sub-region (for example, the first sub-region 101-1) in the pixel region and the second transparent sub-region 202 in the present pixel unit. Herein, no limitation is made thereto in embodiments of the present disclosure.

In an exemplary embodiment, as shown in FIG. 5, in each pixel unit, a transparent region 200 may include a first transparent sub-region 201 and a second transparent sub-region 202 disposed sequentially along the first direction DR1, a pixel region 100 may include a first region 101 and a second region 102 disposed sequentially along the second direction DR2, the first region 101 may include a fifth sub-region 101-3 and a sixth sub-region 101-4 disposed sequentially along the second direction DR2, and the second region 102 may include a seventh sub-region 102-3 and an eighth sub-region 102-4 disposed sequentially along the second direction DR2. For example, for each pixel unit, a second light emitting device of each first sub-pixel P1 is formed in a fifth sub-region 101-3 in the present pixel unit, a second light emitting device of each second sub-pixel P2 is formed in a sixth sub-region 101-4 in the present pixel unit, a second light emitting device of a third sub-pixel P3 is formed in a seventh sub-region 102-3 in the present pixel unit, and a first light emitting device of a fourth sub-pixel P4 is formed in an eighth sub-region 102-4 and a second transparent sub-region 202 in the present pixel unit.

In an exemplary embodiment, as shown in FIG. 5, a first anode layer of a first light emitting device of each fourth sub-pixel P4 may include a main body portion located in the pixel region 100 and an extension portion located in the transparent region 200, and the main body portion and the extension portion may be located in a same pixel unit. For example, since an eighth sub-region 102-4 in a first pixel unit is adjacent to a second transparent sub-region 202 in the first pixel unit, a main body portion of a fourth sub-pixel P4 in the first pixel unit may be disposed in the eighth sub-region 102-4 in the first pixel unit, and an extension portion of the fourth sub-pixel P4 in the first pixel unit may be disposed in the second transparent sub-region 202 in the first pixel unit. In this way, it may be achieved that the fourth sub-pixel P4 (i.e., a white sub-pixel) in the first pixel unit is externally expanded to a transparent region in the first pixel unit, and an aperture ratio may be improved.

Of course, in addition to a manner of the exemplary embodiment shown in FIG. 5, the fourth sub-pixel P4 may also be formed in another sub-region (for example, at any one position in a fifth sub-region 101-3, a sixth sub-region 101-4, and a seventh sub-region 102-3) in a pixel region and a second transparent sub-region 202 in the present pixel unit. Herein, no limitation is made thereto in embodiments of the present disclosure.

In an exemplary embodiment, as shown in FIG. 6, in each pixel unit, a transparent region 200 may include a first transparent sub-region 201 and a second transparent sub-region 202 disposed sequentially along the first direction DR1, a pixel region 100 may include a first region 101 and a second region 102 disposed sequentially along the second direction DR2, the first region 101 may include a fifth sub-region 101-3 and a sixth sub-region 101-4 disposed sequentially along the second direction DR2, and the second region 102 may include a seventh sub-region 102-3 and an eighth sub-region 102-4 disposed sequentially along the second direction DR2. For example, for each pixel unit, a second light emitting device of each first sub-pixel P1 is formed in a fifth sub-region 101-3 in the present pixel unit, a second light emitting device of each second sub-pixel P2 is formed in a sixth sub-region 101-4 in the present pixel unit, a second light emitting device of a third sub-pixel P3 is formed in a seventh sub-region 102-3 in the present pixel unit, and a first light emitting device of a fourth sub-pixel P4 is formed in an eighth sub-region 102-4 in the present pixel unit and a first transparent sub-region 201 in an adjacent sub-pixel.

In an exemplary embodiment, as shown in FIG. 6, a first anode layer of a first light emitting device of each fourth sub-pixel P4 may include a main body portion located in the pixel region 100 and an extension portion located in the transparent region 200, and the main body portion and the extension portion may be located in two adjacent pixel units. For example, since an eighth sub-region 102-4 in a first pixel unit is adjacent to a first transparent sub-region 201 in a second pixel unit, a main body portion of a fourth sub-pixel P4 in the first pixel unit may be disposed in the eighth sub-region 102-4 in the first pixel unit, and an extension portion of the fourth sub-pixel P4 in the first pixel unit may be disposed in the first transparent sub-region 201 in the second pixel unit. In this way, it may be achieved that the fourth sub-pixel P4 (i.e., a white sub-pixel) in the first pixel unit is externally expanded to a transparent region in the first pixel unit, and an aperture ratio may be improved.

Of course, in addition to a manner of the exemplary embodiment shown in FIG. 6, the first light emitting device of the fourth sub-pixel P4 may also be formed in another sub-region (for example, at any one position of a fifth sub-region 101-3, a sixth sub-region 101-4, and a seventh sub-region 102-3) in a pixel region in the present pixel unit and in a first transparent sub-region 201 in an adjacent sub-pixel. Herein, no limitation is made thereto in embodiments of the present disclosure.

In an exemplary embodiment, in each pixel unit, an area of a pixel region 100 may be about 30% to 35% of an area of the pixel unit.

In an exemplary embodiment, in each pixel unit, an area of a transparent region 200 may be about 42% to 47% of an area of the pixel unit. For example, the area of the transparent region 200 may be about 45% of the area of the pixel unit. Herein, no limitation is made thereto in embodiments of the present disclosure.

In an exemplary embodiment, in a pixel region 100, an area occupied by a light emitting device of a Red (R) sub-pixel may be about 30% to 36.37% of an area of the pixel region 100, an area of a region where a light emitting device of a Green (G) sub-pixel is located may be about 25% to 29.1% of the area of the pixel region 100, or an area of a region where a light emitting device of a Blue (B) sub-pixel is located may be about 35% to 40% of the area of the pixel region 100. Or, in each pixel unit, an area of a region where a light emitting device of a White (W) sub-pixel is located may be about 40% to 46.5% of an area of the pixel unit. Herein, no limitation is made thereto in embodiments of the present disclosure.

Of course, in addition to various exemplary implementation modes listed in the above embodiments, other implementation modes may be adopted, for example, four sub-pixels are arranged horizontally side by side as long as a first anode layer of a white (W) sub-pixel includes a main body portion located in a pixel region and an extension portion located in a transparent region. Herein, no limitation is made thereto in embodiments of the present disclosure.

A structure of a display substrate will be described below through an example of a preparation process of the display substrate. A "patterning process" mentioned in the present disclosure includes processes, such as deposition of a film layer, photoresist coating, mask exposure, development, etching, and photoresist stripping. Deposition may be any one or more of sputtering, evaporation, and chemical vapor deposition. Coating may be any one or more of spray coating and spin coating. Etching may be any one or more of dry etching and wet etching. A "thin film" refers to a layer of a thin film prepared from a material on a base substrate using a process of deposition or coating. If a patterning process is not needed for the "thin film" during a whole preparation process, the "thin film" may be referred to as a "layer". If a patterning process is needed for the "thin film" during the whole preparation process, the thin film is referred to as a "thin film" before the patterning process and referred to as a "layer" after the patterning process. The "layer" after the patterning process includes at least one "pattern". "A and B are disposed in a same layer" mentioned in the present disclosure means that A and B are simultaneously formed through a same patterning process.

In an exemplary embodiment, in a direction perpendicular to a plane of the display substrate (i.e., a third direction DR3), the display substrate may include a base substrate, and a first conductive layer, a first insulation layer, a semiconductor layer, a second insulation layer, a second conductive layer, a third insulation layer, a third conductive layer, a fourth insulation layer, a fifth insulation layer, a fourth conductive layer, and a fifth conductive layer that are sequentially stacked on the base substrate.

Figure 7A:
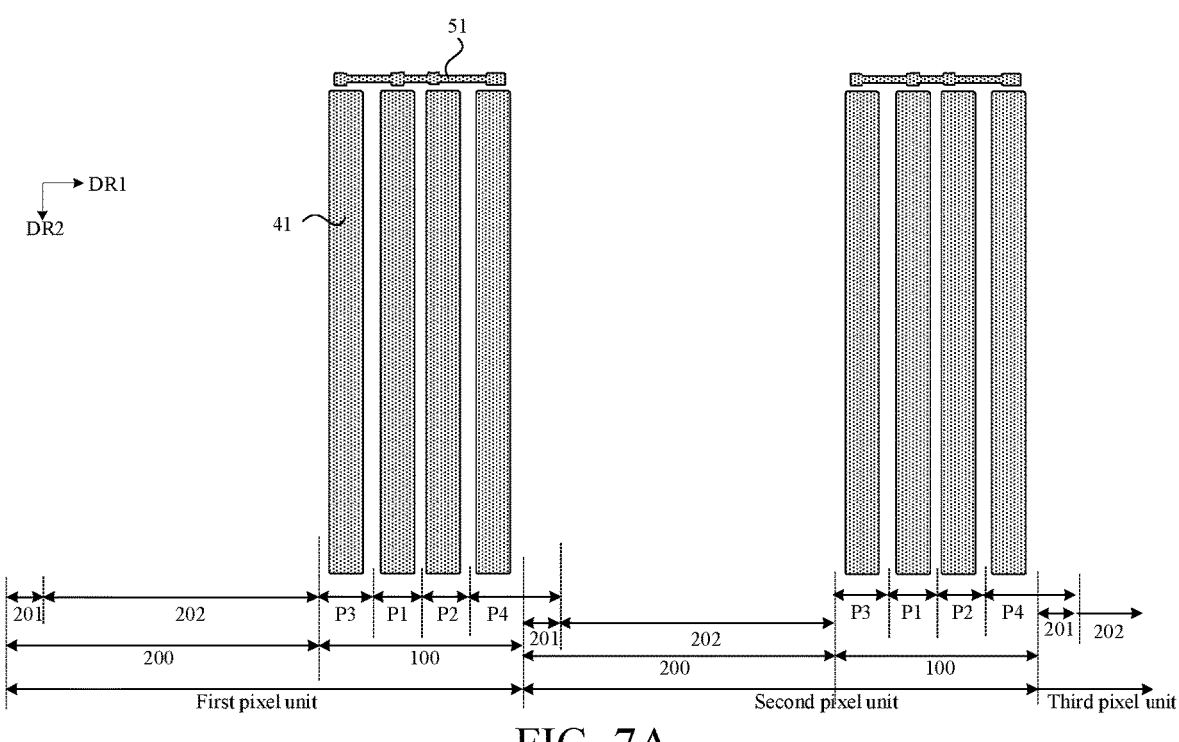
FIG. 7A is a schematic diagram after a first conductive layer in the display substrate shown in FIG. 3 is formed.
Figure 7B:
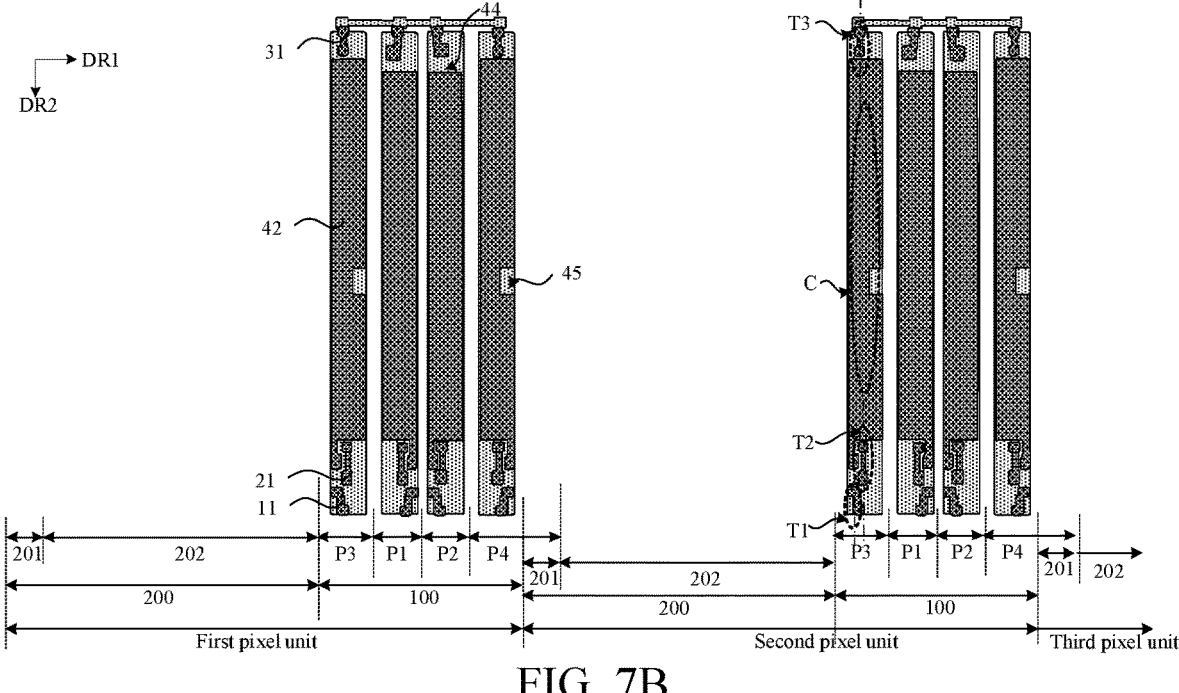
FIG. 7B is a schematic diagram after a semiconductor layer in the display substrate shown in FIG. 3 is formed.
Figure 7C:
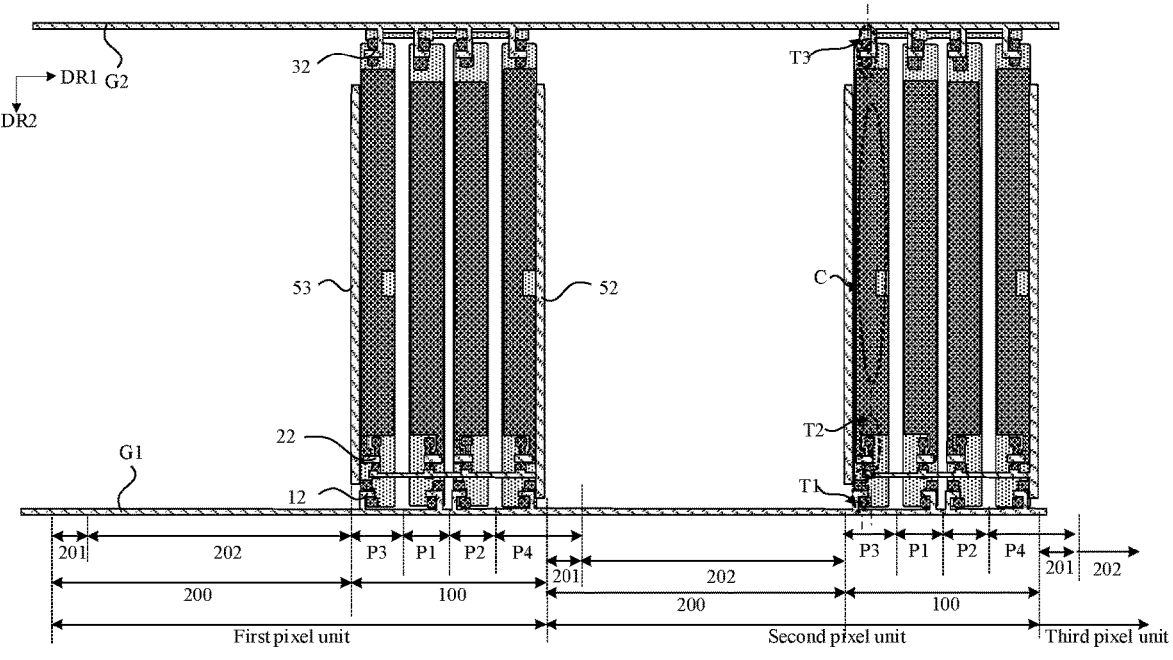
FIG. 7C is a schematic diagram after a second conductive layer in the display substrate shown in FIG. 3 is formed.
Figure 7D:
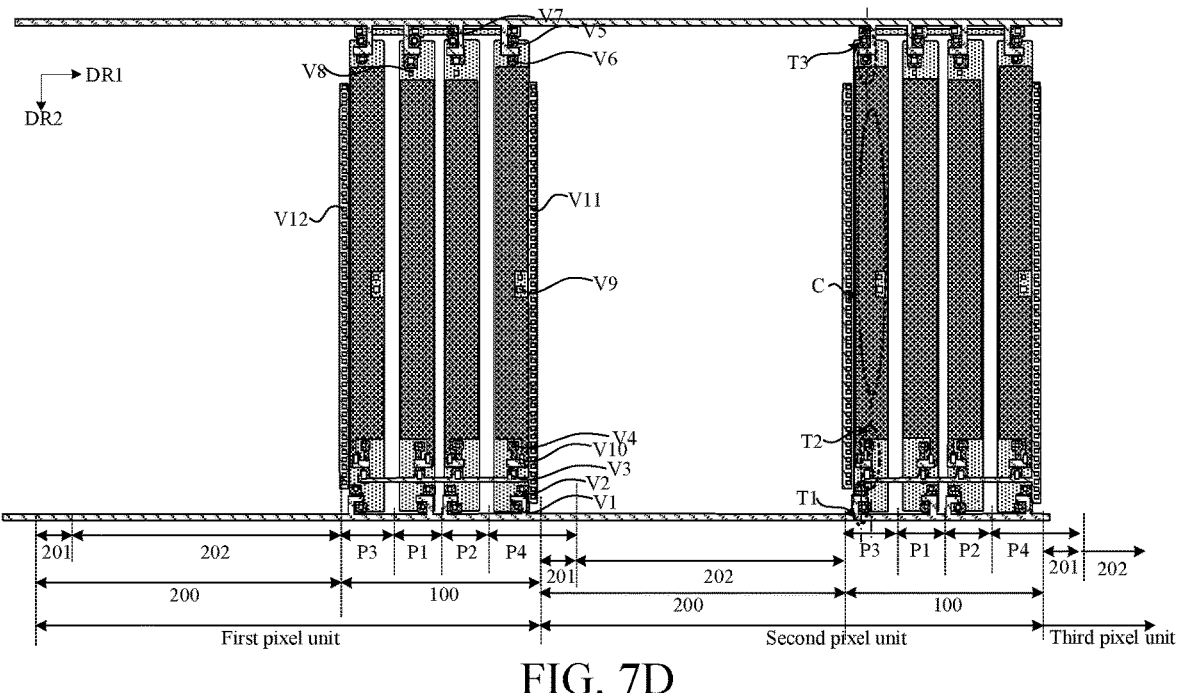
FIG. 7D is a schematic diagram after a third insulation layer in the display substrate shown in FIG. 3 is formed.
Figure 7E:
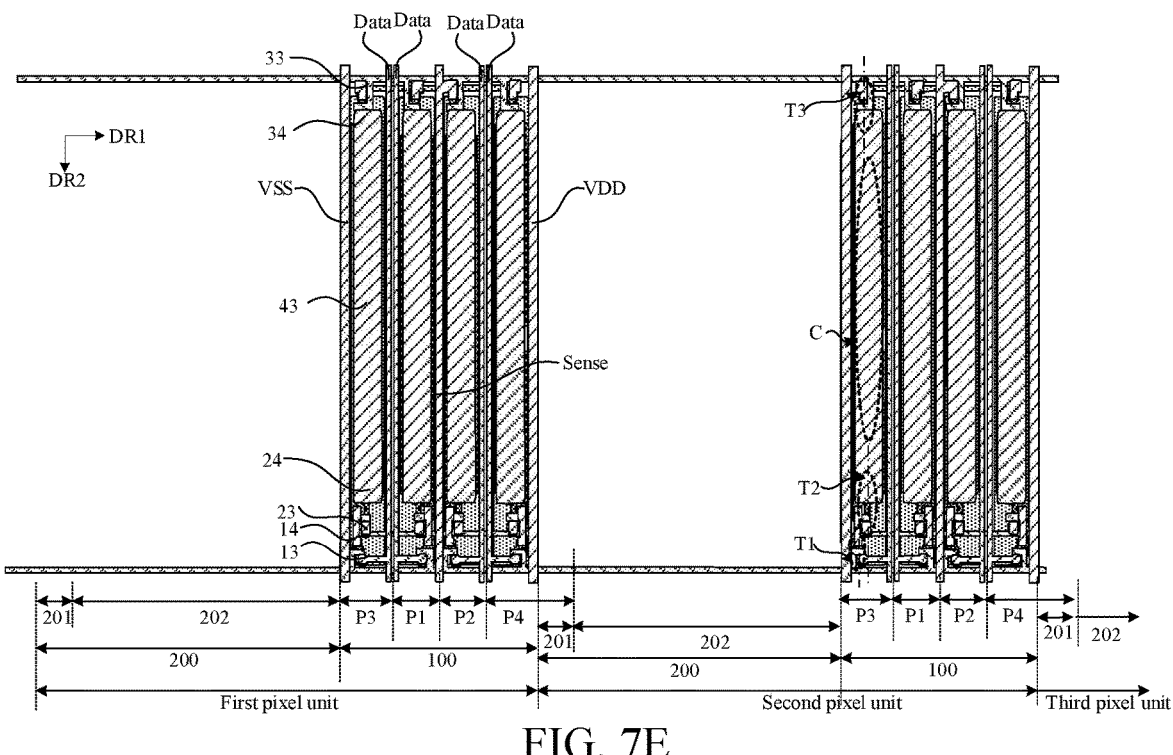
FIG. 7E is a schematic diagram after a third conductive layer in the display substrate shown in FIG. 3 is formed.
Figure 7F:
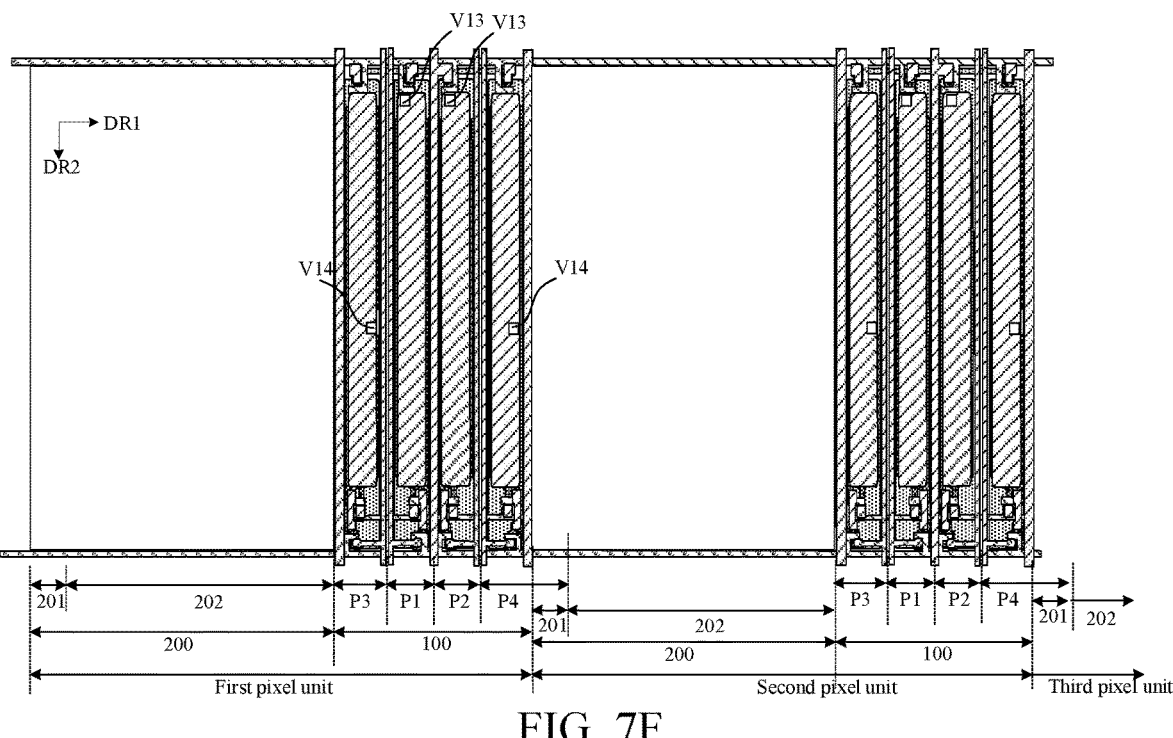
FIG. 7F is a schematic diagram after a fifth insulation layer in the display substrate shown in FIG. 3 is formed.
Figure 7G:
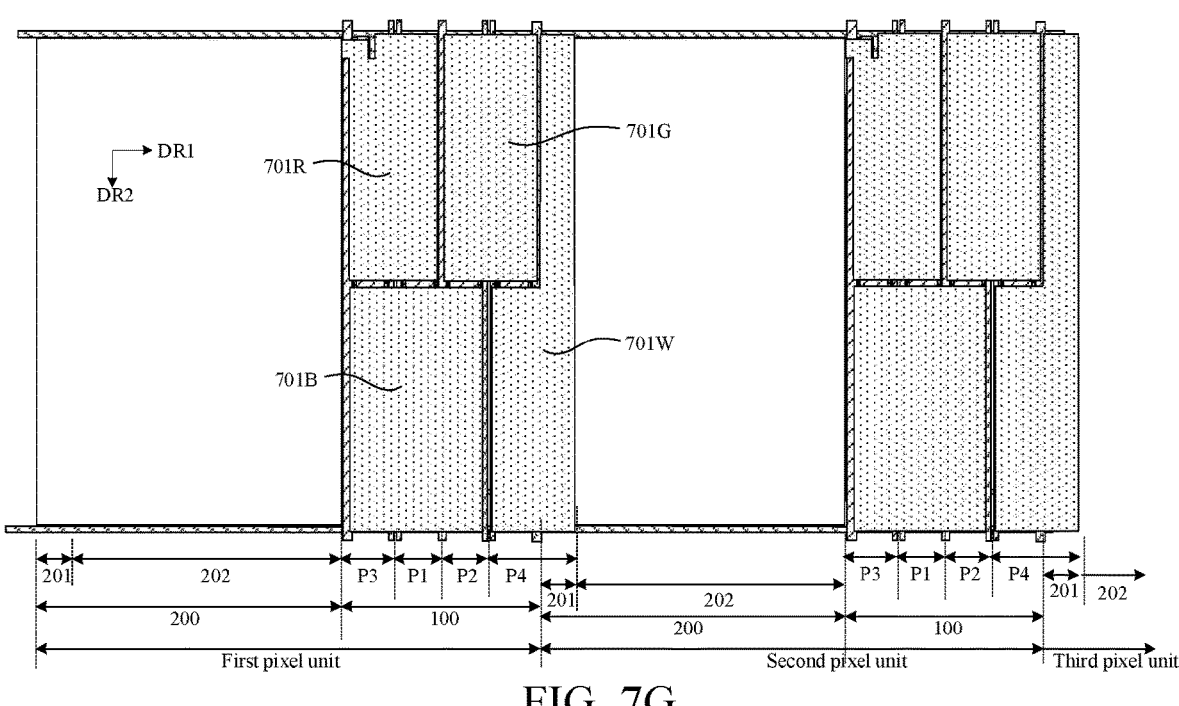
FIG. 7G is a schematic diagram after a fourth conductive layer in the display substrate shown in FIG. 3 is formed.
Figure 7H:
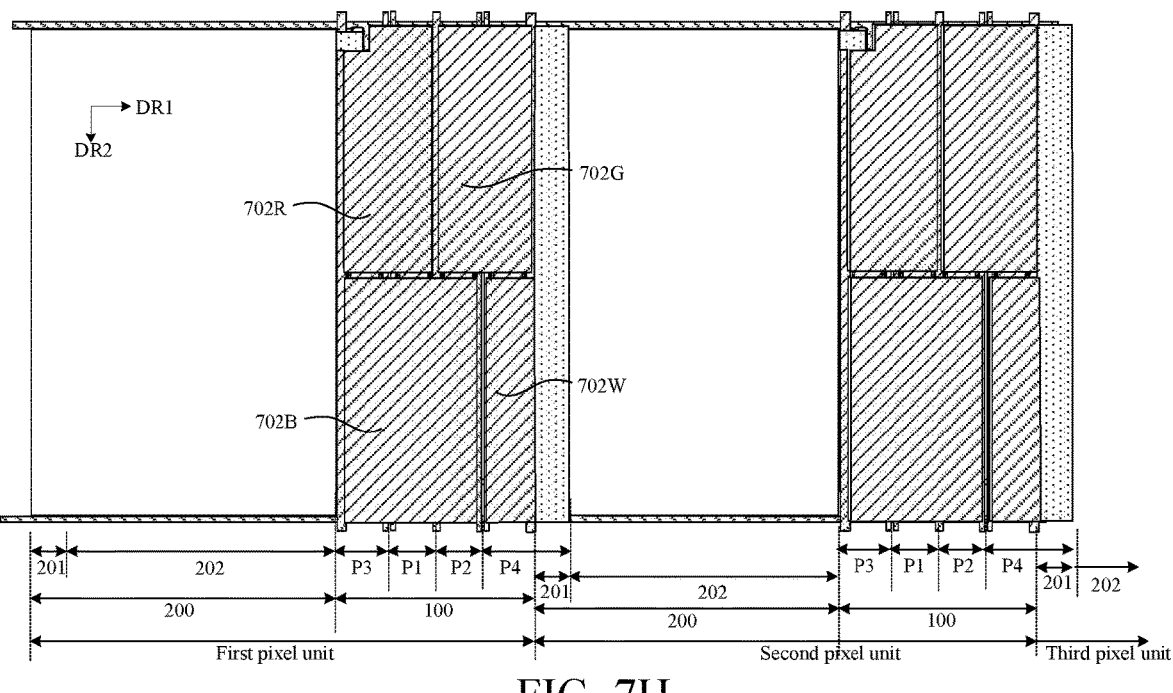
FIG. 7H is a schematic diagram after a fifth conductive layer in the display substrate shown in FIG. 3 is formed.
Figure 7I:
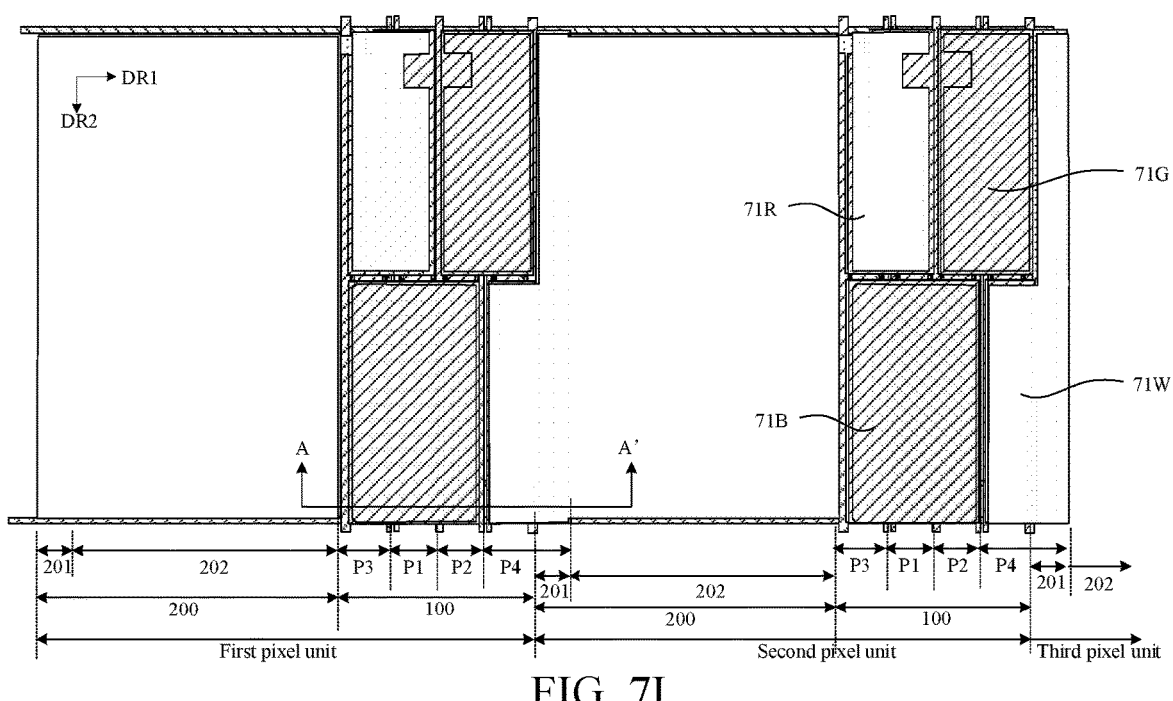
FIG. 7I is a schematic diagram after a pixel definition layer in the display substrate shown in FIG. 3 is formed.
Figure 7J:
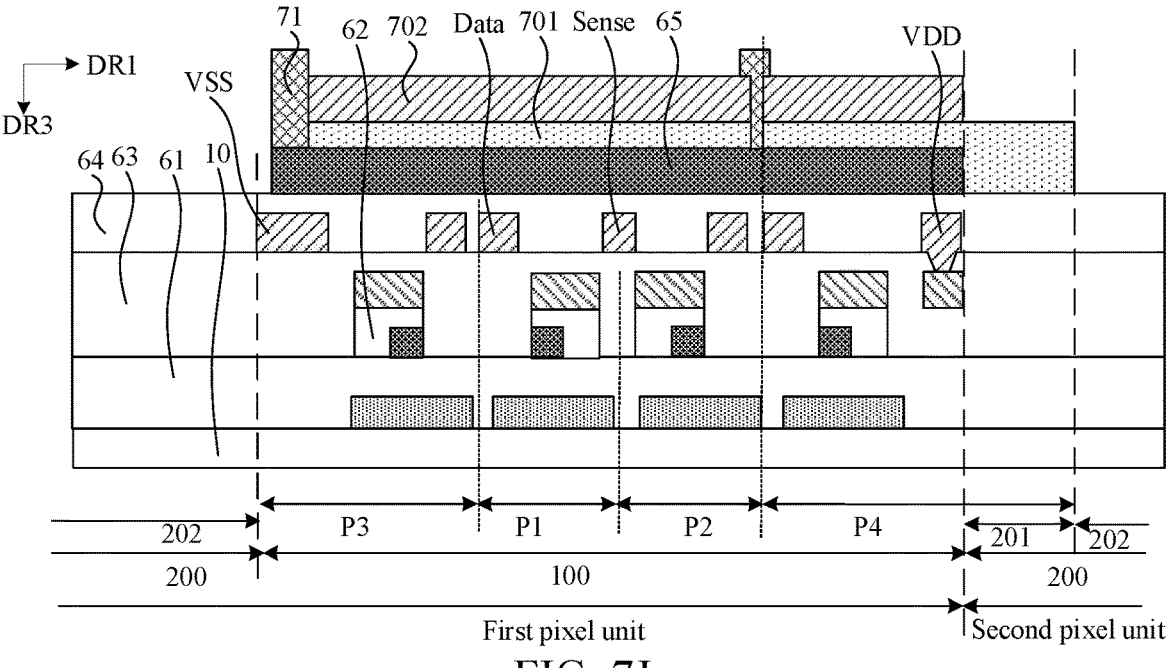
FIG. 7J is a cross-sectional view of the display substrate shown in FIG. 7I taken along an A-A' direction.

FIGS. 7A to 7I are schematic diagrams of a preparation process of the display substrate shown in FIG. 3, illustrating layout structures of two pixel units of the display substrate, and FIG. 7J is a cross-sectional view of the display substrate shown in FIG. 7I taken along an A-A' direction. A preparation process of a display substrate according to an exemplary embodiment of the present disclosure will be described below with reference to the structure of the display substrate shown in FIG. 3 and in conjunction with FIGS. 7A to 7J. Herein, in FIGS. 7A to 7I, each pixel unit includes a pixel region 100 and a transparent region 200, each pixel unit includes a first sub-pixel P1, a second sub-pixel P2, a third sub-pixel P3, and a fourth sub-pixel P4, and a pixel drive circuit of each sub-pixel includes a first transistor T1, a second transistor T2, a third transistor T3, and a storage capacitor C. In the pixel region 100, pixel drive circuits of the third sub-pixel P3, the first sub-pixel P1, the second sub-pixel P2, and the fourth sub-pixel P4 are sequentially disposed along a first direction DR1.

In an exemplary embodiment, the preparation process of the display substrate may include following acts.

(1) Forming a First Conductive Layer.

In an exemplary embodiment, forming a first conductive layer may include depositing a first conductive thin film on a base substrate, patterning the first conductive thin film through a patterning process, and forming the first conductive layer on the base substrate.

In an exemplary embodiment, the first conductive layer may be made of a metal material. For example, the metal material may include, but is not limited to: any one or more of Argentum (Ag), Copper (Cu), Aluminum (Al), and Molybdenum (Mo), or an alloy material of the metals listed above, such as an Aluminum-Neodymium (AlNd) alloy or a Molybdenum-Niobium (MoNb) alloy. The first conductive layer may be of a single-layer structure, or a multi-layer composite structure such as Mo/Cu/Mo.

In an exemplary embodiment, the first conductive layer may be referred to as a Shield (SHL) layer.

In an exemplary embodiment, as shown in FIG. 7A, the first conductive layer may include a compensation connection line 51 and a first electrode plate 41.

In an exemplary embodiment, as shown in FIG. 7A, the compensation connection line 51 may be of a strip structure extending along the first direction DR1. For example, the compensation connection line 51 may be disposed across four sub-pixels and configured to be connected with a compensation signal line Sense formed subsequently, so that the compensation signal line Sense provides a compensation signal to a third transistor T3 of each sub-pixel.

In an exemplary embodiment, as shown in FIG. 7A, the first electrode plate 41 may be disposed in each sub-pixel, the first electrode plate 41 may serve as an electrode plate of a first storage capacitor Cst1, configured to form the first storage capacitor Cst1 with a subsequently formed second electrode plate, and the first electrode plate 41 may also serve as a shield layer, configured to perform a shielding processing on a transistor in a sub-pixel where the first electrode plate 41 is located, so as to reduce an intensity of light irradiated on the transistor and reduce a leakage current, thereby reducing an influence of illumination on characteristics of the transistor. For example, four first electrode plates 41 may be disposed sequentially along the first direction DR1. For example, a shape of the first electrode plate 41 may be a rectangular structure in a shape of a strip extending along a second direction DR2 and corners of the rectangular structure may be provided with chamfers. In addition, except for a position of the compensation connection line 51, the first electrode plate 41 may completely cover a region of a pixel drive circuit of each sub-pixel. In order to achieve effective shielding, in the second direction DR2, a length of the first electrode plate 41 may be greater than a distance between a gate electrode of a first transistor T1 formed subsequently and a gate electrode of a third transistor T3, or, the length of the first electrode plate 41 may be greater than a distance between a first electrode of the first transistor formed subsequently and a first electrode of the third transistor.

In an exemplary embodiment, a pattern of a first conductive layer in a third sub-pixel P3 and a pattern of a first conductive layer in a fourth sub-pixel P4 are mirror symmetrical with respect to a vertical axis, and a pattern of a first conductive layer in a first sub-pixel P1 and a pattern of a first conductive layer in a second sub-pixel P2 are mirror symmetrical with respect to the vertical axis.

After this patterning process, a pattern of the first conductive layer is formed in a pixel region 100, and a transparent region 200 does not have a corresponding film layer.

(2) Forming a Semiconductor Layer.

In an exemplary embodiment, forming a semiconductor layer may include: sequentially depositing a first insulation thin film and a semiconductor thin film on the base substrate on which the above-mentioned structure is formed, patterning the semiconductor thin film through a patterning process, and forming a first insulation layer 61 covering the first conductive layer, and the semiconductor layer disposed on the first insulation layer 61.

In an exemplary embodiment, the first insulation layer may be called a Buffer layer, and the semiconductor layer may be called an Active (ACT) layer.

In an exemplary embodiment, as shown in FIG. 7B, the semiconductor layer may include a first active layer 11, a second active layer 21, a third active layer 31, and a second electrode plate 42 for each sub-pixel.

In an exemplary embodiment, as shown in FIG. 7B, the first active layer 11 serves as an active layer of the first transistor T1, the second active layer 21 serves as an active layer of the second transistor T2, and the third active layer 31 serves as an active layer of the third transistor T3. The first active layer 31, the second active layer 32, and the third active layer 33 each include a channel region, and a first region and a second region located on two sides of the channel region.

In an exemplary embodiment, as shown in FIG. 7B, the first active layer 11 may be in a "Z" shape extending along the second direction DR2.

In an exemplary embodiment, as shown in FIG. 7B, the second active layer 21 may be in an "I" shape extending along the second direction DR2.

In an exemplary embodiment, as shown in FIG. 7B, there is an overlapping region between orthographic projections of the first active layer 11, the second active layer 21, and the third active layer 31 on a base substrate 10 and an orthographic projection of the first electrode plate 41 on the base substrate 10, so that the first electrode plate 41 serving as a shield layer may shield channel regions of the first transistor, the second transistor, and the third transistor so as to avoid an influence of light on the channels and influences of the channels on a display effect due to generation of a photogenerated leakage current.

In an exemplary embodiment, as shown in FIG. 7B, orthographic projections of the first active layer 11, the second active layer 21, and the third active layer 31 on the base substrate 10 and an orthographic projection of the second electrode plate 42 are on the base substrate 10 are disposed at intervals. That is, there is no overlapping region between the first active layer 11 and the second electrode plate 42, between the second active layer 21 and the second electrode plate 42, or between the third active layer 31 and the second electrode plate 42, which benefits a design of width-to-length ratios of channels of the first transistor T1, the second transistor T2, and the third transistor T3 according to relevant requirements.

In an exemplary embodiment, the second electrode plate 34 may be in a rectangular shape extending along the second direction DR2. For example, corners of the rectangular shape may be provided with chamfers. For example, an edge of the rectangular shape may be a broken line. Herein, no limitation is made thereto in embodiments of the present disclosure.

In an exemplary embodiment, as shown in FIG. 7B, the second electrode plate 42 serves as both an electrode plate of a first storage capacitor Cst1 and an electrode plate of a second storage capacitor Cst2. Among them, there is an overlapping region between an orthographic projection of the second electrode plate 42 on the base substrate 10 and an orthographic projection of the first electrode plate 41 on the base substrate 10, and the second electrode plate 42 is configured to form the first storage capacitor Cst1 with the first electrode plate 41. there is an overlapping region between the orthographic projection of the second electrode plate 42 on the base substrate 10 and an orthographic projection of a subsequently formed third electrode plate 43 on the base substrate 10, and the second electrode plate 42 is further configured to form the second storage capacitor Cst2 with the subsequently formed third electrode plate 43. Thus, by connecting the first storage capacitance Cst1 and the second storage capacitance Cst2 in parallel to form a storage capacitance C of a pixel drive circuit, an overall capacitance value of the storage capacitance C may be increased.

In an exemplary embodiment, as shown in FIG. 7B, there is a spacing 44 between second electrode plates 42 in the first sub-pixel P1 and the second sub-pixel P2, and the third active layer 31, and openings 45 are disposed in second electrode plates 42 of the third sub-pixel P3 and the fourth sub-pixel P4.

In an exemplary embodiment, a pattern of a semiconductor layer in the third sub-pixel P3 and a pattern of a semiconductor layer in the fourth sub-pixel P4 are mirror symmetrical with respect to a vertical axis. Or, a pattern of a semiconductor layer in the first sub-pixel P1 and a pattern of a semiconductor layer in the second sub-pixel P2 are mirror symmetrical with respect to a vertical axis.

In an exemplary embodiment, the semiconductor layer may be made of a metal oxide material. For example, the metal oxide material may include, but is not limited to: an oxide containing indium and tin, an oxide containing tungsten and indium, an oxide containing tungsten, indium, and zinc, an oxide containing titanium and indium, an oxide containing titanium, indium, and tin, an oxide containing indium and zinc, an oxide containing silicon, indium, and tin, or an oxide containing indium, gallium, and zinc, etc. For example, the semiconductor layer may be a single layer, a double layer, or a multi-layer, etc. Herein, no limitation is made thereto in embodiments of the present disclosure.

In an exemplary embodiment, the first insulation layer may be made of any one or more of Silicon Oxide (SiOx), Silicon Nitride (SiNx), and Silicon Oxynitride (SiON), and may be a single layer, a multi-layer, or a composite layer.

After this patterning process, the pattern of the semiconductor layer is formed in the pixel region 100, and the transparent region 200 includes the base substrate 10 and the first insulation layer 61 disposed on the base substrate 10.

(3) Forming a Second Conductive Layer.

In an exemplary embodiment, forming a second conductive layer may include: sequentially depositing a second insulation thin film and a second conductive thin film on the base substrate on which the above-mentioned structures are formed, patterning the second insulation thin film and the second conductive thin film through a patterning process, and forming a second insulation layer 62 and a second conductive layer disposed on the second insulation layer 62. The second insulation layer 62 has a same pattern as the second conductive layer. For example, the second insulation layer may be referred to as a Gate Insulation (GI) layer. For example, the second conductive layer may be referred to as a Gate metal (GT) layer.

In an exemplary embodiment, the second insulation layer may be made of any one or more of Silicon Oxide (SiOx), Silicon Nitride (SiNx), and Silicon Oxynitride (SiON), and may be a single layer, a multi-layer, or a composite layer.

In an exemplary embodiment, the second conductive layer may be made of a metal material. For example, the metal material may include, but is not limited to: any one or more of Argentum (Ag), Copper (Cu), Aluminum (Al), and Molybdenum (Mo), or an alloy material of the metals listed above, such as an Aluminum-Neodymium (AlNd) alloy or a Molybdenum-Niobium (MoNb) alloy. For example, the third conductive layer may be of a single-layer structure, or a multi-layer composite structure such as Mo/Cu/Mo.

In an exemplary embodiment, as shown in FIG. 7C, the second conductive layer may include a first scan signal line G1, a second scan signal line G2, a power supply connection line 52, and an auxiliary power supply line 53, and a first gate electrode 12, a second gate electrode 22, and a third gate electrode 32 of each sub-pixel.

In an exemplary embodiment, as shown in FIG. 7C, the first scan signal line G1 and the second scan signal line G2 may be of a strip structure extending along the first direction DR1. For example, the first scan signal line G1 and the second scan signal line G2 may be disposed across the first sub-pixel P1 to the fourth sub-pixel P4. For example, the first scan signal line G1 and the second scan signal line G2 may be disposed in parallel. A first scan signal line Gn is located on an upper side of a sub-pixel, and a second scan signal line Sn is located on a lower side of the sub-pixel.

In an exemplary embodiment, the first scan signal line G1 and the second scan signal line G2 may be disposed with an equal width.

In an exemplary embodiment, the first scan signal line G1 and the second scan signal line G2 may be mirror symmetrically disposed with respect to a vertical axis (e.g., a compensation signal line Sense formed subsequently).

In an exemplary embodiment, as shown in FIG. 7C, the first gate electrode 12 may be disposed in each sub-pixel as the gate electrode of the first transistor T1. In each sub-pixel, there is an overlapping region between an orthographic projection of the first gate electrode 12 on the base substrate and an orthographic projection of the first active layer 11 on the base substrate. For example, the first gate electrode 12 and the first scan signal line G1 may be connected with each other to be of an integral structure.

In an exemplary embodiment, as shown in FIG. 7C, the second gate electrode 22 may be disposed in each sub-pixel as the gate electrode of the second transistor T2. There is an overlapping region between an orthographic projection of the second gate electrode 22 on the base substrate and an orthographic projection of the second active layer 21 on the base substrate, and there is an overlapping region between the orthographic projection of the second gate electrode 22 on the base substrate and an orthographic projection of the second electrode plate 42 on the base substrate.

In an exemplary embodiment, as shown in FIG. 7C, the third gate electrode 32 may be disposed in each sub-pixel as the gate electrode of the third transistor T3. There is an overlapping region between an orthographic projection of the third gate electrode 32 on the base substrate and an orthographic projection of the third active layer 31 on the base substrate. For example, the third gate electrode 32 and the second scan signal line G2 may be connected with each other to be of an integral structure.

In an exemplary embodiment, as shown in FIG. 7C, the power supply connection line 52 may be of a strip structure with a main body portion extending along the second direction DR2, and the power supply connection line 52 may include a first connection strip extending along the second direction DR2 and a second connection strip extending along the first direction DR1. For example, the first connection strip of the power supply connection line 52 is configured to be connected with a first power supply line VDD formed subsequently through a via formed subsequently, and the second connection strip of the power supply connection line 52 is configured to be connected with a third connection electrode 23 formed subsequently through a via formed subsequently, in this way, on one hand, a double-layer trace may be formed to ensure reliability of power supply signal transmission and reduce a resistance of the first power supply line VDD, and on the other hand, the third connection electrode 23 may be connected with the first power supply line VDD.

In an exemplary embodiment, as shown in FIG. 7C, the auxiliary power supply line 53 may be of a strip structure extending along the second direction DR2. For example, the auxiliary power supply line 53 is configured to be connected with a second power supply line VSS formed subsequently to form a double-layer trace to ensure reliability of power supply signal transmission and to reduce a resistance of the second power supply line VSS. For example, a main body portion of the auxiliary power supply line 53 and the main body portion (i.e., the first connection strip) of the power supply connection line 52 may be mirror symmetrically disposed with respect to a vertical axis (e.g., a compensation signal line Sense formed subsequently). For example, the main body portion of the power supply connection line 52 and the main body portion of the auxiliary power supply line 53 may be disposed in parallel.

In an exemplary embodiment, a pattern of the second insulation layer 62 is the same as a pattern of the second conductive layer, i.e., the second insulation layer 62 is located below the second conductive layer and there is no second insulation layer 62 in a region other than the second conductive layer.

In an exemplary embodiment, first gate electrodes 12, second gate electrodes 22, and third gate electrodes 32 in the third sub-pixel P3 and the fourth sub-pixel P4 are mirror symmetrical with respect to a vertical axis, and first gate electrodes 12, second gate electrodes 22, and third gate electrodes 32 in the first sub-pixel P1 and the second sub-pixel P2 are mirror symmetrical with respect to a vertical axis.

In an exemplary embodiment, this process may further include a conductorization treatment. Herein, the conductorization treatment is to perform a plasma treatment by using a first gate electrode 12, a second gate electrode 22, and a third gate electrode 32 as shields after formation of the pattern of the second conductive layer. The semiconductor layer in a region shielded by the first gate electrode 12, the second gate electrode 22, and the third gate electrode 32 (i.e., a region where the semiconductor layer is overlapped with the first gate electrode 12, the second gate electrode 22, and the third gate electrode 32) serves as a channel region of a transistor, and the semiconductor layer in a region not shielded by a second metal layer is treated into a conductorized layer to form a conductorized second electrode plate 42 and a conductorized source-drain region (i.e., a first region of the transistor and a second region of the transistor located on two sides of the channel region of the transistor).

In an exemplary embodiment, as shown in FIGS. 7B to 7E, the first transistor T1 and the third transistor T2 are located on two sides of the second transistor T2 in the second direction, and each of extension directions of channel regions of the first transistor T1, the second transistor T2, and the third transistor T3 is the second direction. In FIG. 7B to FIG. 7E, an extension direction of a channel region of a transistor is indicated by a dash-dot line. For example, an extension direction of a channel region of the first transistor T1 may refer to an extension direction of a connection line between a first electrode of the first transistor T1 and a second electrode of the first transistor T2.

In an exemplary embodiment, as shown in FIGS. 7B to 7E, a storage capacitor C is located between the second transistor T1 and the third transistor T3, and an extension direction of the storage capacitor C is the second direction.

In an exemplary embodiment, as shown in FIGS. 7B to 7E, pixel drive circuits of four sub-pixels are arranged side by side along the first direction DR1.

After this patterning process, the pattern of the second conductive layer is formed in the pixel region 100, and the transparent region 200 includes the base substrate 10 and the first insulation layer 61 disposed on the base substrate 10.

(4) Forming a Third Insulation Layer.

In an exemplary embodiment, forming a third insulation layer may include: depositing a third insulation thin film on the base substrate on which the above-mentioned structures are formed, patterning the third insulation thin film through a patterning process, and forming a pattern of the third insulation layer 63 covering the above-mentioned structures. For example, the third insulation layer may be referred to as an Interlayer Dielectric (ILD) layer.

In an exemplary embodiment, as shown in FIG. 7D, a plurality of vias are disposed on the third insulation layer 63, and the plurality of vias may include a first via V1, a second via V2, a third via V3, a fourth via V4, a fifth via V5, a sixth via V6, a seventh via V7, an eighth via V8, a ninth via V9, a tenth via V10, an eleventh via V11, and a twelfth via V12.

In an exemplary embodiment, as shown in FIG. 7D, the first via V1 and the second via V2 may be disposed in each sub-pixel, for example, the first via V1 and the second via V2 may be disposed on two sides of a first gate electrode 12 of each sub-pixel. For each sub-pixel, an orthographic projection of the first via V1 on the base substrate is within a range of an orthographic projection of a first region of a first active layer 11 in the present sub-pixel on the base substrate, and an orthographic projection of the second via V2 on the base substrate is within a range of an orthographic projection of a second region of the first active layer 11 in the present sub-pixel on the base substrate. In an exemplary embodiment, the third insulation layer 63 within the first via V1 and the second via V2 is etched away to expose surfaces at both ends of the first active layer 11. The first via V1 is configured such that a first electrode of a subsequently formed first transistor T1 is simultaneously connected with the first region of the first active layer 11 and a subsequently formed data signal line Data through this via, and the second via V2 is configured such that a second electrode of the subsequently formed first transistor T1 is connected with the second region of the first active layer 11 through this via.

In an exemplary embodiment, as shown in FIG. 7D, the third via V3 and the fourth via V4 may be disposed in each sub-pixel, for example, the third via V3 and the fourth via V4 may be disposed on two sides of a second gate electrode 22 of each sub-pixel. For each sub-pixel, an orthographic projection of the third via V3 on the base substrate has an overlapping region with an orthographic projection of a first region of a second active layer 21 in the present sub-pixel on the base substrate, and has an overlapping region with an orthographic projection of the second connection strip of the power supply connection line 52 on the base substrate, and an orthographic projection of the fourth via V4 on the base substrate is within a range of an orthographic projection of a second region of the second active layer 21 in the present sub-pixel on the base substrate. In an exemplary embodiment, the third via V3 is a transfer via formed by two half holes, one half hole being formed on the second active layer 21 and the other half hole being formed on the second connection strip of the power supply connection line 52. The third insulation layer 63 within the two half holes is etched away, so that the transfer via formed by the two half holes exposes both a surface of the second active layer 21 and a surface of the second connection strip of the power supply connection line 52. The third insulation layer 63 within the fourth via V4 is etched away to expose the surface of the second active layer 21. The third via V3 is configured such that a first electrode of a subsequently formed second transistor T2 is simultaneously connected with the first region of the second active layer 21 and the second connection strip of the power supply connection line 52 through this via, so that the first electrode of the second transistor T2 is connected with a subsequently formed first power supply line VDD. The fourth via V4 is configured such that a second electrode of the subsequently formed second transistor T2 is connected with the second region of the second active layer 21 through this via.

In an exemplary embodiment, as shown in FIG. 7D, the fifth via V5 and the sixth via V6 may be disposed in each sub-pixel, for example, the fifth via V5 and the sixth via V6 may be disposed on two sides of a third gate electrode 32 of each sub-pixel. For each sub-pixel, an orthographic projection of the fifth via V5 on the base substrate is within ae range of an orthographic projection of a first region of a third active layer 31 in the present sub-pixel on the base substrate, and an orthographic projection of the sixth via V6 on the base substrate is within a range of an orthographic projection of a second region of the third active layer 31 in the present sub-pixel on the base substrate. In an exemplary embodiment, the third insulation layers 63 within the fifth via V5 and the sixth via V6 is etched away to expose surfaces of both ends of the third active layer 31. The fifth via V5 is configured such that a first electrode of a subsequently formed third transistor T3 is connected with the first region of the third active layer 31 through this via. The sixth via V6 is configured such that a second electrode of the subsequently formed third transistor T3 is connected with the second region of the third active layer 31 through this via.

In an exemplary embodiment, as shown in FIG. 7D, the seventh via V7 may be disposed in each sub-pixel. An orthographic projection of the seventh via V7 on the base substrate is within a range of an orthographic projection of the compensation connection line 51 on the base substrate. The first insulation layer 61 and the third insulation layer 63 within the seventh via V7 are etched away to expose a surface of the compensation connection line 51. The seventh via V7 is configured such that the first electrode of the subsequently formed third transistor T3 is connected with the compensation connection line 51 through this via so as to be connected with the compensation signal line Sense.

In an exemplary embodiment, as shown in FIG. 7D, any one of the eighth via V8 and the ninth via V9 may be disposed in each sub-pixel. The eighth via V8 is located at a position of a spacing 44 between the second electrode plate 42 and the third active layer 31, and the ninth via V9 is located at a position of an opening 45 in the second electrode plate 42. An orthographic projection of the eighth via V8 on the base substrate is within a range of an orthographic projection of the first electrode plate 41 on the base substrate and is not overlapped with an orthographic projection of the second electrode plate 42 on the base substrate. An orthographic projection of the ninth via V9 on the base substrate is within the range of the orthographic projection of the first electrode plate 41 on the base substrate and is not overlapped with the orthographic projection of the second electrode plate 42 on the base substrate. The first insulation layer 61 and the third insulation layer 63 within the eighth via V8 and the ninth via V9 are etched away to expose a surface of the first electrode plate 41. The eighth via V8 is configured such that a subsequently formed third electrode plate 43 is connected with the first electrode plate 41 through this via, and the ninth via V9 is configured such that the subsequently formed third electrode plate 43 is connected with the first electrode plate 41 through this via. For example, the eighth via V8 may be located in the first sub-pixel P1 and the second sub-pixel P2, and the ninth via V9 may be located in the third sub-pixel P3 and the fourth sub-pixel P4. For example, in a same sub-pixel, a plurality of ninth vias V9 are disposed at intervals.

In an exemplary embodiment, as shown in FIG. 7D, the tenth via V10 is a transfer via, and the transfer via may be composed of two half holes, one half hole is formed on the second gate electrode 22 and the other half hole is formed on the second electrode plate 42, and the third insulation layer 63 within the two half holes is etched away so that the transfer via composed of the two half holes simultaneously exposes surfaces of the second gate electrode 22 and the second electrode plate 42. The tenth via V10 is configured such that the second electrode of the subsequently formed first transistor T1 is simultaneously connected with the second gate electrode 22 and the second electrode plate 42 through this via.

In an exemplary embodiment, as shown in FIG. 7D, an orthographic projection of the eleventh via V11 on the base substrate is within a range of an orthographic projection of the first connection strip of the power supply connection line 52 on the base substrate. The third insulation layer 63 within the eleventh via V11 is etched away to expose a surface of the first connection strip of the power supply connection line 52. The eleventh via V11 is configured such that a first power supply line VDD formed subsequently is connected with the power supply connection line 52 through this via. For example, a plurality of eleventh vias V11 are disposed at intervals along the second direction DR2 to increase reliability of a connection between the first power supply line VDD and the power supply connection line 52.

In an exemplary embodiment, as shown in FIG. 7D, an orthographic projection of the twelfth via V12 on the base substrate is within a range of an orthographic projection of the auxiliary power supply line 53 on the base substrate. The third insulation layer 63 within the twelfth via V12 is etched away to expose a surface of the auxiliary power supply line 53. The twelfth via V12 is configured such that a second power supply line VSS formed subsequently is connected with the auxiliary power supply line 53 through this via. A plurality of twelfth vias V12 are disposed at intervals along the second direction DR2 to increase reliability of a connection between the second power supply line VSS and the auxiliary power supply line 53.

In an exemplary embodiment, the third insulation layer may be made of any one or more of Silicon Oxide (SiOx), Silicon Nitride (SiNx), and Silicon Oxynitride (SiON), and may be a single layer, a multi-layer, or a composite layer.

After this patterning processes, patterns of the plurality of vias are formed in the pixel region 100, and the transparent region 200 includes the first insulation layer 61 and the third insulation layer 63 stacked on the base substrate 10.

(5) Forming a Third Conductive Layer.

In an exemplary embodiment, forming a third conductive layer may include: depositing a third conductive thin film on the base substrate on which the aforementioned structures are formed, patterning the third conductive thin film through a patterning process, and forming a pattern of the third conductive layer on the third insulation layer 63. For example, the third conductive layer may be referred to as a Source-Drain metal (SD) layer.

In an exemplary embodiment, the third conductive layer may be made of a metal material. For example, the metal material may include, but is not limited to: any one or more of Argentum (Ag), Copper (Cu), Aluminum (Al), and Molybdenum (Mo), or an alloy material of the metals listed above, such as an Aluminum-Neodymium (AlNd) alloy or a Molybdenum-Niobium (MoNb) alloy. The third conductive layer may be of a single-layer structure, or a multi-layer composite structure such as Mo/Cu/Mo.

In an exemplary embodiment, as shown in FIG. 7E, the third conductive layer may include one first power supply line VDD, one second power supply line VSS, one compensation signal line Sense, and four data signal lines Data formed in each pixel unit, and may further include a first connection electrode 13, a second connection electrode 14, a third connection electrode 23, a fourth connection electrode 24, a fifth connection electrode 33, a sixth connection electrode 34, and a third electrode plate 43 formed in each sub-pixel.

In an exemplary embodiment, as shown in FIG. 7E, the first power supply line VDD extends along the second direction DR2. For each pixel unit, the first power supply line VDD is disposed on a side away from the transparent region 200. The first power supply line VDD is configured to be connected with the power supply connection line 52 through a plurality of eleventh vias V11, so that the first power supply line VDD is respectively connected with a third connection electrode 23 of each sub-pixel in the present pixel unit through the power supply connection line 52, and a double-layer trace is formed between the first gate electrode 12 and the third gate electrode 32, which ensures reliability of power supply signal transmission and reduces a resistance of the first power supply line VDD. The double-layer trace includes the power supply connection line 52 of the second metal layer and the first power supply line VDD of the third metal layer.

In this way, according to the exemplary embodiment of the present disclosure, it is achieved that a power supply signal is written into second transistors T2 of four sub-pixels respectively by disposing one first power supply line VDD and one power supply connection line 52. The first power supply line VDD extends along the second direction DR2, and the power supply connection line 52 includes a first connection strip extending along the second direction DR2 and a second connection strip extending along the first direction DR1, and the first power supply line VDD is connected with a second transistor T2 through the second connection strip.

In an exemplary embodiment, as shown in FIG. 7E, the second power supply line VSS extends along the second direction DR2. For each pixel unit, the second power supply line VSS is disposed on a side adjacent to the transparent region 200. The second power supply line VSS is configured to be connected with the auxiliary power supply line 53 through a plurality of twelfth vias V12, and a double-layer trace is formed between the first gate electrode 12 and the third gate electrode 32, the double-layer trace includes the auxiliary power supply line 53 of the second metal layer and the second power supply line VSS of the third metal layer. In this way, reliability of power supply signal transmission may be ensured, and a resistance of the second power supply line VSS may be reduced.

In an exemplary embodiment, as shown in FIG. 7E, in a direction parallel to the first scan signal line G1 and second scan signal line G2 (i.e., the first direction DR1), a width of the first power supply line VDD and a width of the second power supply line VSS are both greater than a width of the compensation signal line Sense, and the width of the first power supply line VDD and the width of the second power supply line VSS are both greater than a width of the data signal line Data. In this way, resistances of the first power supply line VDD and the second power supply line VSS may be reduced.

In an exemplary embodiment, as shown in FIG. 7E, for each pixel unit, the compensation signal line Sense is disposed between the first power supply line VDD and the second power supply line VSS, for example, the compensation signal line Sense may be disposed between the first sub-pixel P1 and the second sub-pixel P2.

In an exemplary embodiment, as shown in FIG. 7E, a main body portion of the compensation signal line Sense extends along the second direction DR2. For each pixel unit, the compensation signal line Sense may be provided with a first protrusion (for example, a fifth connection electrode 33 in the second sub-pixel P2), a first end of the first protrusion is connected with the compensation connection line 51 through a seventh via V7 within the present sub-pixel, so that the compensation signal line Sense is connected with the compensation connection line 51, a second end of the first protrusion is connected with a first region of a third active layer 31 in the present sub-pixel through a fifth via V5 within the present sub-pixel, and a third end of the first protrusion is connected with the compensation signal line Sense. In this way, on one hand, the first protrusion may be used as a first electrode of a third transistor T3 in the second sub-pixel P2 to achieve that a compensation signal provided by the compensation signal line Sense is written into the third transistor T3 in the second sub-pixel P2; on the other hand, the first protrusion may transmit the compensation signal provided by the compensation signal line Sense to the compensation connection line 51 connected across four sub-pixels, and since the compensation connection line 51 is connected with a fifth connection electrode 33 within another sub-pixel through a seventh via V7 within the another sub-pixel, the compensation connection line 51 may transmit the compensation signal to a third transistor T3 within the another sub-pixel, that is, the compensation signal line Sense may write the compensation signal into the third transistor T3 within the another sub-pixel through the compensation connection line 51.

In this way, according to the exemplary embodiment of the present disclosure, it may be achieved that a compensation signal is written to third transistors T3 of four sub-pixels in a pixel unit, respectively, by disposing a compensation signal line Sense with a main body portion extending along the second direction DR2 and a compensation connection line 51 extending along the first direction DR1. Among them, as shown in FIG. 7E, the compensation signal line Sense is directly connected with the third transistor T3 in the second sub-pixel P2, and the compensation signal line Sense is connected with third transistors T3 within other sub-pixels through the compensation connection line 51, respectively. According to the exemplary embodiment of the present disclosure, by disposing a compensation signal line in a middle portion of a pixel region 100 of each pixel unit to provide a compensation signal to four sub-pixels, it may be ensured that Resistor-Capacitor (RC) delay is substantially the same before the compensation signal is written into a transistor, which ensures display uniformity.

In an exemplary embodiment, as shown in FIG. 7E, the data signal line Data may be disposed in each sub-pixel. A main body portion of the data signal line D extends along the second direction DR2. For each sub-pixel, the data signal line Data may be provided with a second protrusion (i.e., a first connection electrode 13), one end of the second protrusion is connected with the data signal line Data, and the other end of the second protrusion is connected with a first region of a first active layer 11 through a first via V1 within the present sub-pixel, in this way, the second protrusion may be used as a first electrode of a first transistor T1, to achieve that a data signal is written into the first transistor T1.

In an exemplary embodiment, as shown in FIG. 7E, for each pixel unit, two data signal lines Data may be disposed between the second power supply line VSS and the compensation signal line Sense, and the other two data signal lines Data may be disposed between the first power supply line VDD and the compensation signal line Sense.

In this way, according to the exemplary embodiment of the present disclosure, it may be achieved that data signals are written into first transistors T1 of four sub-pixels respectively by disposing four data signal lines Data with main body portions extending along the second direction DR2.

In an exemplary embodiment, as shown in FIG. 7E, main body portions of the first power supply line VDD, the second power supply line VSS, the compensation signal line Sense, and the data signal line Data may be disposed in parallel.

In an exemplary embodiment, as shown in FIG. 7E, a first connection electrode 13 may be respectively disposed in each sub-pixel, and may serve as a first electrode of a first transistor T1. For each sub-pixel, the first connection electrode 13 and a data signal line Data are connected with each other to be of an integral structure, so that each data signal line Data is connected with a first connection electrode 13 of a sub-pixel where the data signal line Data is located, herein, one end of the first connection electrode 13 is directly connected with the data signal line Data, and the other end of the first connection electrode 13 is connected with a first region of a first active layer 11 through a first via V1 within the present sub-pixel. For example, the first connection electrode 13 may be of a strip structure extending along the first direction DR1.

In an exemplary embodiment, as shown in FIG. 7E, a second connection electrode 14 may be respectively disposed in each sub-pixel, and may serve as a second electrode of a first transistor T1. For each sub-pixel, one end of the second connection electrode 14 is connected with a second region of a first active layer 11 through a second via V2, and the other end of the second connection electrode 14 is connected with a second gate electrode 22 and a second electrode plate 42 simultaneously through a tenth via V10, so that it may be achieved that the second connection electrode 14, the second gate electrode 22, and the second electrode plate 42 have a same potential. For example, the second connection electrode 14 may be of a strip structure extending along the second direction DR2.

In an exemplary embodiment, as shown in FIG. 7E, a third connection electrodes 23 may be respectively disposed in each sub-pixel, and may serve as a first electrode of a second transistor T2. For each sub-pixel, the third connection electrode 23 is simultaneously connected with a second connection strip of a power supply connection line 52 and a first region of a second active layer 21 through a third via V3. In this way, since the power supply connection line 52 is connected with a first power supply line VDD, a connection between the third connection electrode 23 and the first power supply line VDD may be achieved, and the third connection electrode 23 may write a power supply signal into the second transistor T2. For example, the third connection electrode 23 may be of a strip structure extending along the second direction DR2.

In an exemplary embodiment, as shown in FIG. 7E, a fourth connection electrode 24 may be respectively disposed in each sub-pixel, and may serve as a second electrode of a second transistor T2. For each sub-pixel, the fourth connection electrode 24 is connected with a second region of a second active layer 21 through a fourth via V4.

In an exemplary embodiment, as shown in FIG. 7E, a fifth connection electrode 33 may be respectively disposed in each sub-pixel, and may serve as a first electrode of a third transistor T3. For example, a first end of a fifth connection electrode 33 in the second sub-pixel P2 is connected with the compensation connection line 51 through a seventh via V7 in the present sub-pixel so that the compensation signal line Sense is connected with the compensation connection line 51, a second end of the fifth connection electrode 33 in the second sub-pixel P2 is connected with a first region of a third active layer 31 in the present sub-pixel through a fifth via V5 in the present sub-pixel, and a third end of the fifth connection electrode 33 in the second sub-pixel P2 is connected with the compensation signal line Sense, in this way, the fifth connection electrode 33 in the second sub-pixel P2 may be used as a first electrode of a third transistor T3 in the second sub-pixel P2, and it is achieved that a compensation signal provided by the compensation signal line Sense is written into the third transistor T3 in the second sub-pixel P2 and transmitted to the compensation connection line 51 connected across four sub-pixels. A fifth connection electrode 33 in another sub-pixel (e.g., the first sub-pixel P1, the third sub-pixel P3, and the fourth sub-pixel P4) is connected with a first region of a third active layer 31 in the present sub-pixel through a fifth via V5 in the present sub-pixel, and is simultaneously connected with the compensation connection line 51 through a seventh via V7 in the present sub-pixel. In this way, since the compensation connection line 51 is connected with the compensation signal line Sense, a connection between the fifth connection electrodes 33 in the another sub-pixel and the compensation signal line Sense may be achieved, that is, it may be achieved that the compensation connection line 51 transmits the compensation signal to a third transistor T3 within the another sub-pixel.

In an exemplary embodiment, as shown in FIG. 7E, a sixth connection electrode 34 may be respectively disposed in each sub-pixel, and may serve as a second electrode of a third transistor T3. For each sub-pixel, the sixth connection electrode 34 is connected with a second region of a third active layer 31 through a sixth via V6.

In an exemplary embodiment, as shown in FIG. 7E, there is an overlapping region between an orthographic projection of a third electrode plate 43 on the base substrate 10 and an orthographic projection of a second electrode plate 42 on the base substrate 10, and the third electrode plate 43 and the second electrode plate 42 form a second storage capacitor Cst2.

In an exemplary embodiment, as shown in FIG. 7E, the fourth connection electrode 24, the sixth connection electrode 34, and the third electrode plate 43 may be connected with each other to be of an integral structure, in this way, since the third electrode plate 43 is connected with the first electrode plate 41 through one of an eighth via V8 and a ninth via V9, the fourth connection electrode 24 is simultaneously connected with the first electrode plate 41 and the third electrode plate 43, the sixth connection electrode 34 is simultaneously connected with the first electrode plate 41 and the third electrode plate 43, and it may be achieved that the fourth connection electrode 24, the sixth connection electrode 34, the first electrode plate 41, and the third electrode plate 43 have a same potential.

In an exemplary embodiment, as shown in FIG. 7E, first connection electrodes 13, second connection electrodes 14, third connection electrodes 23, fourth connection electrodes 24, fifth connection electrodes 33, sixth connection electrodes 34, and third electrode plates 43 in the first sub-pixel P1 and the second sub-pixel P2 are mirror symmetrical with respect to a vertical axis (e.g., the compensation signal line Sense), and first connection electrodes 13, second connection electrodes 14, third connection electrodes 23, fourth connection electrodes 24, fifth connection electrodes 33, sixth connection electrodes 34, and third electrode plates 43 in the third sub-pixel P3 and the fourth sub-pixel P4 are mirror symmetrical with respect to a vertical axis (e.g., the compensation signal line Sense).

After this patterning process, a pattern of the third conductive layer is formed in the pixel region 100, and the transparent region 200 includes the first insulation layer 61 and the third insulation layer 63 stacked on the base substrate 10.

(6) Forming a Fourth Insulation Layer and a Fifth Insulation Layer.

In an exemplary embodiment, a fourth insulation thin film and a fifth insulation thin film are deposited on the base substrate on which the above-mentioned structures are formed, and the fourth insulation thin film and the fifth insulation thin film are patterned through a patterning process to form a fourth insulation layer 64 covering the above-mentioned structures and a fifth insulation layer 65 disposed on the fourth insulation layer 64. For example, a Passivation (PVX) layer. For example, the fifth insulation layer may be referred to as a Planarization (PLN) layer or a resin layer.

In an exemplary embodiment, as shown in FIG. 7F, the fourth insulation layer 64 and the fifth insulation layer 65 are provided with a plurality of vias, and the plurality of vias may include a thirteenth via V13 and a fourteenth via V14 located in the pixel region 100.

In an exemplary embodiment, as shown in FIG. 7F, any one of the thirteenth via V13 and the fourteenth via V14 may be disposed in each sub-pixel. For example, in the first sub-pixel P1 and the second sub-pixel P2, the thirteenth via V13 is located at a position of a spacing 44 between the second electrode plate 42 and the third active layer 31. For another example, in the third sub-pixel P3 and the fourth sub-pixel P4, the fourteenth via V14 is located at a position of an opening 45 in the second electrode plate 42.

In an exemplary embodiment, as shown in FIG. 7F, an orthographic projection of the thirteenth via V13 on the base substrate is within a range of an orthographic projection of the third electrode plate 43 on the base substrate and is not overlapped with an orthographic projection of the second electrode plate 42 on the base substrate. An orthographic projection of the fourteenth via V14 on the base substrate is within a range of an orthographic projection of the third electrode plate 43 on the base substrate and is not overlapped with an orthographic projection of the second electrode plate 42 on the base substrate. The fourth insulation layer 64 and the fifth insulation layer 65 within the thirteenth via V13 and the fourteenth via V14 are etched away to expose a surface of the third electrode plate 43. The thirteenth via V13 and the fourteenth via V14 are configured such that a first anode layer 701 formed subsequently is connected with the third electrode plate 43 through the via. In this way, since the third electrode plate 43 is connected with the first electrode plate 41, the fourth connection electrode 24, and the sixth connection electrode 34 at the same time, it may be achieved that the first anode layer 701 is connected with the first electrode plate 41, the second transistor T2, and the third transistor T3.

In an exemplary embodiment, the first insulation layer, the second insulation layer, the third insulation layer, and the fourth insulation layer may be made of any one or more of Silicon Oxide (SiOx), Silicon Nitride (SiNx), and Silicon Oxynitride (SiON), and may be a single layer, a multi-layer, or a composite layer.

In an exemplary embodiment, the fifth insulation layer may be made of an organic material such as resin.

After this patterning process, the transparent region 200 includes the first insulation layer 61, the third insulation layer 63, and the fourth insulation layer 64 stacked on the base substrate 10.

(7) Forming a Fourth Conductive Layer.

In an exemplary embodiment, a fourth conductive thin film is deposited on the base substrate on which the above-mentioned structures are formed, and the fourth conductive thin film is patterned through a patterning process to form a pattern of the fourth conductive layer.

In an exemplary embodiment, the fourth conductive layer may be formed of a transparent conductive material. For example, the fourth conductive layer may be formed of Indium Tin Oxide (ITO) or Indium Zinc Oxide (IZO). Thus, not only can the formed first anode layer have good light transmittance, but also the first anode layer can achieve good electrical conductivity. For example, taking the fourth conductive layer formed of ITO as an example, the fourth conductive layer may be referred to as an ITO1 layer.

In an exemplary embodiment, as shown in FIG. 7G, the fourth conductive layer may include a first anode layer 701 located in each pixel unit. The first anode layer 701 in each pixel unit may include a first anode 701R, a second anode 701G, a third anode 701B, and a fourth anode 701W. Herein, the first anode 701R, the second anode 701G, and the third anode 701B are formed in the pixel region 100. The fourth anode 701W is formed in a pixel region 100 in the present pixel unit and a transparent region 200 in an adjacent pixel unit.

In an exemplary embodiment, as shown in FIGS. 3 and 7G, the first anode 701R may be disposed in a first sub-region 101-1 in the pixel region 100 as a first anode layer of the first sub-pixel P1. For example, the first anode 701R is configured to be connected with a third electrode plate 43 through a thirteenth via V13 in the first sub-pixel P1. In this way, since the third electrode plate 43 in the first sub-pixel P1, the second electrode of the second transistor T2, and the second electrode of the third transistor T3 are connected with each other to be of an integral structure, it may be achieved that the first anode 701R is connected with the storage capacitor C, the second electrode of the second transistor T2, and the second electrode of the third transistor T3.

In an exemplary embodiment, as shown in FIGS. 3 and 7G, the second anode 701G may serve as a first anode layer of the second sub-pixel P2, and is disposed in a second sub-region 101-2 in the pixel region 100. For example, the second anode 701G is configured to be connected with a third electrode plate 43 through a thirteenth via V13 in the second sub-pixel P2. In this way, since the third electrode plate 43 in the second sub-pixel P2, the second electrode of the second transistor T2, and the second electrode of the third transistor T3 are connected with each other to be of an integral structure, it may be achieved that the second anode 701G is connected with the storage capacitor C, the second electrode of the second transistor T2, and the second electrode of the third transistor T3.

In an exemplary embodiment, as shown in FIGS. 3 and 7G, the third anode 701B may be disposed in a third sub-region 102-1 in the pixel region 100 as a first anode layer of the third sub-pixel P3. For example, the third anode 701B is configured to be connected with a third electrode plate 43 through a fourteenth via V14 in the third sub-pixel P3. In this way, since the third electrode plate 43 in the third sub-pixel P3, the second electrode of the second transistor T2, and the second electrode of the third transistor T3 are connected with each other to be of an integral structure, it may be achieved that the third anode 701B is connected with the storage capacitor C, the second electrode of the second transistor T2, and the second electrode of the third transistor T3.

In an exemplary embodiment, as shown in FIGS. 3 and 7G, the fourth anode 701W may include a main body portion located in the pixel region 100 and an extension portion located in the transparent region 200, and may serve as a first anode layer of the fourth sub-pixel P4 (i.e., the white sub-pixel). For example, the fourth anode 701W is configured to be connected with a third electrode plate 43 through a fourteenth via V14 in the fourth sub-pixel P4. In this way, since the third electrode plate 43 in the fourth sub-pixel P4, the second electrode of the second transistor T2, and the second electrode of the third transistor T3 are connected with each other to be of an integral structure, it may be achieved that the fourth anode 701W is connected with the storage capacitor C, the second electrode of the second transistor T2, and the second electrode of the third transistor T3.

In an exemplary embodiment, as shown in FIGS. 3 and 7G, the main body portion and the extension portion may be located in two adjacent pixel units. For example, for a first anode layer of a fourth sub-pixel P4 of a first pixel unit, the main body part is located in a fourth sub-region 102-2 in the first pixel unit, and the extension part is located in a first transparent sub-region 201 in a second pixel unit. In this way, it may be achieved that a white sub-pixel region in the first pixel unit is externally expanded to a transparent region in the second pixel unit, and an aperture ratio may be improved.

In an exemplary embodiment, as shown in FIG. 7G, the first anode 701R, the second anode 701G, and the third anode 701B may be rectangular. The fourth anode 701W may have an "L" shape.

After this patterning process, the transparent region 200 includes the first insulation layer 61, the third insulation layer 63, and the fourth insulation layer 64 stacked on the base substrate 10, and an extension portion in the first anode layer of the fourth sub-pixel P4 (i.e., the white sub-pixel).
(8) Forming a Fifth Conductive Layer.

In an exemplary embodiment, a fifth conductive thin film is deposited on the base substrate on which the above-mentioned structures are formed, and the fifth conductive thin film is patterned through a patterning process to form a pattern of the fifth conductive layer.

In an exemplary embodiment, the fifth conductive layer may be formed of a metal material or may be formed of a metal material and a transparent conductive material. For example, the metal material may include, but is not limited to, any one or more of Argentum (Ag), aluminum (Al), and molybdenum (Mo). For example, the transparent conductive material may include, but is not limited to, Indium Tin Oxide (ITO) or Indium Zinc Oxide (IZO). For example, the fifth conductive layer may be a single-layer structure or a multi-layer composite structure. For example, the fifth conductive layer may be a laminated structure (e.g., Al/ITO) formed of Aluminum (Al) and Indium Tin Oxide (ITO), or may be a laminated structure (e.g., Mo/ITO) formed of molybdenum (Mo) and Indium Tin Oxide (ITO), etc., in this way, a formed second anode layer has good conductivity. For example, the fifth conductive layer may be referred to as an ITO2 layer. Herein, no limitation is made thereto in embodiments of the present disclosure.

In an exemplary embodiment, as shown in FIG. 7H, the fifth conductive layer may include a second anode layer 702 located in each pixel unit. The second anode layer 702 in each pixel unit may include a fifth anode 702R, a sixth anode 702G, a seventh anode 702B, and an eighth anode 702W located in the pixel region 100.

In an exemplary embodiment, an orthographic projection of the fifth anode 702R on the base substrate is overlapped with an orthographic projection of the first anode 701R on the base substrate, and the fifth anode 702R is connected with the first anode 701R. An orthographic projection of the sixth anode 702G on the base substrate is overlapped with an orthographic projection of the second anode 701G on the base substrate, and the sixth anode 702G is connected with the second anode 701G. An orthographic projection of the seventh anode 702B on the base substrate is overlapped with an orthographic projection of the third anode 701B on the base substrate, and the seventh anode 702B is connected with the third anode 701B. An orthographic projection of the eighth anode 702W on the base substrate is overlapped with an orthographic projection of a main body portion of the fourth anode 701W on the base substrate, and the eighth anode 702W is connected with the main body portion of the fourth anode 701W.

In an exemplary embodiment, as shown in FIG. 7H, the fifth anode 702R, the sixth anode 702G, the seventh anode 702B, and the eighth anode 702W may be rectangular. An opening is disposed on the fifth anode 702R.

After this patterning process, the transparent region 200 includes the first insulation layer 61, the third insulation layer 63, and the fourth insulation layer 64 stacked on the base substrate 10, and an extension portion in the first anode layer of the fourth sub-pixel P4 (i.e., the white sub-pixel).
(9) Forming a Pixel Definition Layer (PDL).

In an exemplary embodiment, forming a pixel definition layer may include: as shown in FIGS. 17A and 17B, coating a pixel definition thin film on the base substrate on which the above-mentioned structures are formed, patterning the pixel definition thin film using a patterning process to form a pixel definition layer 71. Herein, the pixel definition layer 71 may include at least a pixel opening located in each sub-pixel.

In an exemplary embodiment, as shown in FIG. 7I, the pixel definition layer 71 may include a first pixel opening 71R located in the first sub-pixel P1 and exposing the fifth anode 702R, a second pixel opening 71G located in the second sub-pixel P2 and exposing the sixth anode 702G, a third pixel opening 71B located in the third sub-pixel P3 and exposing the seventh anode 702B, and a fourth pixel opening 71W located in the fourth sub-pixel P4 and exposing the eighth anode 702W and the fourth anode 701W.

In an exemplary embodiment, shapes and areas of pixel openings of different sub-pixels may be different. In the exemplary embodiment of the present disclosure, four sub-pixels are designed with different aperture ratios, which may adapt to transmittances of different sub-pixels, so that light emitting devices of the four sub-pixels may emit same brightness at different currents, service life of the light emitting devices of the four sub-pixels is optimized to a maximum extent, and thereby ensuring service life of a product.

In an exemplary embodiment, the pixel definition layer may be made of a material such as Polyimide (PI), acrylic, or Polyethylene Terephthalate (PET). Herein, no limitation is made thereto in embodiments of the present disclosure.

In an exemplary embodiment, after preparing the pixel definition layer, the preparation process of the display substrate may further include forming an organic emitting layer, wherein the organic emitting layer is connected with the second anode layer through a pixel opening; and forming a cathode on the organic emitting layer, wherein the cathode is connected with the organic emitting layer.

In an exemplary embodiment, the organic emitting layer may be formed using an evaporation or inkjet printing process. For example, the organic emitting layer may be formed by evaporation using a Fine Metal Mask (FMM), or by evaporation using an Open Mask, etc.

In an exemplary embodiment, the cathode may be a common electrode, that is, a plurality of light emitting devices may share a cathode of a whole-surface.

In an exemplary embodiment, the cathode may be made of any one or more of Magnesium (Mg), Argentum (Ag), Aluminum (Al), Copper (Cu), and Lithium (Li), or an alloy made of any one or more of the above metals.

In an exemplary embodiment, the preparation process of the display substrate may further include: forming an encapsulation layer on a basis of forming the above-mentioned patterns, and the encapsulation layer is formed in the pixel region 100 and the transparent region 200. The encapsulation layer of the pixel region 100 includes a first encapsulation layer of an inorganic material, a second encapsulation layer of an organic material, and a third encapsulation layer of an inorganic material. The first encapsulation layer is disposed on the cathode, the second encapsulation layer is disposed on the first encapsulation layer, and the third encapsulation layer is disposed on the second encapsulation layer, thereby forming an inorganic material/organic material/inorganic material stacked structure. The encapsulation layer of the transparent region 200 includes the first encapsulation layer of the inorganic material and the third encapsulation layer of the inorganic material. The first encapsulation layer is disposed on the cathode and the third encapsulation layer is disposed on the first encapsulation layer, thereby forming an inorganic material/inorganic material stacked structure.

As shown in FIG. 3 and FIG. 7A to FIG. 7J, a display substrate according to an embodiment of the present disclosure may include: a base substrate 10; a first conductive layer disposed on the base substrate 10, wherein the first conductive layer may include a first electrode plate 41 and a compensation connection line 51; a first insulation layer 61 covering the first conductive layer; a semiconductor layer disposed on the first insulation layer 61, wherein the semiconductor layer may include a first active layer 11, a second active layer 21, a third active layer 31, and a second electrode plate 42, there is an overlapping region between an orthographic projection of the second electrode plate 42 on the base substrate 10 and an orthographic projection of the first electrode plate 41 on the base substrate 10, and the second electrode plate 42 and the first electrode plate 41 form a first storage capacitor Cst1; a second insulation layer 62 covering the semiconductor layer; a second conductive layer disposed on the second insulation layer 62, wherein the second conductive layer may include a first scan signal line G1, a second scan signal line G2, a power supply connection line 52, an auxiliary power supply line 53, a first gate electrode 12, a second gate electrode 22, and a third gate electrode 32, the first gate electrode 12 and the first scan signal line G1 are connected with each other to be of an integral structure, and the third gate electrode 32 and the second scan signal line G2 are connected with each other to be of an integral structure; a third insulation layer 63 covering the second conductive layer, wherein the third insulation layer 63 is provided with a plurality of vias; a third conductive layer disposed on the third insulation layer 63, wherein the third conductive layer may include a first power supply line VDD, a second power supply line VSS, a compensation signal line Sense, a data signal line Data, a first connection electrode 13, a second connection electrode 14, a third connection electrode 23, a fourth connection electrode 24, a fifth connection electrode 33, a sixth connection electrode 34, and a third electrode plate 43, the first connection electrode 13 and the data signal line Data are connected with each other to be of an integral structure, the fourth connection electrode 24, the sixth connection electrode 34, and the third electrode plate 43 are connected with each other to be of an integral structure, there is an overlapping region between an orthographic projection of the third electrode plate 43 on the base substrate 10 and an orthographic projection of the second electrode plate 42 on the base substrate 10, and the second electrode plate 42 and the third electrode plate 43 form a second storage capacitor Cst2; a fourth insulation layer 64 and a fifth insulation layer 65 covering the third conductive layer, wherein the fourth insulation layer 64 and the fifth insulation layer 65 are provided with a plurality of vias; a fourth conductive layer disposed on the fourth insulation layer 64 and the fifth insulation layer 65, wherein the fourth conductive layer may include a first anode layer 701, the first anode layer 701 may include a first anode 701R, a second anode 701G, and a third anode 701B located in a pixel region 100, and a fourth anode 701W (i.e., a first anode layer of a white sub-pixel) located in the pixel region 100 and a transparent region 200; a fifth conductive layer disposed on the fourth conductive layer, wherein the fifth conductive layer may include a second anode layer 702, the second anode layer 702 may include a fifth anode 702R, a sixth anode 702G, a seventh anode 702B, and an eighth anode 702W located in the pixel region 100; a pixel definition layer 71 disposed on the fifth insulation layer 65, wherein the pixel definition layer 71 is provided with a pixel opening that exposes the second anode layer 702; an organic emitting layer disposed within the pixel opening, wherein the organic emitting layer is connected with the second anode layer 702; a cathode disposed on the organic emitting layer; and an encapsulation layer covering the above structure.

In an exemplary embodiment, as shown in FIG. 7J, in a direction perpendicular to a plane of the display substrate (i.e., a third direction DR3), a first transparent sub-region 201 in a transparent region 200 of a pixel unit may include a base substrate 10, and a first insulation layer 61, a third insulation layer 63, a fourth insulation layer 64, and a first anode layer 701 sequentially stacked on the base substrate 10. A second transparent sub-region 202 in the transparent region 200 of the pixel unit may include the base substrate 10, and the first insulation layer 61, the third insulation layer 63, and the fourth insulation layer 64 sequentially stacked on the base substrate 10.

As may be seen from the above, in the display substrate according to the exemplary embodiment of the present disclosure, by providing a design in which a first anode layer of a white sub-pixel in a present pixel unit is externally expanded to a transparent region in an adjacent pixel unit, an aperture ratio may be improved.

Figure 8A:
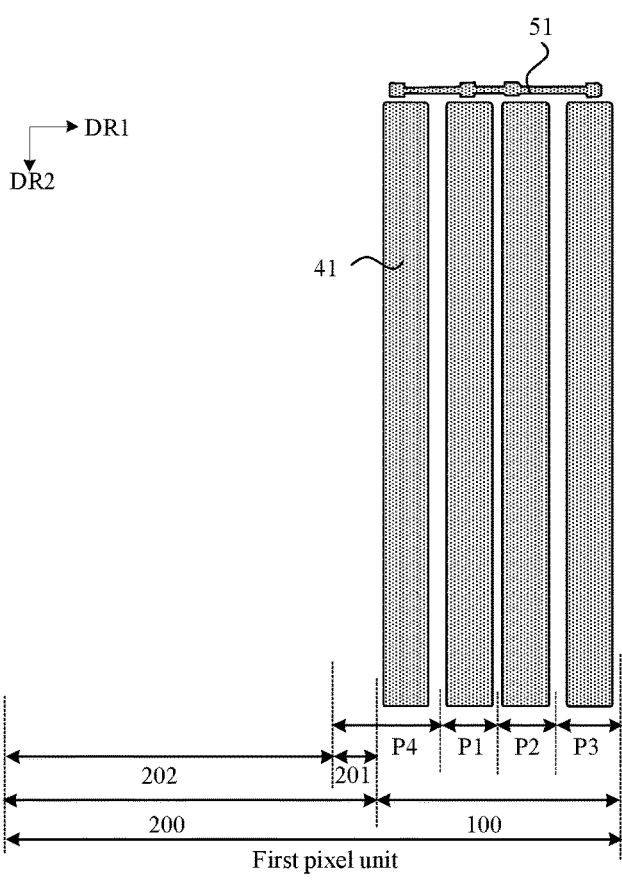
FIG. 8A is a schematic diagram after a first conductive layer in the display substrate shown in FIG. 4 is formed.
Figure 8B:
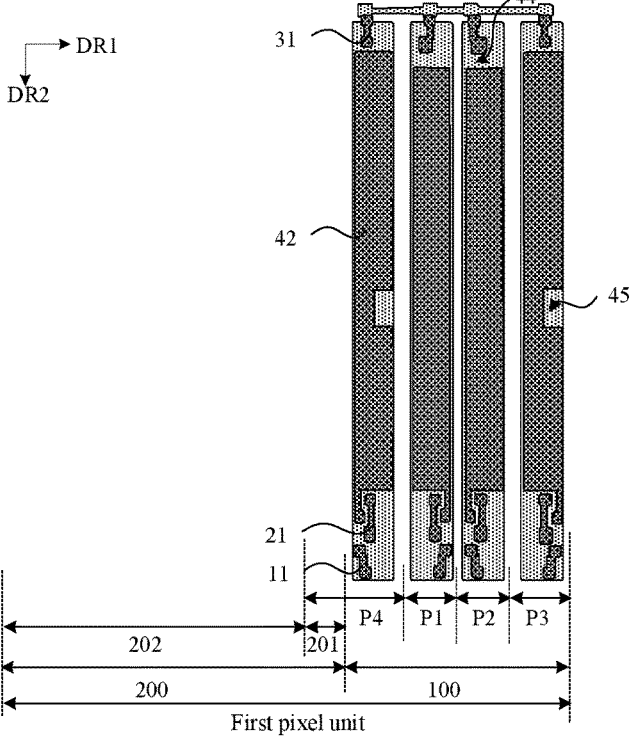
FIG. 8B is a schematic diagram after a semiconductor layer in the display substrate shown in FIG. 4 is formed.
Figure 8C:
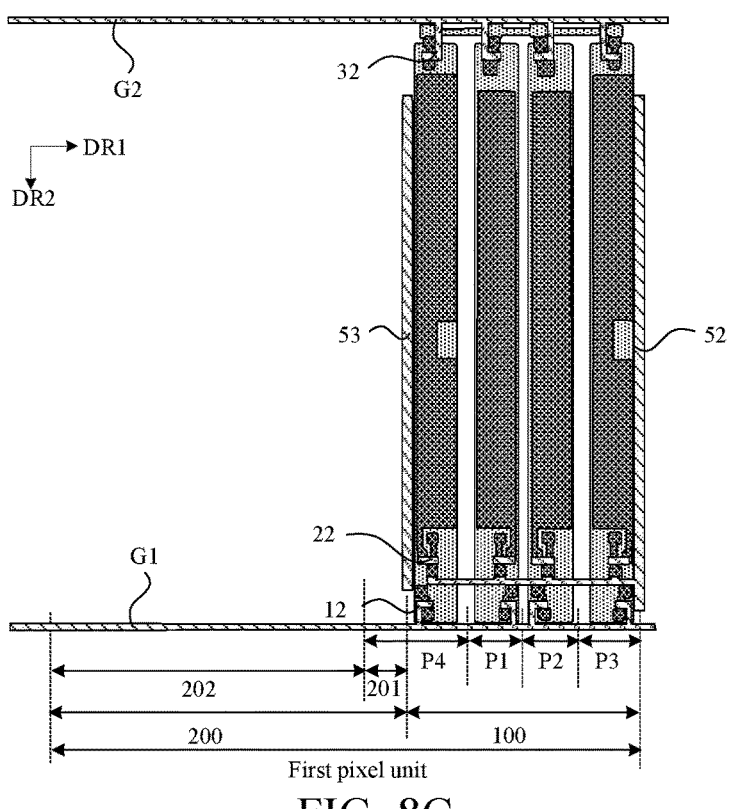
FIG. 8C is a schematic diagram after a second conductive layer in the display substrate shown in FIG. 4 is formed.
Figure 8D:
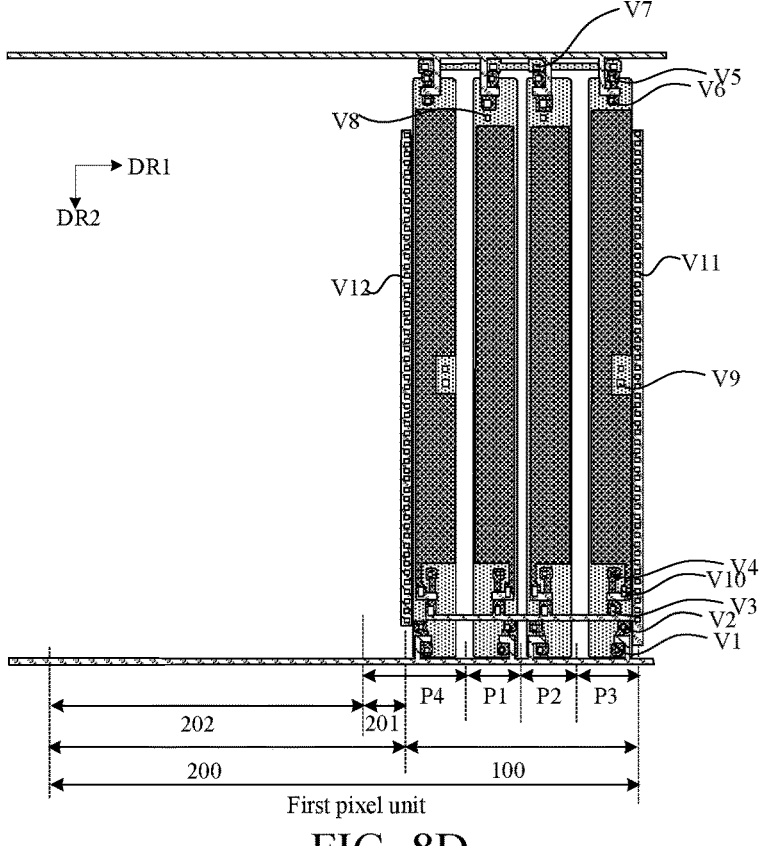
FIG. 8D is a schematic diagram after a third insulation layer in the display substrate shown in FIG. 4 is formed.
Figure 8E:
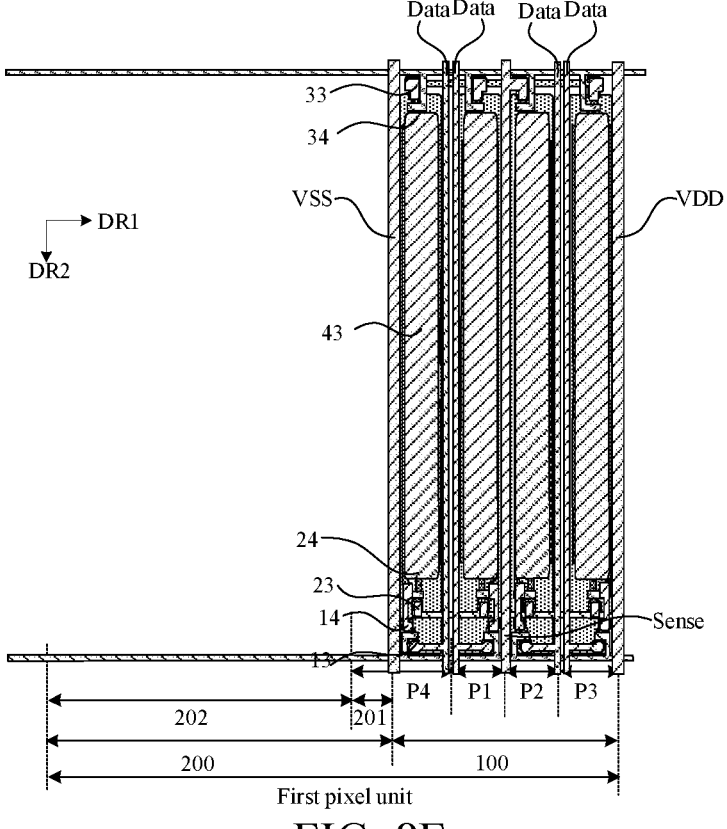
FIG. 8E is a schematic diagram after a third conductive layer in the display substrate shown in FIG. 4 is formed.
Figure 8F:
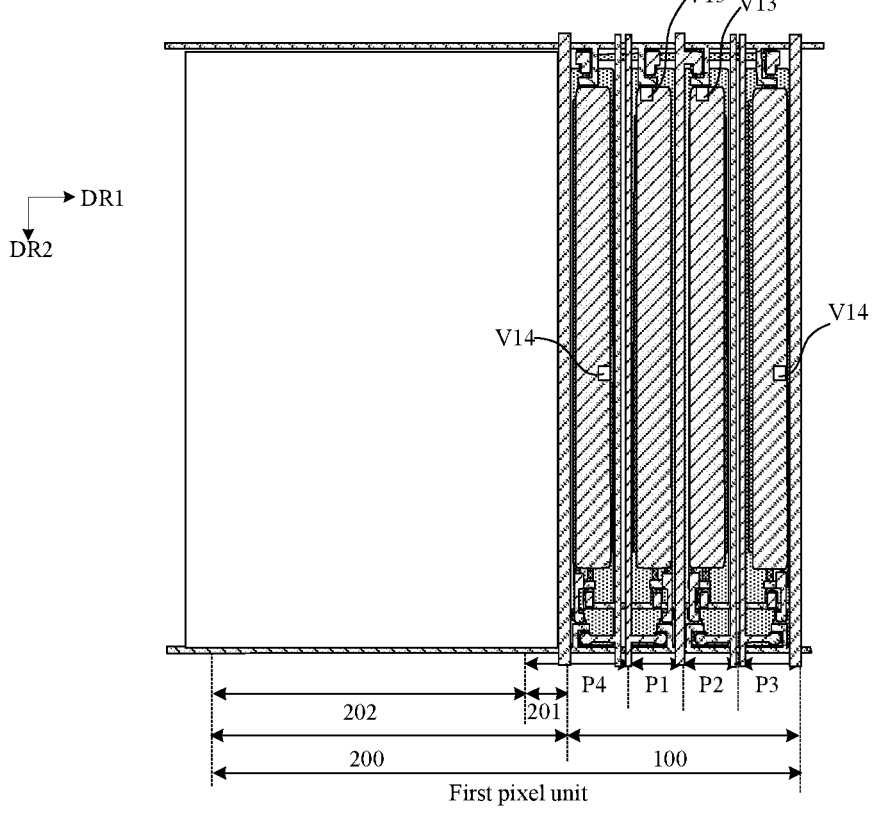
FIG. 8F is a schematic diagram after a fifth insulation layer in the display substrate shown in FIG. 4 is formed.
Figure 8G:
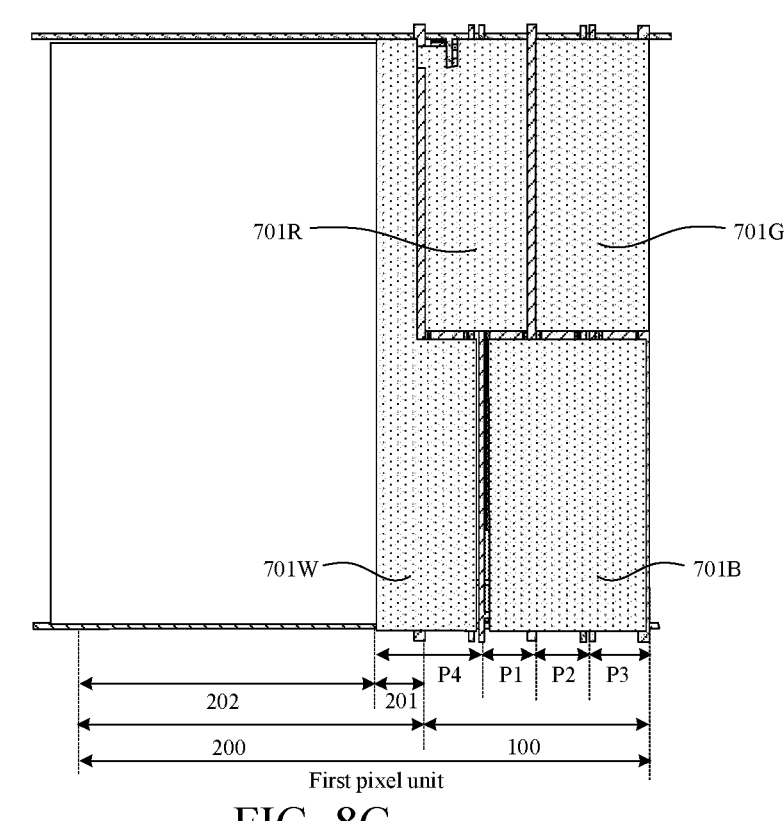
FIG. 8G is a schematic diagram after a fourth conductive layer in the display substrate shown in FIG. 4 is formed.
Figure 8H:
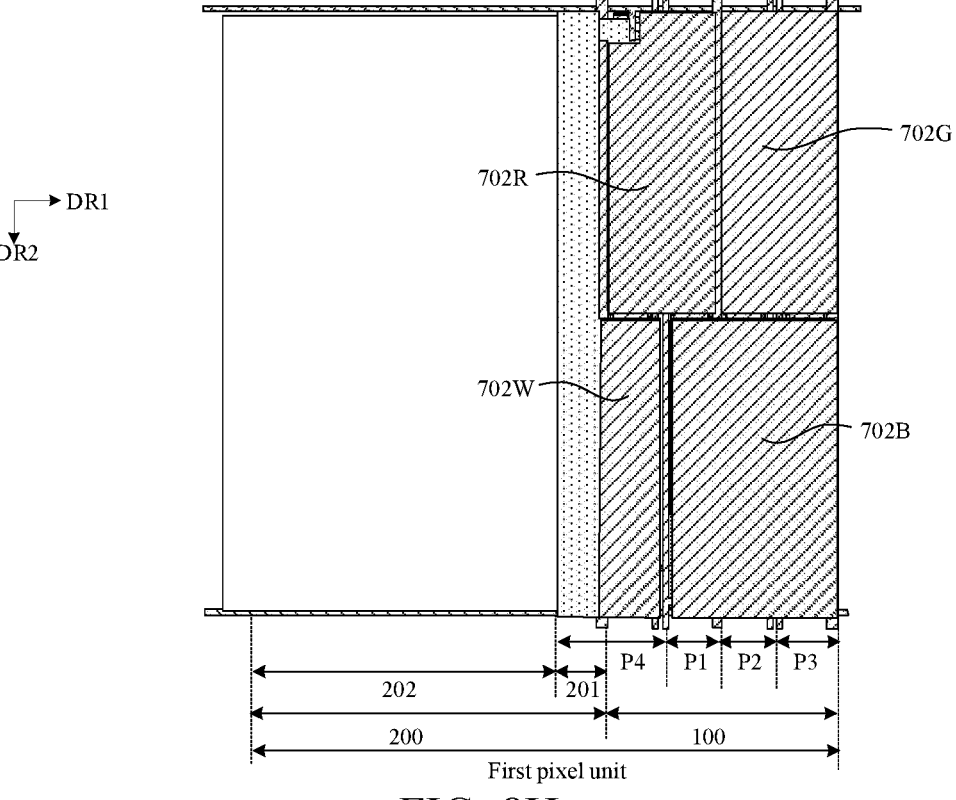
FIG. 8H is a schematic diagram after a fifth conductive layer in the display substrate shown in FIG. 4 is formed.
Figures 8I, 8J:
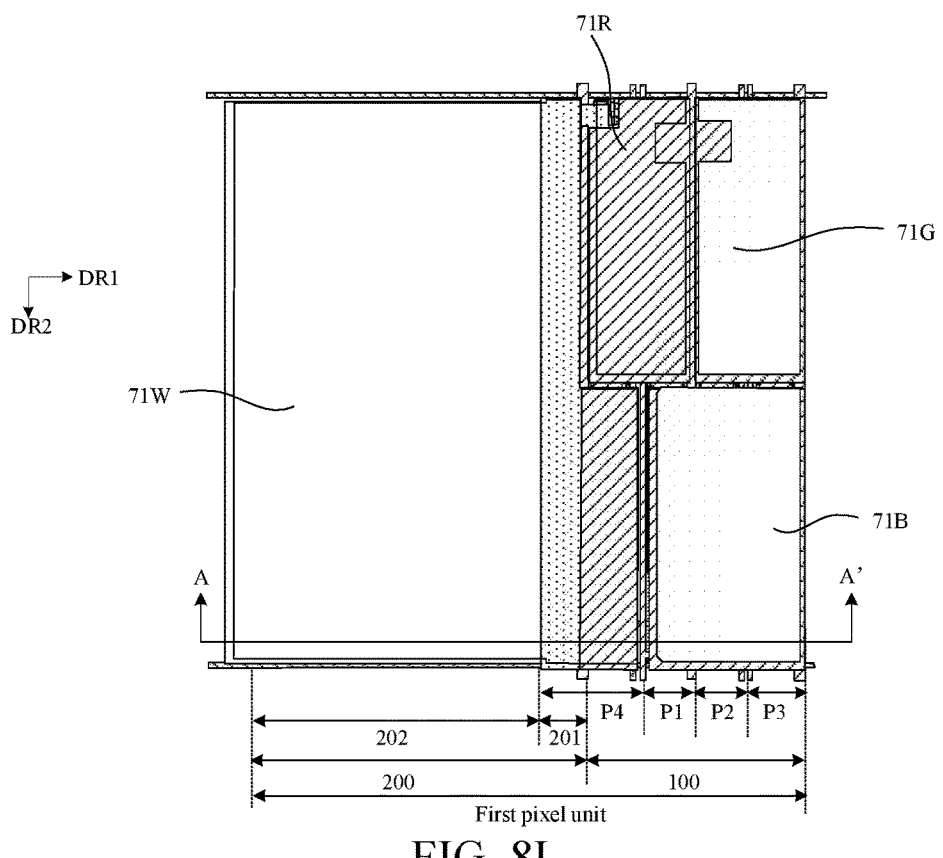
FIG. 8I is a schematic diagram after a pixel definition layer in the display substrate shown in FIG. 4 is formed.
FIG. 8J is a cross-sectional view of the display substrate shown in FIG. 8I taken along an A-A' direction.

FIGS. 8A to 8I are schematic diagrams of a preparation process of the display substrate shown in FIG. 4, illustrating a layout structure of one pixel unit of the display substrate, and FIG. 8J is a cross-sectional view of the display substrate shown in FIG. 8I taken along an A-A' direction. The preparation process of the display substrate according to the exemplary embodiment of the present disclosure is described below with reference to the structure of the display substrate shown in FIG. 4 and in conjunction with FIGS. 8A to 8J. Herein, in FIGS. 8A to 8I, each pixel unit includes a pixel region 100 and a transparent region 200, each pixel unit includes a first sub-pixel P1, a second sub-pixel P2, a third sub-pixel P3, and a fourth sub-pixel P4, and a pixel drive circuit of each sub-pixel includes a first transistor T1, a second transistor T2, a third transistor T3, and a storage capacitor C. In the pixel region 100, pixel drive circuits of the fourth sub-pixel P4, the first sub-pixel P1, the second sub-pixel P2, and the third sub-pixel P3 are sequentially disposed along a first direction DR1.

In an exemplary embodiment, the preparation process of the display substrate may include following acts.

(1) Forming a first conductive layer. For example, as shown in FIG. 8A, the first conductive layer may include a first electrode plate 41 and a compensation connection line 51 disposed across four sub-pixels. For example, in the pixel region 100, a first electrode plate 41 of the fourth sub-pixel P4, a first electrode plate 41 of the first sub-pixel P1, a first electrode plate 41 of the second sub-pixel P2, and a first electrode plate 41 of the third sub-pixel P3 are disposed sequentially along the first direction DR1.

(2) Forming a semiconductor layer. For example, as shown in FIG. 8B, the semiconductor layer may include a first active layer 11, a second active layer 21, a third active layer 31, and a second electrode plate 42 of each sub-pixel. For example, a pattern of the semiconductor layer in the fourth sub-pixel P4 and a pattern of the semiconductor layer in the third sub-pixel P3 are symmetrical with respect to a vertical axis, and a pattern of the semiconductor layer in the first sub-pixel P1 and a pattern of the semiconductor layer in the second sub-pixel P2 are mirror symmetrical with respect to a vertical axis. For example, a spacing 44 is disposed between second electrode plates 42 in the first sub-pixel P1 and the second sub-pixel P2, and the third active layer 31, and openings 45 are disposed in second electrode plates 42 of the third sub-pixel P3 and the fourth sub-pixel P4.

(3) Forming a second conductive layer. For example, as shown in FIG. 8C, the second conductive layer may include a first scan signal line G1, a second scan signal line G2, a power supply connection line 52, and an auxiliary power supply line 53, and a first gate electrode 12, a second gate electrode 22, and a third gate electrode 32 of each sub-pixel. For example, first gate electrodes 12, second gate electrodes 22, and third gate electrodes 32 in the third sub-pixel P3 and the fourth sub-pixel P4 are mirror symmetrical with respect to a vertical axis, and first gate electrodes 12, second gate electrodes 22, and third gate electrodes 32 in the first sub-pixel P1 and the second sub-pixel P2 are mirror symmetrical with respect to a vertical axis.

(4) Forming a third insulation layer. For example, as shown in FIG. 8D, the third insulation layer 63 is provided with a plurality of vias, and the plurality of vias may include a first via V1, a second via V2, a third via V3, a fourth via V4, a fifth via V5, a sixth via V6, a seventh via V7, an eighth via V8, a ninth via V9, a tenth via V10, an eleventh via V11, and a twelfth via V12. For example, the eighth via V8 may be located in the first sub-pixel P1 and the second sub-pixel P2, and the ninth via V9 may be located in the third sub-pixel P3 and the fourth sub-pixel P4.

(5) Forming a third conductive layer. As shown in FIG. 8E, the third conductive layer may include a first power supply line VDD, a second power supply line VSS, a compensation signal line Sense, and four data signal lines Data formed in each pixel unit, and may further include a first connection electrode 13, a second connection electrode 14, a third connection electrode 23, a fourth connection electrode 24, a fifth connection electrode 33, a sixth connection electrode 34, and a third electrode plate 43 formed in each sub-pixel. For example, the compensation signal line Sense may be disposed between the first sub-pixel P1 and the second sub-pixel P2. For example, a first end of a fifth connection electrode 33 in the second sub-pixel P2 is connected with the compensation connection line 51 through a seventh via V7 within the present sub-pixel, so that the compensation signal line Sense is connected with the compensation connection line 51, a second end of the fifth connection electrode 33 in the second sub-pixel P2 is connected with a first region of a third active layer 31 in the present sub-pixel through a fifth via V5 within the present sub-pixel, and a third end of the fifth connection electrode 33 in the second sub-pixel P2 is connected with the compensation signal line Sense. First connection electrodes 13, second connection electrodes 14, third connection electrodes 23, fourth connection electrodes 24, fifth connection electrodes 33, sixth connection electrodes 34, and third electrode plates 43 in the first sub-pixel P1 and the second sub-pixel P2 are mirror symmetrical with respect to a vertical axis (e.g., the compensation signal line Sense), and first connection electrodes 13, second connection electrodes 14, third connection electrodes 23, fourth connection electrodes 24, fifth connection electrodes 33, sixth connection electrodes 34, and third electrode plates 43 in the third sub-pixel P3 and the fourth sub-pixel P4 are mirror symmetrical with respect to a vertical axis (e.g., the compensation signal line Sense).

(6) Forming a fourth insulation layer and a fifth insulation layer. For example, as shown in FIG. 8F, the third conductive layer may include: the fourth insulation layer 64 and the fifth insulation layer 65 are provided with a plurality of vias, and the plurality of vias may include a thirteenth via V13 and a fourteenth via V14 located in the pixel region 100. For example, in the first sub-pixel P1 and the second sub-pixel P2, the thirteenth via V13 is located at a position of a spacing 44 between a second electrode plate 42 and a third active layer 31. For example, in the third sub-pixel P3 and the fourth sub-pixel P4, the fourteenth via V14 is located at a position of an opening 45 in the second electrode plate 42.

(7) Forming a fourth conductive layer. For example, as shown in FIG. 8G, the fourth conductive layer may include a first anode layer 701 located in each pixel unit. The first anode layer 701 in each pixel unit may include a first anode 701R, a second anode 701G, a third anode 701B, and a fourth anode 701W. Herein, each of the first anode 701R, the second anode 701G, and the third anode 701B is formed in the pixel region 100. The fourth anode 701W includes a main body portion formed in the pixel region 100 in the present pixel unit and an extension portion formed in the transparent region 200 in the present pixel unit. For example, in the pixel region 100, the first anode 701R and the second anode 701G are disposed sequentially along the first direction DR1, and the main body portion of the fourth anode 701W and the third anode 701B are disposed sequentially along the first direction DR1, the main body portion of the fourth anode 701W is located on a side of the first anode 701R in a second direction DR2 and the third anode 701B is located on a side of the second anode 701G in the second direction DR2. In this way, it may be achieved that a white sub-pixel region in the present pixel unit is externally expanded to the transparent region in the present pixel unit, and an aperture ratio may be improved without affecting transparency adversely.

(8) Forming a fifth conductive layer. For example, as shown in FIG. 8H, the fifth conductive layer may include a second anode layer 702 located in each pixel unit. The second anode layer 702 in each pixel unit may include a fifth anode 702R, a sixth anode 702G, a seventh anode 702B, and an eighth anode 702W located in the pixel region 100. For example, in the pixel region 100, the fifth anode 702R and the sixth anode 702G are disposed sequentially along the first direction DR1, and the eighth anode 702W and the seventh anode 702B are disposed sequentially along the first direction DR1, the eighth anode 702W is located on a side of the fifth anode 702R in the second direction DR2 and the seventh anode 702B is located on a side of the sixth anode 702G in the second direction DR2.

(9) Forming a pixel definition layer. As shown in FIG. 8I, a pixel definition layer 71 may include a first pixel opening 71R located in the first sub-pixel P1 and exposing the fifth anode 702R, a second pixel opening 71G located in the second sub-pixel P2 and exposing the sixth anode 702G, a third pixel opening 71B located in the third sub-pixel P3 and exposing the seventh anode 702B, and a fourth pixel opening 71W located in the fourth sub-pixel P4 and exposing the eighth anode 702W and the fourth anode 701W.

In an exemplary embodiment, as shown in FIG. 8J, in a direction perpendicular to a plane of the display substrate (i.e., a third direction DR3), a first transparent sub-region 201 in a transparent region 200 of a pixel unit may include a base substrate 10, and a first insulation layer 61, a third insulation layer 63, and a fourth insulation layer 64 sequentially stacked on the base substrate 10. A second transparent sub-region 202 in the transparent region 200 of the pixel unit may include the base substrate 10, and the first insulation layer 61, the third insulation layer 63, the fourth insulation layer 64, and the first anode layer 701 that are stacked sequentially on the base substrate 10. In this way, it is achieved that a first anode layer of a white sub-pixel in the present pixel unit is externally expanded to the second transparent sub-region 202 in the present pixel unit.

The above description of the preparation method of the display substrate shown in FIGS. 8A to 8J is similar to the description of the above-mentioned embodiments and has similar beneficial effects. Technical details not disclosed in this embodiment will be understood by those skilled in the art with reference to the above description of the display substrate shown in FIGS. 7A to 7J, which will not be repeated here.

As may be seen from the above, for the display substrate according to the exemplary embodiment of the present disclosure, a pixel region may be increased on a premise of not reducing an area of a transparent region by providing a design in which the first anode layer of the white sub-pixel in the present pixel unit is externally expanded to the transparent region in the present pixel unit, thereby improving a pixel aperture ratio to a certain extent, thereby improving a display effect. Moreover, since the first anode layer is formed of a transparent conductive material, the display effect may be improved without affecting a transparent effect adversely.

Figure 9A:
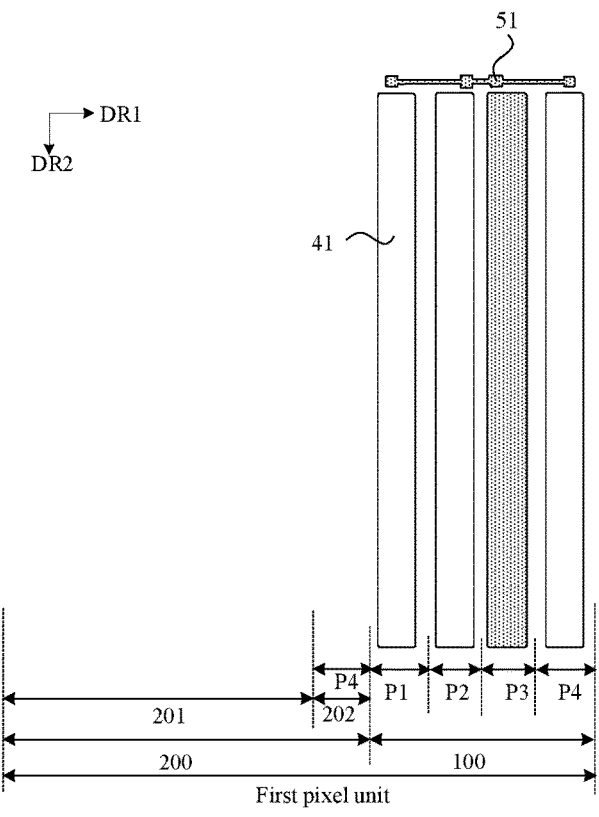
FIG. 9A is a schematic diagram after a first conductive layer in the display substrate shown in FIG. 5 is formed.
Figure 9B:
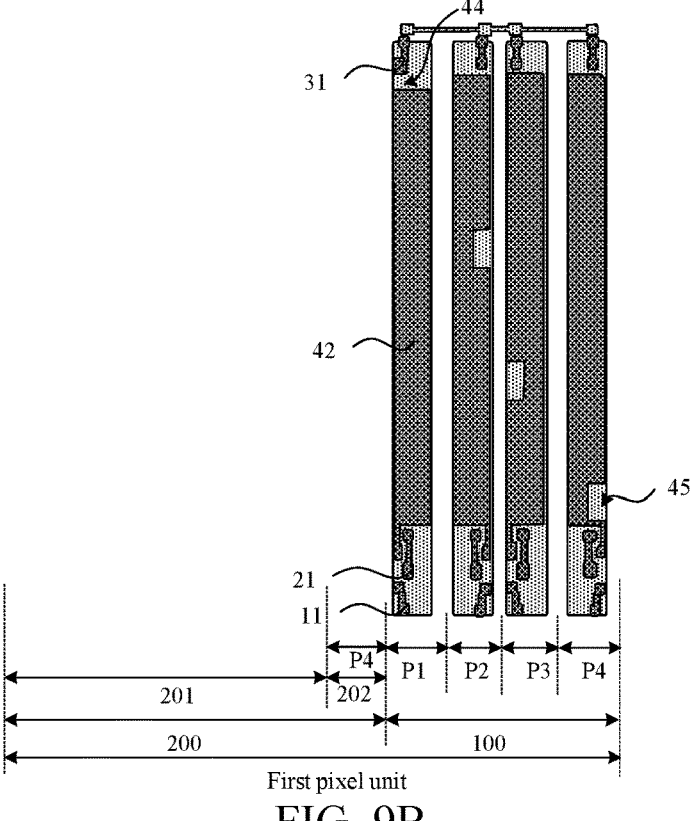
FIG. 9B is a schematic diagram after a semiconductor layer in the display substrate shown in FIG. 5 is formed.
Figure 9C:
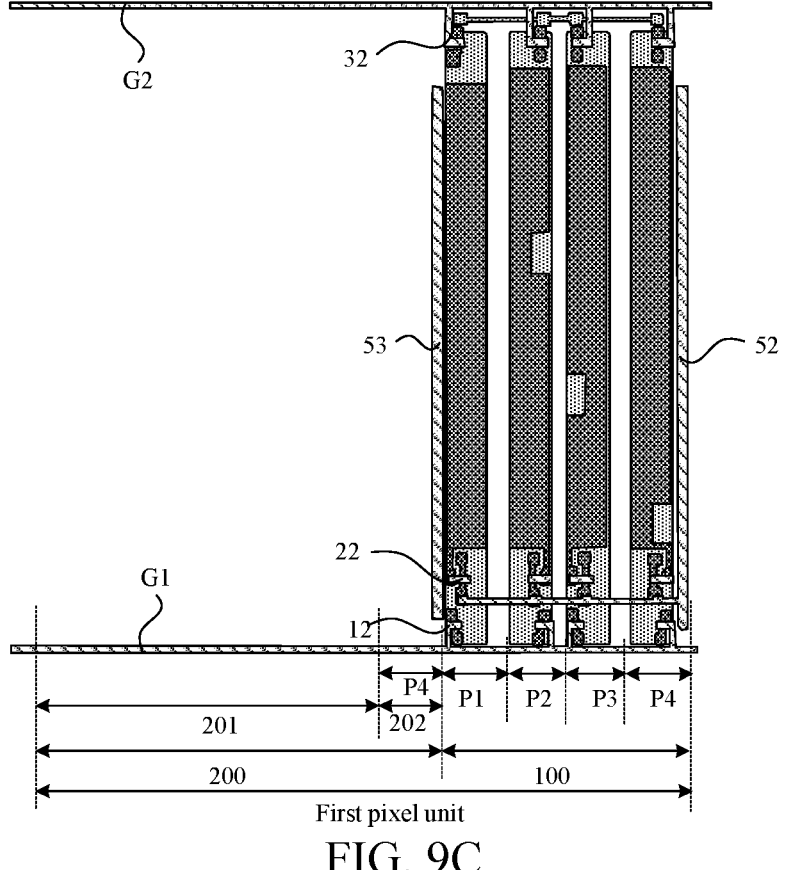
FIG. 9C is a schematic diagram after a second conductive layer in the display substrate shown in FIG. 5 is formed.
Figures 9D, 9E:
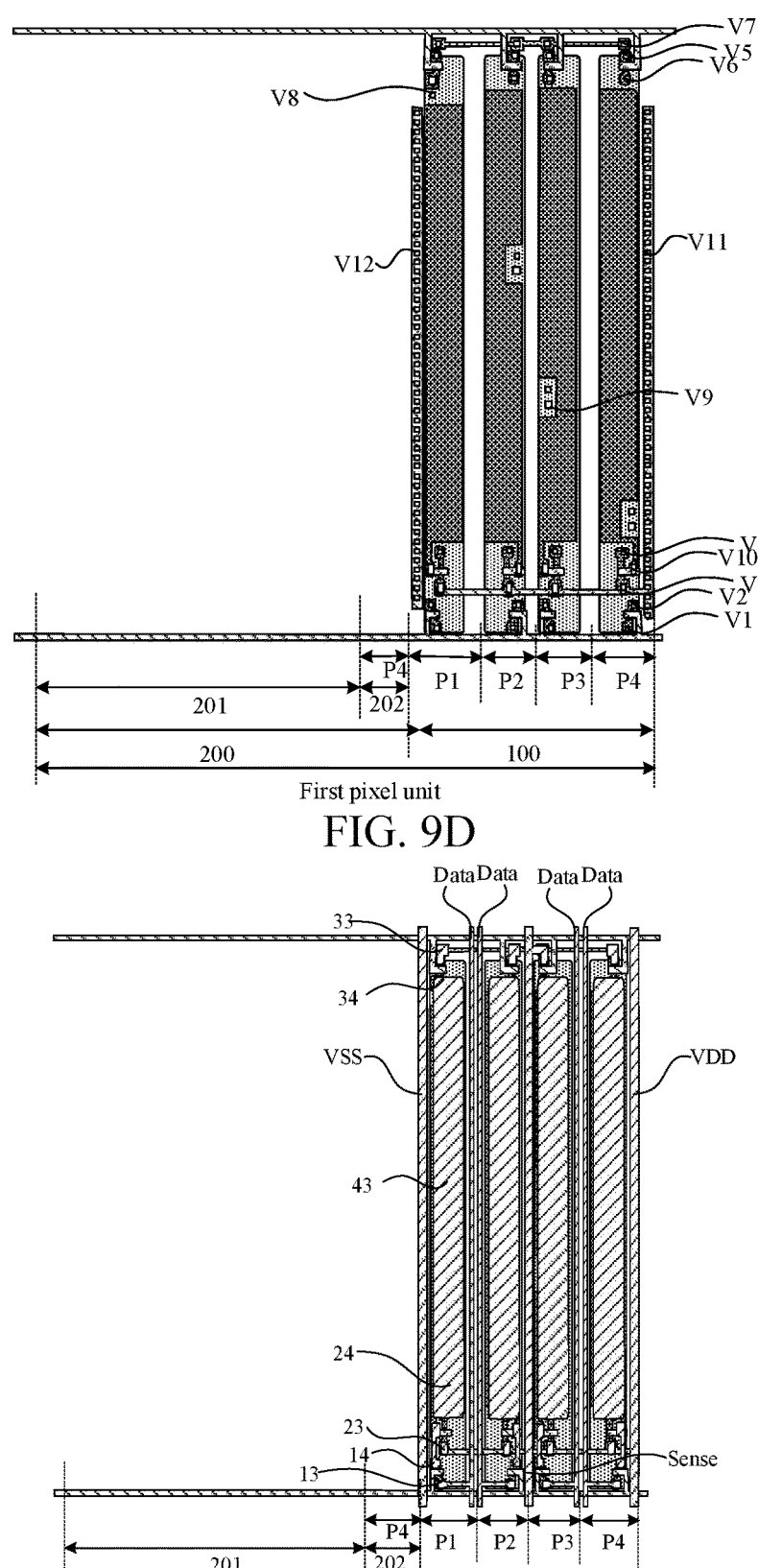
FIG. 9D is a schematic diagram after a third insulation layer in the display substrate shown in FIG. 5 is formed.
FIG. 9E is a schematic diagram after a third conductive layer in the display substrate shown in FIG. 5 is formed.
Figures 9F, 9G:
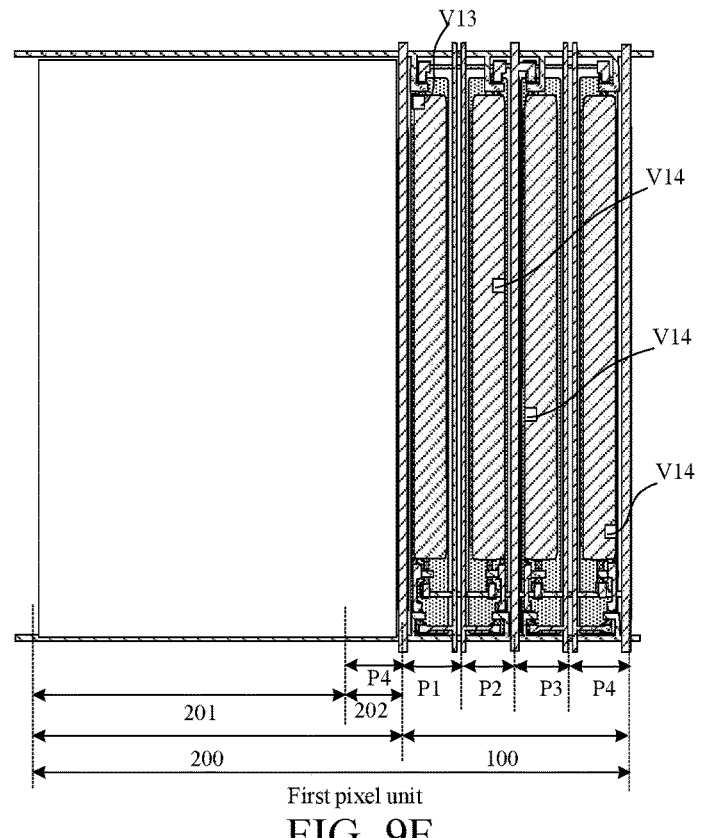
FIG. 9F is a schematic diagram after a fifth insulation layer in the display substrate shown in FIG. 5 is formed.
FIG. 9G is a schematic diagram after a fourth conductive layer in the display substrate shown in FIG. 5 is formed.
Figure 9H:
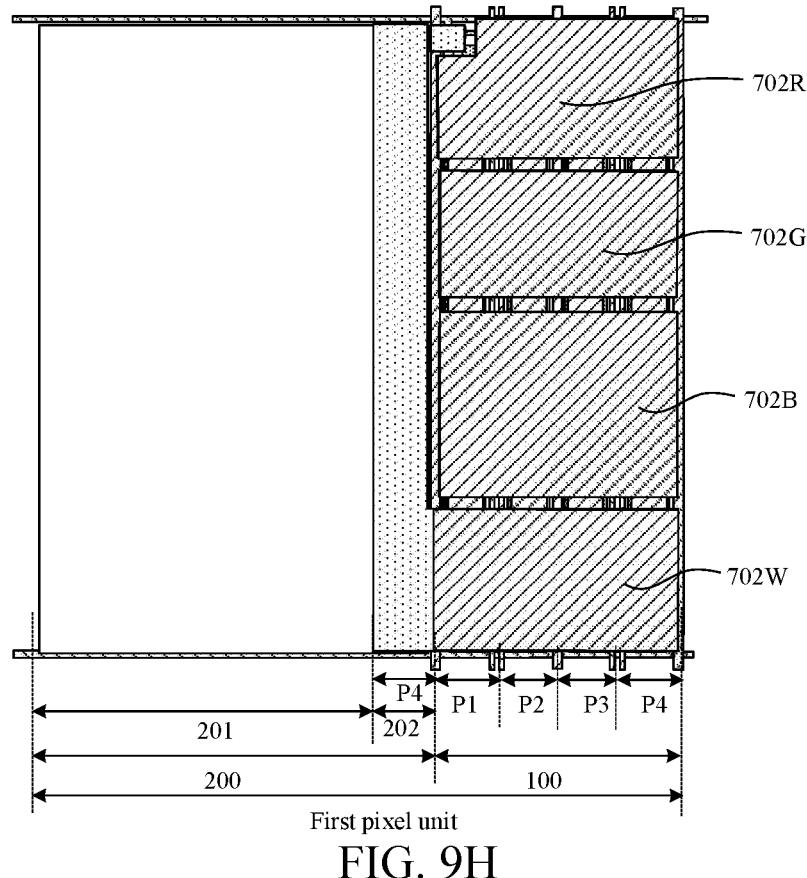
FIG. 9H is a schematic diagram after a fifth conductive layer in the display substrate shown in FIG. 5 is formed.
Figure 9I:
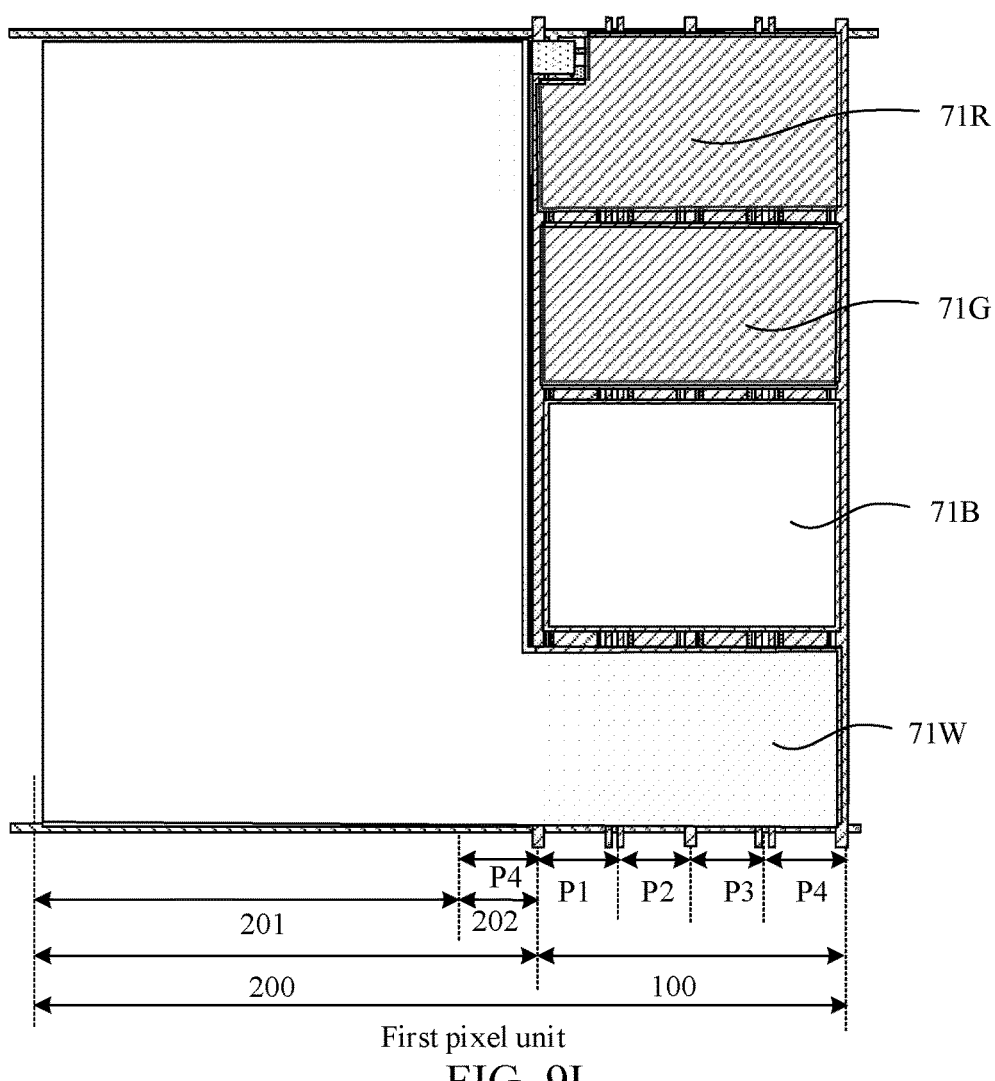
FIG. 9I is a schematic diagram after a pixel definition layer in the display substrate shown in FIG. 5 is formed.
Figure 9J:
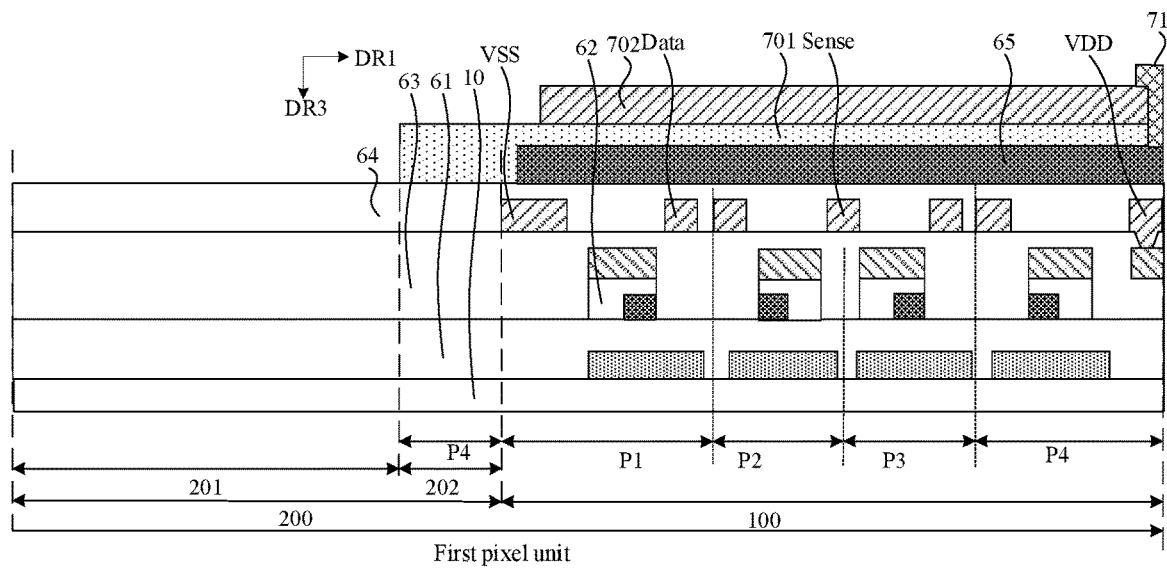
FIG. 9J is a cross-sectional view of the display substrate shown in FIG. 9I taken along an A-A' direction.

FIGS. 9A to 9I are schematic diagrams of a preparation process of the display substrate shown in FIG. 5, illustrating a layout structure of one pixel unit of the display substrate, and FIG. 9J is a cross-sectional view of the display substrate shown in FIG. 9I taken along an A-A' direction. The preparation process of the display substrate according to the exemplary embodiment of the present disclosure is described below with reference to the structure of the display substrate shown in FIG. 5 and in conjunction with FIGS. 9A to 9J. Herein, in FIGS. 9A to 9I, each pixel unit may include a transparent region 200 and a pixel region 100 disposed sequentially along a first direction DR1, each pixel unit includes a first sub-pixel P1, a second sub-pixel P2, a third sub-pixel P3, and a fourth sub-pixel P4, and a pixel drive circuit of each sub-pixel includes a first transistor T1, a second transistor T2, a third transistor T3, and a storage capacitor C. In the pixel region 100, pixel drive circuits of the first sub-pixel P1, the second sub-pixel P2, the third sub-pixel P3, and the fourth sub-pixel P4 are sequentially disposed along the first direction DR1.

In an exemplary embodiment, the preparation process of the display substrate may include following acts.

(1) Forming a first conductive layer. For example, as shown in FIG. 9A, the first conductive layer may include a first electrode plate 41 located in the pixel region 100 and a compensation connection line 51 disposed across four sub-pixels. For example, in the pixel region 100, a first electrode plate 41 of the first sub-pixel P1, a first electrode plate 41 of the second sub-pixel P2, a first electrode plate 41 of the third sub-pixel P3, and a first electrode plate 41 of the fourth sub-pixel P4 are disposed sequentially along the first direction DR1.

(2) Forming a semiconductor layer. For example, as shown in FIG. 9B, the semiconductor layer may include a first active layer 11, a second active layer 21, a third active layer 31, and a second electrode plate 42 of each sub-pixel located in the pixel region 100. For example, first active layers 11, second active layers 21, and third active layers 31 in the second sub-pixel P2 and the third sub-pixel P3 are symmetric with respect to a vertical axis. For example, first active layers 11 and second active layers 21 in the first sub-pixel P1 and the fourth sub-pixel P4 are symmetric with respect to a vertical axis. For example, a spacing 44 is disposed between a second electrode plate 42 and a third active layer 31 in the first sub-pixel P1, and openings 45 are disposed in second electrode plates 42 of the second sub-pixel P2, the third sub-pixel P3, and the fourth sub-pixel P4.

(3) Forming a second conductive layer. For example, as shown in FIG. 9C, the second conductive layer may include a first scan signal line G1, a second scan signal line G2, a power supply connection line 52, and an auxiliary power supply line 53, and a first gate electrode 12, a second gate electrode 22, and a third gate electrode 32 of each sub-pixel. For example, first gate electrodes 12, second gate electrodes 22, and third gate electrodes 32 in the first sub-pixel P1 and the fourth sub-pixel P4 are mirror symmetrical with respect to a vertical axis, and first gate electrodes 12, second gate electrodes 22, and third gate electrodes 32 in the second sub-pixel P2 and the third sub-pixel P3 are mirror symmetrical with respect to a vertical axis.

(4) Forming a third insulation layer. For example, as shown in FIG. 9D, a plurality of vias are disposed on the third insulation layer 63, and the plurality of vias may include a first via V1, a second via V2, a third via V3, a fourth via V4, a fifth via V5, a sixth via V6, a seventh via V7, an eighth via V8, a ninth via V9, a tenth via V10, an eleventh via V11, and a twelfth via V12 located in the pixel region 100. For example, the eighth via V8 may be located in the first sub-pixel P1, and the ninth via V9 may be located in the second sub-pixel P2, the third sub-pixel P3, and the fourth sub-pixel P4

(5) Forming a third conductive layer. As shown in FIG. 9E, the third conductive layer may include a first power supply line VDD, a second power supply line VSS, a compensation signal line Sense, and four data signal lines Data formed in each pixel unit, and may further include a first connection electrode 13, a second connection electrode 14, a third connection electrode 23, a fourth connection electrode 24, a fifth connection electrode 33, a sixth connection electrode 34, and a third electrode plate 43 located in each sub-pixel in the pixel region 100. For example, the compensation signal line Sense may be disposed between the second sub-pixel P2 and the third sub-pixel P3. For example, a first end of a fifth connection electrode 33 in the third sub-pixel P3 is connected with the compensation connection line 51 through a seventh via V7 within the present sub-pixel so that the compensation signal line Sense is connected with the compensation connection line 51, a second end of the fifth connection electrode 33 in the third sub-pixel P3 is connected with a first region of a third active layer 31 in the present sub-pixel through a fifth via V5 within the present sub-pixel, and a third end of the fifth connection electrode 33 in the third sub-pixel P3 is connected with the compensation signal line Sense. First connection electrodes 13, second connection electrodes 14, third connection electrodes 23, fourth connection electrodes 24, fifth connection electrodes 33, sixth connection electrodes 34, and third electrode plates 43 in the second sub-pixel P2 and the third sub-pixel P3 are mirror symmetrical with respect to a vertical axis (for example, the compensation signal line Sense), and first connection electrodes 13, second connection electrodes 14, third connection electrodes 23, fourth connection electrodes 24, fifth connection electrodes 33, sixth connection electrodes 34, and third electrode plates 43 in the first sub-pixel P1 and the fourth sub-pixel P4 are mirror symmetrical with respect to a vertical axis (e.g., the compensation signal line Sense).

(6) Forming a fourth insulation layer and a fifth insulation layer. For example, as shown in FIG. 9F, the third conductive layer may include: a plurality of vias are disposed on the fourth insulation layer 64 and the fifth insulation layer 65, and the plurality of vias may include a thirteenth via V13 and a fourteenth via V14 located in the pixel region 100. For example, in the first sub-pixel P1, the thirteenth via V13 is located at a position of the spacing 44 between the second electrode plate 42 and the third active layer 31. For example, in the second sub-pixel P2, the third sub-pixel P3, and the fourth sub-pixel P4, the fourteenth via V14 is located at a position of an opening 45 in a second electrode plate 42.

(7) Forming a fourth conductive layer. For example, as shown in FIG. 9G, the fourth conductive layer may include a first anode layer 701 located in each pixel unit. The first anode layer 701 in each pixel unit may include a first anode 701R, a second anode 701G, a third anode 701B, and a fourth anode 701W. Herein, the first anode 701R, the second anode 701G, and the third anode 701B are all formed in the pixel region 100. The fourth anode 701W includes a main body portion formed in the pixel region 100 in the present pixel unit and an extension portion formed in the transparent region 200 in the present pixel unit. For example, in the pixel region 100, main body portions of the first anode 701R, the second anode 701G, the third anode 701B, and the fourth anode 701W are disposed sequentially along a second direction DR2. For example, an extension portion of the fourth anode 701W is located on a side of the first anode 701R, the second anode 701G, and the third anode 701B in an opposite direction of the first direction DR1. In this way, it may be achieved that a white sub-pixel region in the present pixel unit is externally expanded to the transparent region in the present pixel unit, and an aperture ratio may be improved without affecting transparency adversely.

(8) Forming a fifth conductive layer. For example, as shown in FIG. 9H, the fifth conductive layer may include a second anode layer 702 located in each pixel unit. The second anode layer 702 in each pixel unit may include a fifth anode 702R, a sixth anode 702G, a seventh anode 702B, and an eighth anode 702W located in the pixel region 100. For example, in the pixel region 100, the fifth anode 702R, the sixth anode 702G, the seventh anode 702B, and the eighth anode 702W are disposed sequentially along the second direction DR2.

(9) Forming a pixel definition layer. As shown in FIG. 9I, a pixel definition layer 71 may include a first pixel opening 71R located in the first sub-pixel P1 and exposing the fifth anode 702R, a second pixel opening 71G located in the second sub-pixel P2 and exposing the sixth anode 702G, a third pixel opening 71B located in the third sub-pixel P3 and exposing the seventh anode 702B, and a fourth pixel opening 71W located in the fourth sub-pixel P4 and exposing the eighth anode 702W and the fourth anode 701W. For example, in the pixel region 100, the first pixel opening 71R, the second pixel opening 71G, and the third pixel opening 71B are sequentially disposed along the second direction DR2.

In an exemplary embodiment, as shown in FIG. 9J, in a direction perpendicular to a plane of the display substrate (i.e., a third direction DR3), a first transparent sub-region 201 in a transparent region 200 of a pixel unit may include a base substrate 10, and a first insulation layer 61, a third insulation layer 63, and a fourth insulation layer 64 sequentially stacked on the base substrate 10. A second transparent sub-region 202 in a transparent region 200 of the pixel unit may include the base substrate 10, and the first insulation layer 61, the third insulation layer 63, the fourth insulation layer 64, and the first anode layer 701 that are stacked sequentially on the base substrate 10. In this way, it is achieved that a first anode layer of a white sub-pixel in the present pixel unit is externally expanded to the second transparent sub-region 202 in the present pixel unit.

The above description of the preparation method of the display substrate shown in FIGS. 9A to 9J is similar to the description of the above-mentioned embodiments and has similar beneficial effects. Technical details not disclosed in this embodiment will be understood by those skilled in the art with reference to the above description of the display substrate shown in FIGS. 7A to 7J, which will not be repeated here.

As may be seen from the above, for the display substrate according to the exemplary embodiment of the present disclosure, a pixel region may be increased on a premise of not reducing an area of a transparent region by providing a design in which the first anode layer of the white sub-pixel in the present pixel unit is externally expanded to the transparent region in the present pixel unit, thereby improving a pixel aperture ratio to a certain extent, thereby improving a display effect. Moreover, since the first anode layer is formed of a transparent conductive material, the display effect may be improved without affecting a transparent effect adversely.

Figure 10A:
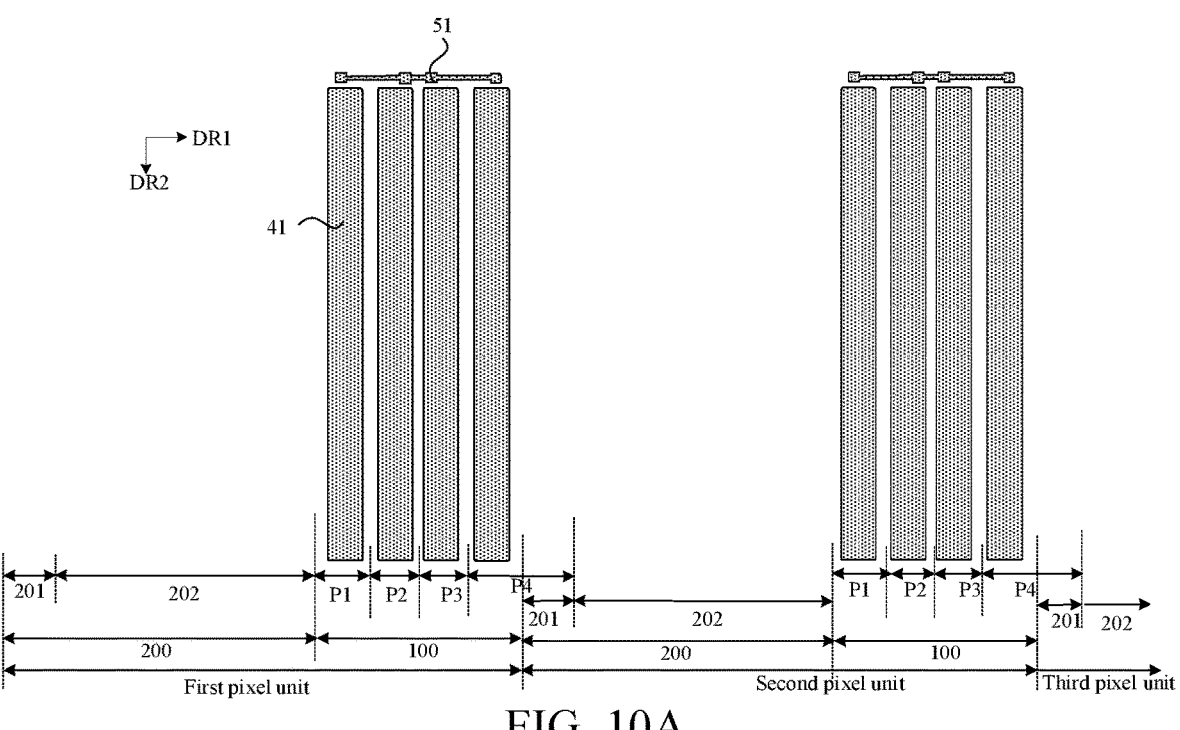
FIG. 10A is a schematic diagram after a first conductive layer in the display substrate shown in FIG. 6 is formed.
Figure 10B:
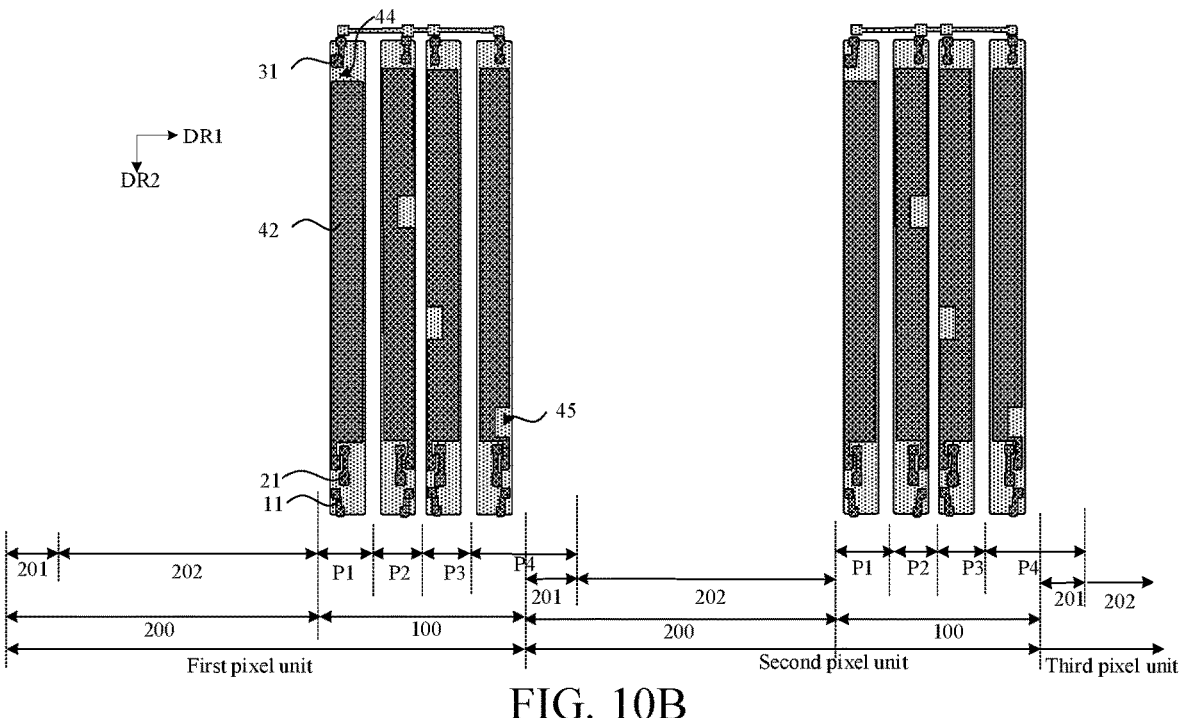
FIG. 10B is a schematic diagram after a semiconductor layer in the display substrate shown in FIG. 6 is formed.
Figure 10C:
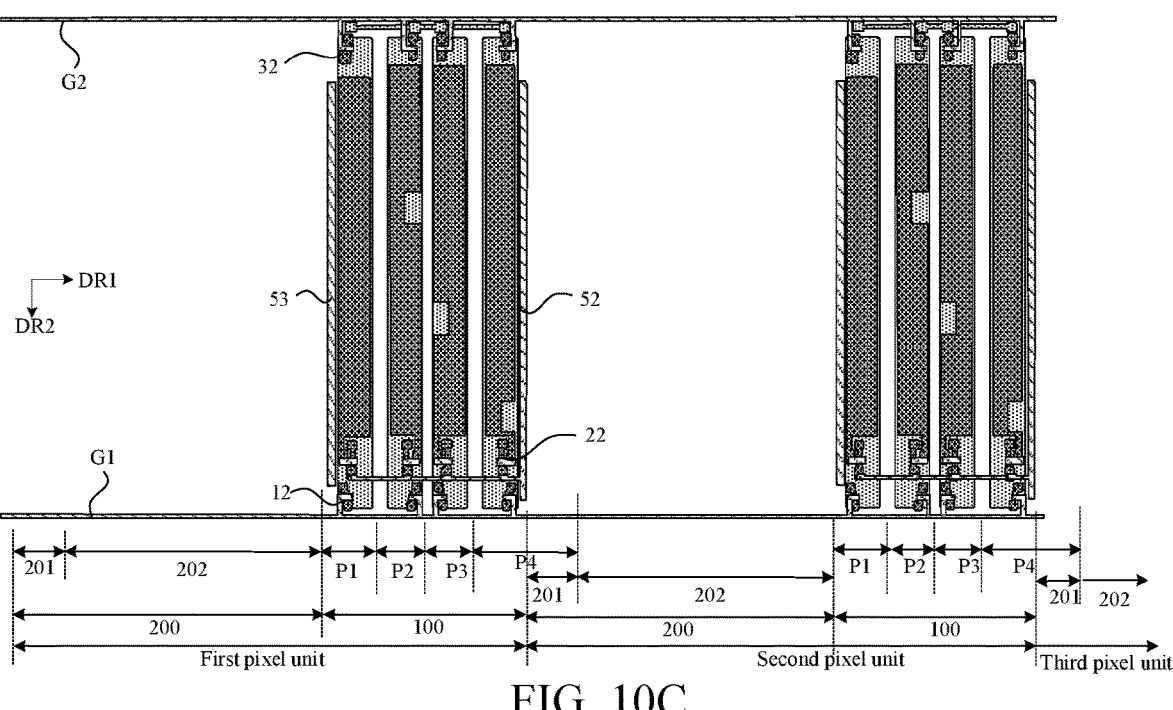
FIG. 10C is a schematic diagram after a second conductive layer in the display substrate shown in FIG. 6 is formed.
Figure 10D:
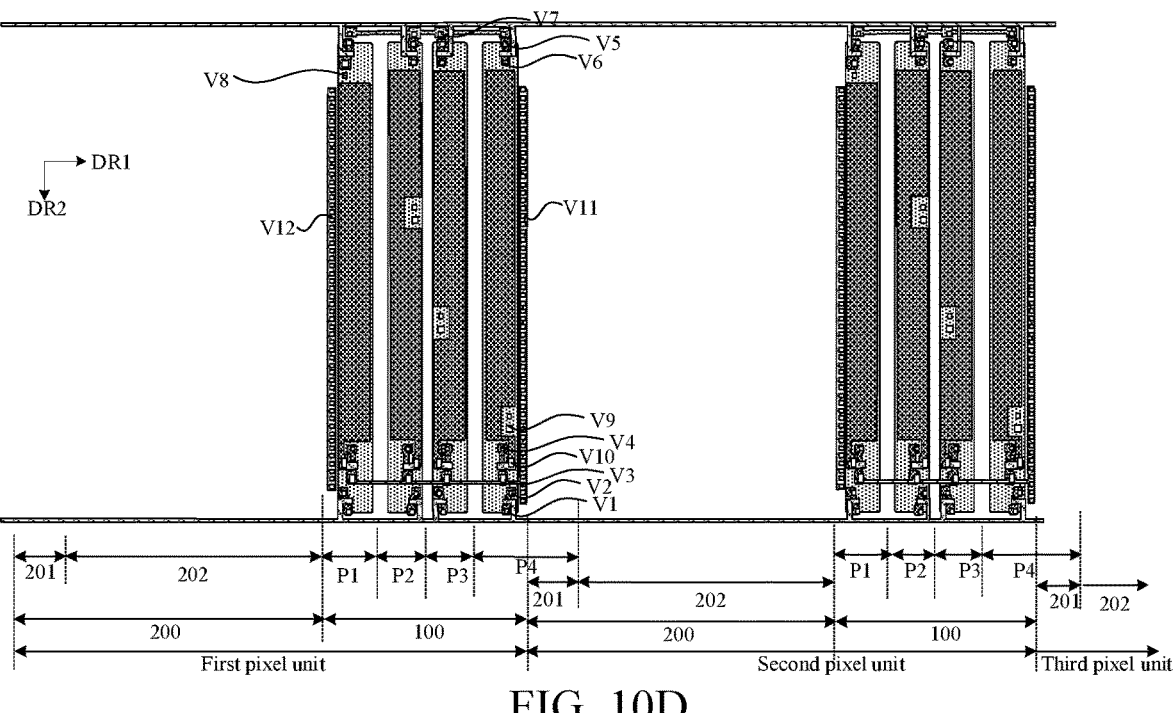
FIG. 10D is a schematic diagram after a third insulation layer in the display substrate shown in FIG. 6 is formed.
Figure 10E:
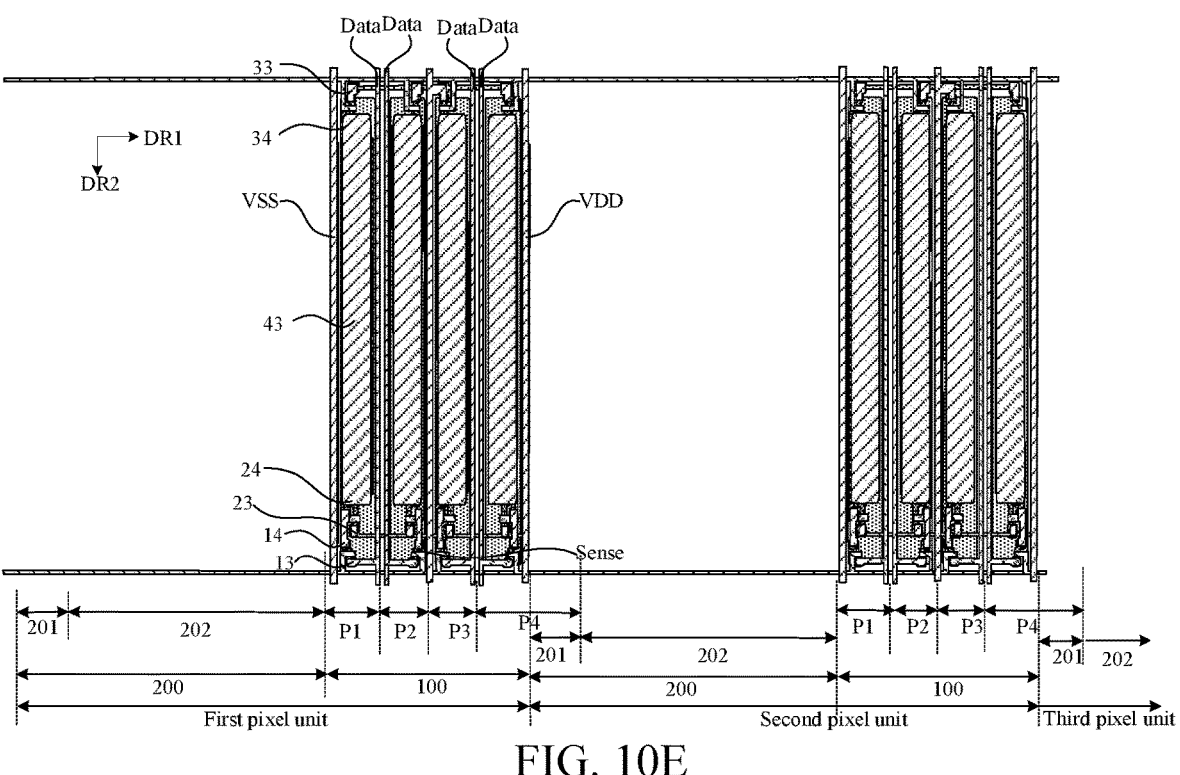
FIG. 10E is a schematic diagram after a third conductive layer in the display substrate shown in FIG. 6 is formed.
Figure 10F:
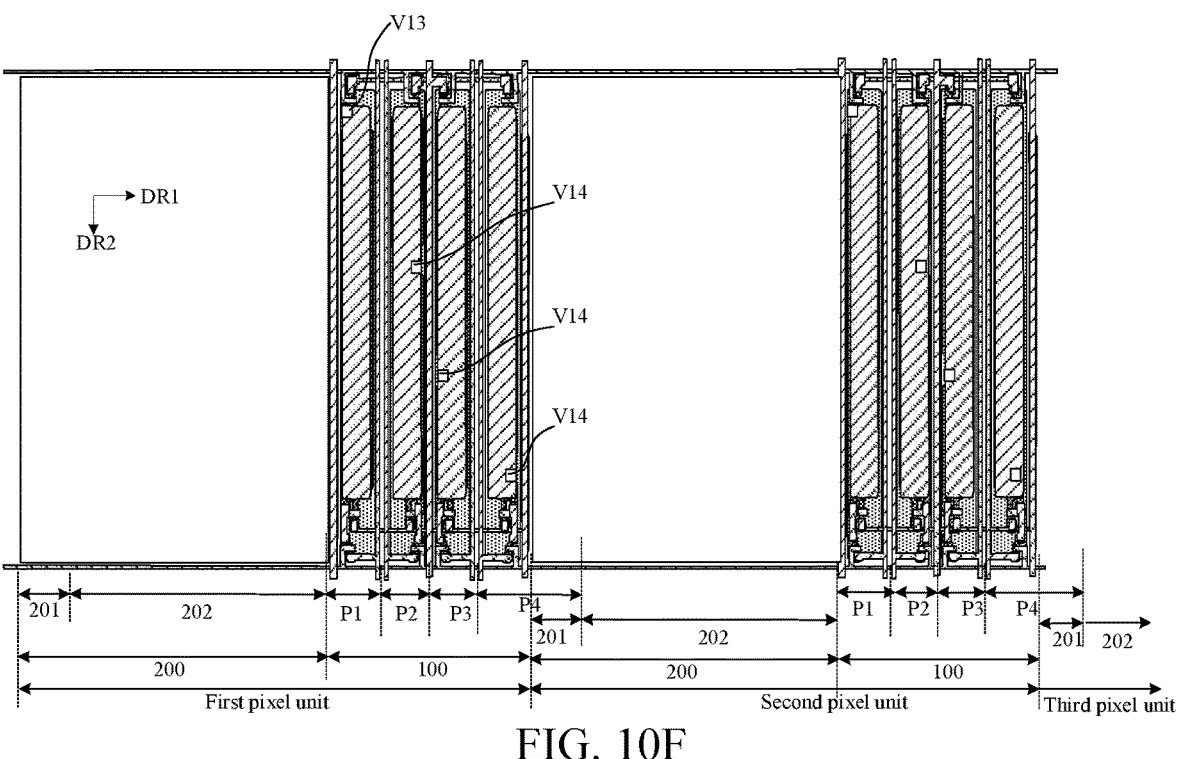
FIG. 10F is a schematic diagram after a fifth insulation layer in the display substrate shown in FIG. 6 is formed.
Figure 10G:
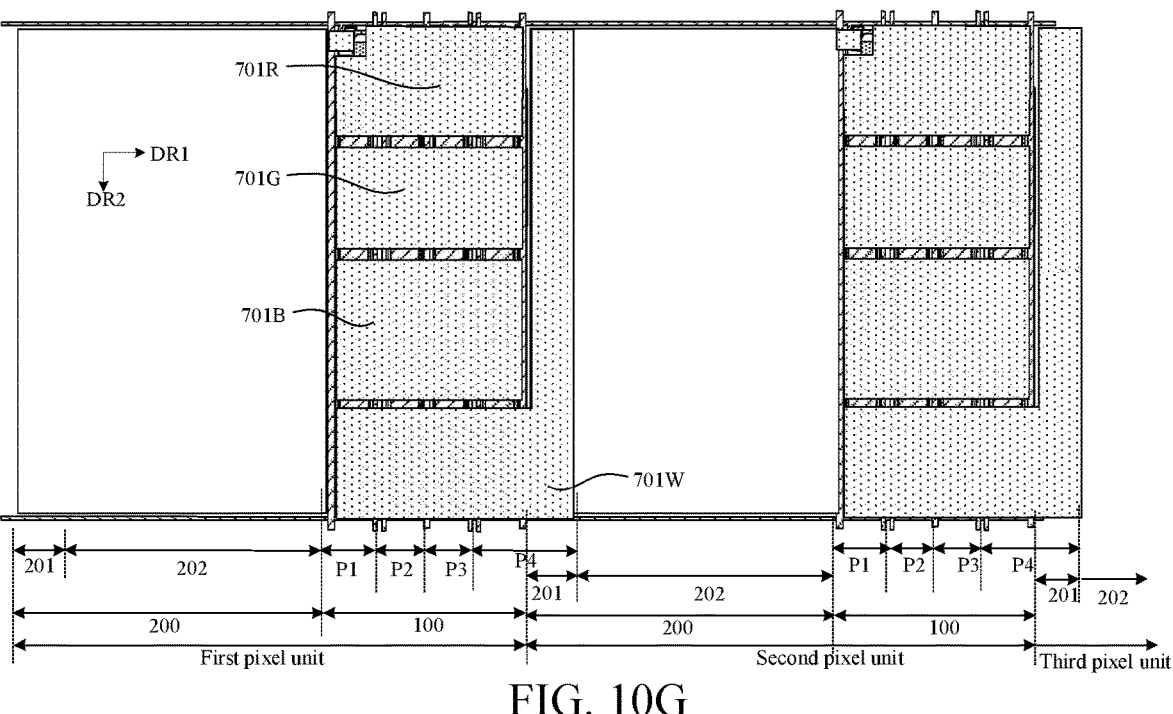
FIG. 10G is a schematic diagram after a fourth conductive layer in the display substrate shown in FIG. 6 is formed.
Figure 10H:
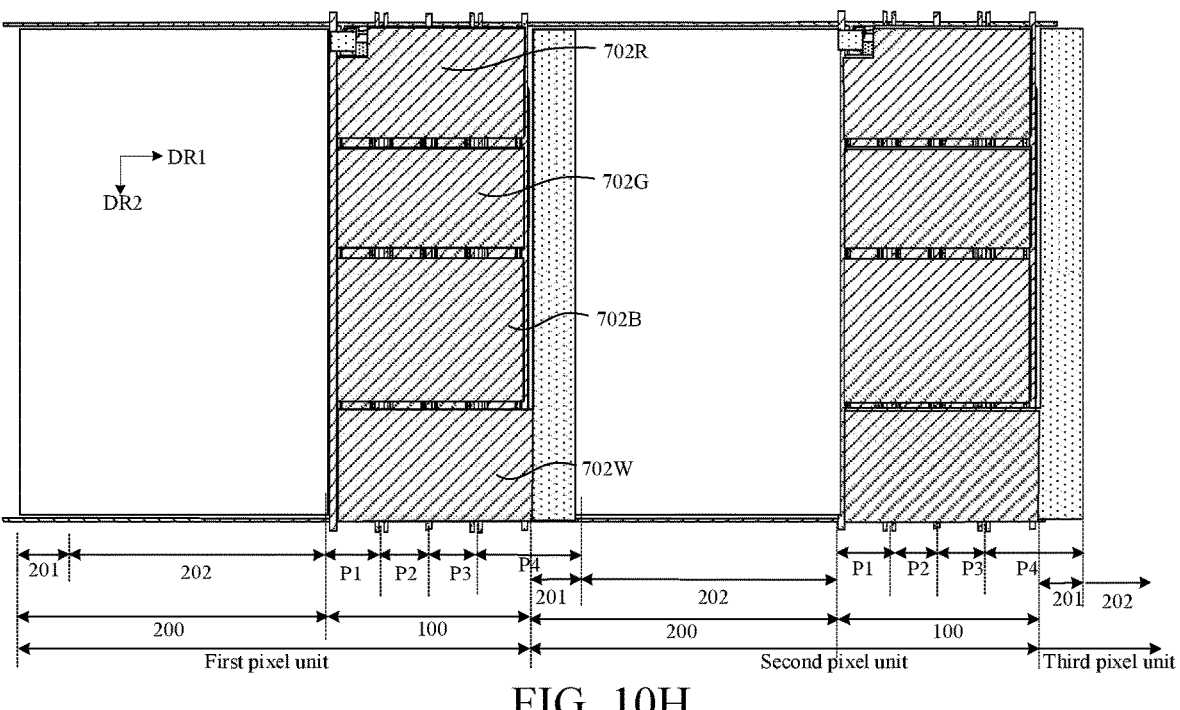
FIG. 10H is a schematic diagram after a fifth conductive layer in the display substrate shown in FIG. 6 is formed.
Figure 10I:
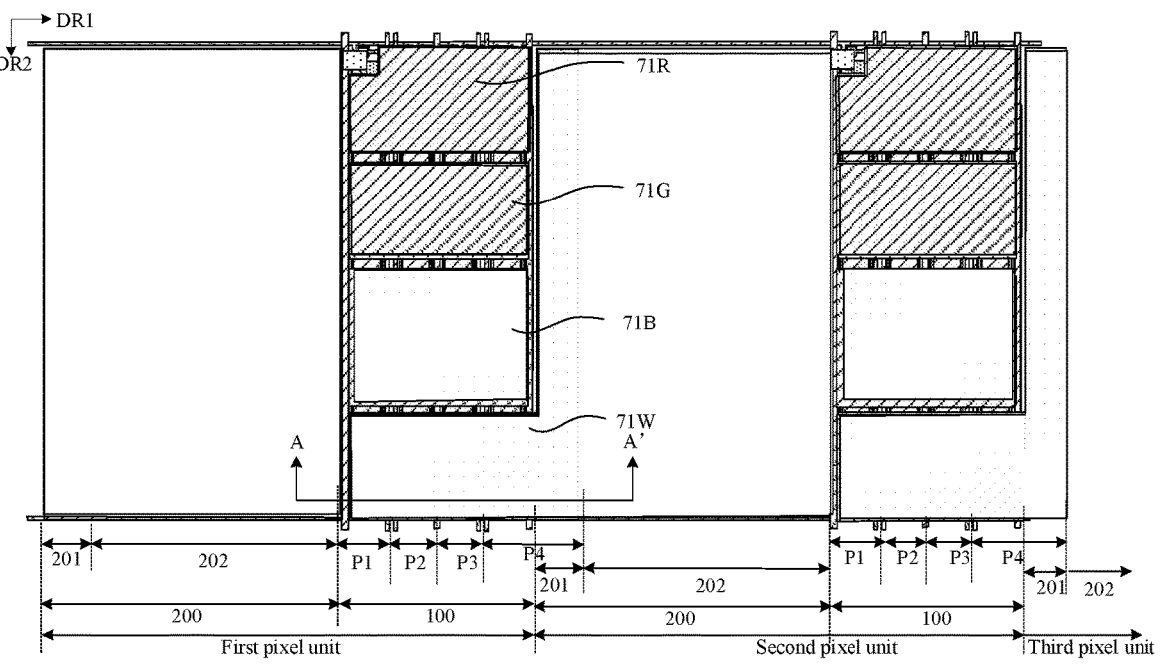
FIG. 10I is a schematic diagram after a pixel definition layer in the display substrate shown in FIG. 6 is formed.
Figure 10J:
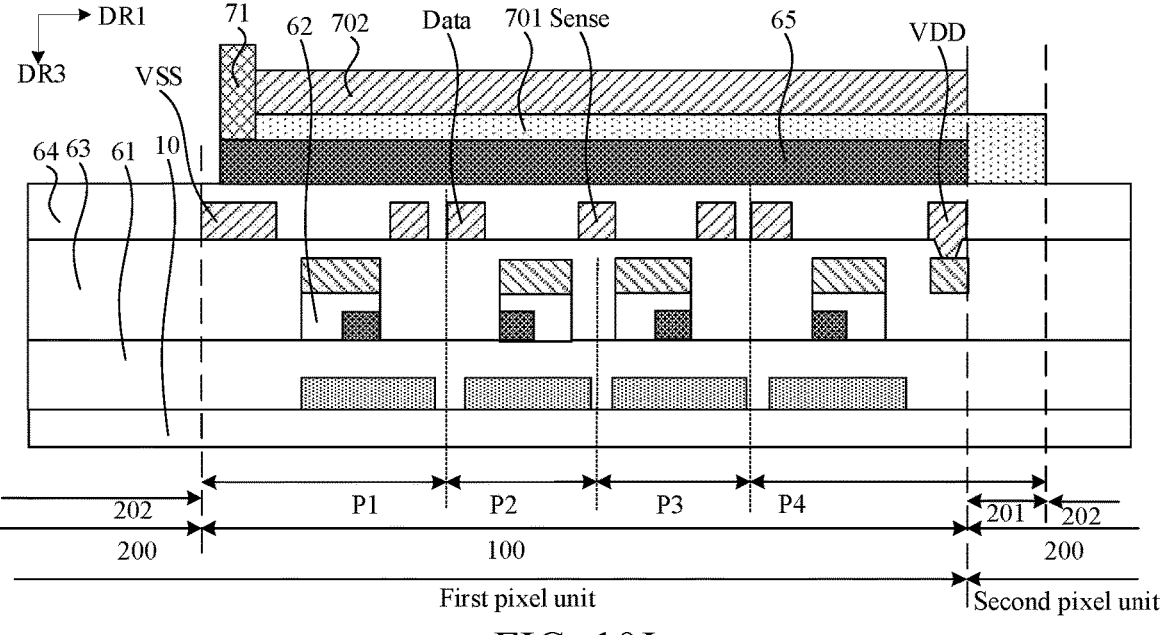
FIG. 10J is a cross-sectional view of the display substrate shown in FIG. 10I taken along an A-A' direction.

FIGS. 10A to 10I are schematic diagrams of a preparation process of the display substrate shown in FIG. 6, illustrating layout structures of two pixel units of the display substrate, and FIG. 10J is a cross-sectional view of the display substrate shown in FIG. 10I taken along an A-A' direction. The preparation process of the display substrate according to the exemplary embodiment of the present disclosure is described below with reference to the structure of the display substrate shown in FIG. 6 and in conjunction with FIGS. 10A to 10J. Herein, in FIGS. 10A to 10J, each pixel unit includes a pixel region 100 and a transparent region 200, each pixel unit includes a first sub-pixel P1, a second sub-pixel P2, a third sub-pixel P3, and a fourth sub-pixel P4, and a pixel drive circuit of each sub-pixel includes a first transistor T1, a second transistor T2, a third transistor T3, and a storage capacitor C. In the pixel region 100, pixel drive circuits of the first sub-pixel P1, the second sub-pixel P2, the third sub-pixel P3, and the fourth sub-pixel P4 are sequentially disposed along a first direction DR1.

In an exemplary embodiment, the preparation process of the display substrate may include following acts.

(1) Forming a first conductive layer. For example, as shown in FIG. 10A, the first conductive layer may include a first electrode plate 41 located in the pixel region 100 and a compensation connection line 51 disposed across four sub-pixels. For example, in the pixel region 100, a first electrode plate 41 of the first sub-pixel P1, a first electrode plate 41 of the second sub-pixel P2, a first electrode plate 41 of the third sub-pixel P3, and a first electrode plate 41 of the fourth sub-pixel P4 are disposed sequentially along the first direction DR1.

(2) Forming a semiconductor layer. For example, as shown in FIG. 10B, the semiconductor layer may include a first active layer 11, a second active layer 21, a third active layer 31, and a second electrode plate 42 of each sub-pixel located in the pixel region 100. For example, first active layers 11, second active layers 21, and third active layers 31 in the second sub-pixel P2 and the third sub-pixel P3 are symmetric with respect to a vertical axis. For example, first active layers 11 and second active layers 21 in the first sub-pixel P1 and the fourth sub-pixel P4 are symmetric with respect to a vertical axis. For example, a spacing 44 is disposed between a second electrode plate 42 and a third active layer 31 in the first sub-pixel P1, and openings 45 are disposed in second electrode plates 42 of the second sub-pixel P2, the third sub-pixel P3, and the fourth sub-pixel P4.

(3) Forming a second conductive layer. For example, as shown in FIG. 10C, the second conductive layer may include a first scan signal line G1, a second scan signal line G2, a power supply connection line 52, and an auxiliary power supply line 53, and a first gate electrode 12, a second gate electrode 22, and a third gate electrode 32 of each sub-pixel. For example, first gate electrodes 12, second gate electrodes 22, and third gate electrodes 32 in the first sub-pixel P1 and the fourth sub-pixel P4 are mirror symmetrical with respect to a vertical axis, and first gate electrodes 12, second gate electrodes 22, and third gate electrodes 32 in the second sub-pixel P2 and the third sub-pixel P3 are mirror symmetrical with respect to a vertical axis.

(4) Forming a third insulation layer. For example, as shown in FIG. 10D, a plurality of vias are disposed on the third insulation layer 63, and the plurality of vias may include a first via V1, a second via V2, a third via V3, a fourth via V4, a fifth via V5, a sixth via V6, a seventh via V7, an eighth via V8, a ninth via V9, a tenth via V10, an eleventh via V11, and a twelfth via V12 located in the pixel region 100. For example, the eighth via V8 may be located in the first sub-pixel P1, and the ninth via V9 may be located in the second sub-pixel P2, the third sub-pixel P3, and the fourth sub-pixel P4.

(5) Forming a third conductive layer. As shown in FIG. 10E, the third conductive layer may include a first power supply line VDD, a second power supply line VSS, a compensation signal line Sense, and four data signal lines Data formed in each pixel unit, and may further include a first connection electrode 13, a second connection electrode 14, a third connection electrode 23, a fourth connection electrode 24, a fifth connection electrode 33, a sixth connection electrode 34, and a third electrode plate 43 located in each sub-pixel in the pixel region 100. For example, the compensation signal line Sense may be disposed between the second sub-pixel P2 and the third sub-pixel P3. For example, a first end of a fifth connection electrode 33 in the third sub-pixel P3 is connected with the compensation connection line 51 through a seventh via V7 within the present sub-pixel so that the compensation signal line Sense is connected with the compensation connection line 51, a second end of the fifth connection electrode 33 in the third sub-pixel P3 is connected with a first region of a third active layer 31 in the present sub-pixel through a fifth via V5 within the present sub-pixel, and a third end of the fifth connection electrode 33 in the third sub-pixel P3 is connected with the compensation signal line Sense. First connection electrodes 13, second connection electrodes 14, third connection electrodes 23, fourth connection electrodes 24, fifth connection electrodes 33, sixth connection electrodes 34, and third electrode plates 43 in the second sub-pixel P2 and the third sub-pixel P3 are mirror symmetrical with respect to a vertical axis (for example, the compensation signal line Sense), and first connection electrodes 13, second connection electrodes 14, third connection electrodes 23, fourth connection electrodes 24, fifth connection electrodes 33, sixth connection electrodes 34, and third electrode plates 43 in the first sub-pixel P1 and the fourth sub-pixel P4 are mirror symmetrical with respect to a vertical axis (e.g., the compensation signal line Sense).

(6) Forming a fourth insulation layer and a fifth insulation layer. For example, as shown in FIG. 10F, the third conductive layer may include: a plurality of vias are disposed on the fourth insulation layer 64 and the fifth insulation layer 65, and the plurality of vias may include a thirteenth via V13 and a fourteenth via V14 located in the pixel region 100. For example, the thirteenth via V13 is disposed in the first sub-pixel P1 and located at a position of the spacing 44 between the second electrode plate 42 and the third active layer 31 in the first sub-pixel P1. For example, the fourteenth via V14 is disposed in the second sub-pixel P2, the third sub-pixel P3, and the fourth sub-pixel P4, respectively, and the fourteenth via V14 is located at a position of an opening 45 in a second electrode plate 42.

(7) Forming a fourth conductive layer. For example, as shown in FIG. 10G, the fourth conductive layer may include a first anode layer 701 located in each pixel unit. The first anode layer 701 in each pixel unit may include a first anode 701R, a second anode 701G, a third anode 701B, and a fourth anode 701W. Herein, the first anode 701R, the second anode 701G, and the third anode 701B are all formed in the pixel region 100. The fourth anode 701W includes a main body portion formed in a pixel region 100 in the present pixel unit (e.g., a first pixel unit) and an extension portion formed in a transparent region 200 in an adjacent pixel unit (e.g., a second pixel unit). For example, in the pixel region 100, main body portions of the first anode 701R, the second anode 701G, the third anode 701B, and the fourth anode 701W are disposed sequentially along a second direction DR2. For example, an extension portion of the fourth anode 701W in the first pixel unit is located in a first transparent sub-region 201 of the second pixel unit and on a side of the first anode 701R, the second anode 701G, and the third anode 701B in the first pixel unit in an opposite direction of the first direction DR1. In this way, it may be achieved that a white sub-pixel region in the present pixel unit is externally expanded to a transparent region in the adjacent pixel unit, and an aperture ratio may be improved without affecting transparency adversely.

(8) Forming a fifth conductive layer. For example, as shown in FIG. 10H, the fifth conductive layer may include a second anode layer 702 located in each pixel unit. The second anode layer 702 in each pixel unit may include a fifth anode 702R, a sixth anode 702G, a seventh anode 702B, and an eighth anode 702W located in the pixel region 100. For example, in the pixel region 100, the fifth anode 702R, the sixth anode 702G, the seventh anode 702B, and the eighth anode 702W are disposed sequentially along the second direction DR2.

(9) Forming a pixel definition layer. As shown in FIG. 10I, a pixel definition layer 71 may include a first pixel opening 71R located in the first sub-pixel P1 and exposing the fifth anode 702R, a second pixel opening 71G located in the second sub-pixel P2 and exposing the sixth anode 702G, a third pixel opening 71B located in the third sub-pixel P3 and exposing the seventh anode 702B, and a fourth pixel opening 71W located in the fourth sub-pixel P4 and exposing the eighth anode 702W and the fourth anode 701W. For example, in the pixel region 100, the first pixel opening 71R, the second pixel opening 71G, and the third pixel opening 71B are sequentially disposed along the second direction DR2.

In an exemplary embodiment, as shown in FIG. 10J, in a direction perpendicular to a plane of the display substrate (i.e., a third direction DR3), a first transparent sub-region 201 in a transparent region 200 of a pixel unit may include a base substrate 10, and a first insulation layer 61, a third insulation layer 63, a fourth insulation layer 64, and a first anode layer 701 sequentially stacked on the base substrate 10. A second transparent sub-region 202 in the transparent region 200 of the pixel unit may include the base substrate 10, and the first insulation layer 61, the third insulation layer 63, and the fourth insulation layer 64 sequentially stacked on the base substrate 10. In this way, it is achieved that a first anode layer of a white sub-pixel in the present pixel unit is externally expanded to the first transparent sub-region 201 in the present pixel unit.

The above description of the preparation method of the display substrate shown in FIGS. 10A to 10J is similar to the description of the above-mentioned embodiments and has similar beneficial effects. Technical details not disclosed in this embodiment will be understood by those skilled in the art with reference to the above description of the display substrate shown in FIGS. 7A to 7J, which will not be repeated here.

As may be seen from the above, for the display substrate according to the exemplary embodiment of the present disclosure, a pixel region may be increased on a premise of not reducing an area of a transparent region by providing a design in which the first anode layer of the white sub-pixel in the present pixel unit is externally expanded to the transparent region in the adjacent pixel unit, thereby improving a pixel aperture ratio to a certain extent, thereby improving a display effect. Moreover, since the first anode layer is formed of a transparent conductive material, the display effect may be improved without affecting a transparent effect adversely.

Structures of various display substrates listed above and preparation processes thereof are only illustrative, and those skilled in the art may change corresponding structures and increase or decrease patterning process according to an actual situation. For example, four sub-pixels may be disposed side by side along a first direction DR1. For another example, a structure such as 5T1C or 7T1C may be adopted for a pixel drive circuit. For yet another example, other electrodes or leads may be disposed in a film layer structure. Herein, no limitation is made thereto in embodiments of the present disclosure.

The present disclosure also provides a preparation method of a display substrate, the display substrate includes a plurality of pixel units, each pixel unit includes a transparent region and a pixel region, and each pixel unit includes a plurality of sub-pixels; the preparation method may include: forming a drive circuit layer on a base substrate; and forming a light emitting structure layer on a side of the drive circuit layer away from the base substrate, wherein the light emitting structure layer may include a first anode layer and a second anode layer stacked, a second anode layer of a white sub-pixel in the plurality of sub-pixels is located in a pixel region of the present pixel unit; the first anode layer of the white sub-pixel includes a main body part located in the pixel region of the present pixel unit and an extension part located in a transparent region of the present pixel unit, or, the first anode layer of the white sub-pixel includes a main body part located in the pixel region of the present pixel unit and an extension part located in a transparent region of an adjacent pixel unit.

In this way, for the prepared display substrate according to the exemplary embodiment of the present disclosure, by extending the first anode layer of the white sub-pixel from the pixel region to the transparent region, a pixel region may be increased on a premise of not reducing an area of a transparent region, thereby improving a pixel aperture ratio to a certain extent, thereby improving a display effect. Moreover, since the first anode layer is usually formed of a transparent conductive material, the display effect may be improved without affecting a transparent effect adversely.

The above description of the embodiment of the preparation method is similar to the above description of embodiments of the display substrate, and has similar beneficial effects as the embodiments of the display substrate. Technical details undisclosed in the embodiment of the preparation method of the present embodiment are understood by those skilled in the art with reference to the description in the embodiments of the display substrate of the present disclosure, which will not be repeated here.

An exemplary embodiment of the present disclosure also provides a display apparatus. The display apparatus may include: the display substrate in one or more of the above exemplary embodiments.

In an exemplary embodiment, the display substrate may include, but is not limited to, an OLED display substrate, or a Quantum dot Light Emitting Diode (QLED) display substrate, etc. Herein, no limitation is made thereto in embodiments of the present disclosure.

In an exemplary embodiment, the display apparatus may include, but is not limited to, any product or component having a display function, such as a mobile phone, a tablet computer, a television, a display, a notebook computer, a digital photo frame, or a navigator. Herein, there is no limitation on a type of the display apparatus in the embodiment of the present disclosure. Other essential components of the display apparatus which should be understood to be included by the display apparatus by those of ordinary skill in the art will not be repeated herein, and should not be taken as limitations on the present disclosure.

The above description of the embodiment of the display apparatus is similar to the above description of the embodiments of the display substrate, and has similar beneficial effects as the embodiments of the display substrate. Technical details undisclosed in the embodiment of the display apparatus of the present disclosure may be understood by those skilled in the art with reference to the description in the embodiments of the display substrate of the present disclosure, which will not be repeated here.

Although implementation modes of the present disclosure are disclosed above, the above contents are only implementation modes for easily understanding the present disclosure and not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined in the appended claims.

The invention claimed is:

1. A display substrate, comprising a transparent region and a pixel region, wherein the pixel region comprises a plurality of light emitting devices which comprise a first light emitting device, an orthographic projection of a first anode layer of the first the light emitting device on a plane of the display substrate is partially overlapped with an orthographic projection of the transparent region on the plane of the display substrate, and an orthographic projection of a second anode layer of the first light emitting device on the plane of the display substrate is within a range of an orthographic projection of the pixel region on the plane of the display substrate.

2. The display substrate according to claim 1, wherein an orthographic projection of an emitting layer of the first light emitting device on the plane of the display substrate is partially overlapped with an orthographic projection of the transparent region on the plane of the display substrate and is partially overlapped with the orthographic projection of the pixel region on the plane of the display substrate.

3. The display substrate according to claim 1, wherein the first anode layer is made of a transparent conductive material.

4. The display substrate according to claim 3, wherein the transparent conductive material comprises indium tin oxide or indium zinc oxide.

5. The display substrate according to claim 1, wherein the second anode layer is formed of a metal material, or is formed of a metal material and a transparent conductive material.

6. The display substrate according to claim 1, wherein the plurality of light emitting devices further comprise a second light emitting device, an orthographic projection of a first anode layer of the second light emitting device on the plane of the display substrate, an orthographic projection of a second anode layer of the second light emitting device on the plane of the display substrate, and an orthographic projection of an emitting layer of the second light emitting device on the plane of the display substrate are all within a range of the orthographic projection of the pixel region on the plane of the display substrate.

7. The display substrate according to claim 6, wherein the plurality of light emitting devices comprise one first light emitting device and three second light emitting devices, the first light emitting device comprises a white light emitting device, the three second light emitting devices comprise a red light emitting device, a green light emitting device, and a blue light emitting device, an area of a second anode layer of the blue light emitting device is larger than an area of a second anode layer of the red light emitting device and an area of a second anode layer of the green light emitting device, an area of a second anode layer of the white light emitting device is smaller than the area of the second anode layer of the red light emitting device and the area of the second anode layer of the green light emitting device.

8. The display substrate according to claim 7, wherein the transparent region comprises a first transparent sub-region and a second transparent sub-region disposed sequentially along a first direction, the pixel region comprises a first region and a second region disposed sequentially along a second direction, the first region comprises a first sub-region and a second sub-region disposed sequentially along the first direction, and the second region comprises a third sub-region and a fourth sub-region disposed sequentially along the first direction; an orthographic projection of a first anode layer of the one first light emitting device on the plane of the display substrate is at least partially overlapped with an orthographic projection of one of the first sub-region to the fourth sub-region on the plane of the display substrate, and is at least partially overlapped with an orthographic projection of one of the first transparent sub-region and the second transparent sub-region on the plane of the display substrate; orthographic projections of first anode layers of the three second light emitting devices on the plane of the display substrate are at least partially overlapped with orthographic projections of the other three sub-regions in the first sub-region to the fourth sub-region on the plane of the display substrate respectively, and are different from each other; the second direction and the first direction intersect.

9. The display substrate according to claim 8, wherein a length of an orthographic projection of the second anode layer of the blue light emitting device on the plane of the display substrate is greater than a length of an orthographic projection of the second anode layer of the red light emitting device on the plane of the display substrate, a length of an orthographic projection of the second anode layer of the green light emitting device on the plane of the display substrate, and a length of an orthographic projection of the second anode layer of the white light emitting device on the plane of the display substrate, and a length refers to a dimensional feature along the first direction.

10. The display substrate according to claim 7, wherein the transparent region comprises a first transparent sub-region and a second transparent sub-region disposed sequentially along a first direction, the pixel region comprises a first region and a second region disposed sequentially along a second direction, the first region comprises a fifth sub-region and a sixth sub-region disposed sequentially along the second direction, and the second region comprises a seventh sub-region and an eighth sub-region disposed sequentially along the second direction; an orthographic projection of a first anode layer of the one first light emitting device on the plane of the display substrate is at least partially overlapped with an orthographic projection of one of the fifth sub-region to the eighth sub-region on the plane of the display substrate, and is at least partially overlapped with an orthographic projection of one of the first transparent sub-region and the second transparent sub-region on the plane of the display substrate; orthographic projections of first anode layers of the three second light emitting devices on the plane of the display substrate are at least partially overlapped with orthographic projections of the other three sub-regions in the first sub-region to the fifth sub-region on the plane of the display substrate respectively, and are different from each other; the second direction and the first direction intersect.

11. The display substrate according to claim 10, wherein a width of an orthographic projection of the second anode layer of the blue light emitting device on the plane of the display substrate is greater than a width of an orthographic projection of the second anode layer of the red light emitting device on the plane of the display substrate, a width of an orthographic projection of the second anode layer of the green light emitting device on the plane of the display substrate, and a width of an orthographic projection of the second anode layer of the white light emitting device on the plane of the display substrate, a width is a dimensional feature along the second direction.

12. The display substrate according to claim 1, wherein the pixel region further comprises a plurality of pixel drive circuits configured to drive the light emitting devices, orthographic projections of the plurality of pixel drive circuits on the plane of the display substrate are within a range of the orthographic projection of the pixel region on the plane of the display substrate.

13. The display substrate according to claim 12, wherein a pixel drive circuit comprises a first transistor, a second transistor, and a third transistor, the first transistor and the third transistor are located on two sides of the second transistor in a second direction, and each of extension directions of channel regions of the first transistor, the second transistor, and the third transistor is the second direction.

14. The display substrate according to claim 13, wherein the pixel drive circuit further comprises a storage capacitor located between the second transistor and the third transistor, and an extension direction of the storage capacitor is the second direction.

15. The display substrate according to claim 12, wherein the plurality of pixel drive circuits are disposed side by side along a first direction.

16. The display substrate according to claim 12, wherein a pixel drive circuit comprises a first transistor, a second transistor, a third transistor, and a storage capacitor;

in a direction perpendicular to the plane of the display substrate, the display substrate comprises a first conductive layer, a semiconductor layer, a second conductive layer, and a third conductive layer disposed sequentially on a base substrate; the first conductive layer comprises a first electrode plate, the semiconductor layer comprises an active layer of the first transistor, an active layer of the second transistor, an active layer of the third transistor, and a second electrode plate, the second conductive layer comprises a gate electrode of the first transistor, a gate electrode of the second transistor, and a gate electrode of the third transistor, the third conductive layer comprises a first electrode of the first transistor, a second electrode of the first transistor, a first electrode of the second transistor, a second electrode of the second transistor, a first electrode of the third transistor, a second electrode of the third transistor, and a third electrode plate, the first electrode plate and the second electrode plate form a first storage capacitor, the second electrode plate and the third electrode plate form a second storage capacitor, the first storage capacitor and the second storage capacitor are connected in parallel to form the storage capacitor.

17. The display substrate according to claim 16, wherein the first conductive layer further comprises a compensation connection line, and the third conductive layer further comprises a compensation signal line, the first electrode of the third transistor is connected with the compensation signal line through the compensation connection line.

18. The display substrate according to claim 16, wherein the second conductive layer comprises a power supply connection line, and the third conductive layer further comprises a first power supply line, the first electrode of the second transistor is connected with the first power supply line through the power supply connection line; the first power supply line is connected with the power supply connection line through a via, and a double-layer trace is formed between the gate electrode of the first transistor and the gate electrode of the third transistor.

19. The display substrate according to claim 16, wherein the second conductive layer further comprises a first scan signal line and a second scan signal line, the gate electrode of the first transistor is connected with the first scan signal line, the gate electrode of the third transistor is connected with the second scan signal line.

20. A display apparatus, comprising a display substrate according to claim 1.

* * * * *